United States Patent
Nakazawa et al.

(10) Patent No.: US 12,266,675 B2
(45) Date of Patent: Apr. 1, 2025

(54) IMAGING ELEMENT

(71) Applicant: SONY SEMICONDUCTOR SOLUTIONS CORPORATION, Kanagawa (JP)

(72) Inventors: Keiichi Nakazawa, Tokyo (JP); Yoshiaki Kitano, Kanagawa (JP); Hirofumi Yamashita, Kanagawa (JP); Minoru Ishida, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/368,146

(22) Filed: Sep. 14, 2023

(65) Prior Publication Data

US 2023/0420478 A1   Dec. 28, 2023

Related U.S. Application Data

(63) Continuation of application No. 18/064,794, filed on Dec. 12, 2022, now Pat. No. 11,798,972, which is a
(Continued)

(51) Int. Cl.
*H01L 27/146* (2006.01)
*H04N 25/75* (2023.01)
(Continued)

(52) U.S. Cl.
CPC .. *H01L 27/14636* (2013.01); *H01L 27/14634* (2013.01); *H04N 25/75* (2023.01); *H04N 25/778* (2023.01); *H04N 25/79* (2023.01)

(58) Field of Classification Search
CPC .... H04N 5/369; H04N 5/37457; H04N 5/378; H04N 5/379; H04N 25/70; H04N 25/75;
(Continued)

(56) References Cited

U.S. PATENT DOCUMENTS 9,136,302 B2   9/2015  Wang et al.
10,014,333 B2  7/2018  Velichko et al.
(Continued)

FOREIGN PATENT DOCUMENTS

CN   101960353 A   1/2011
CN   103579263 A   2/2014
(Continued)

OTHER PUBLICATIONS

International Search Report and Written Opinion for International (PCT) Patent Application No. PCT/JP2018/048364, dated Mar. 26, 2019, 24 pages.
(Continued)

*Primary Examiner* — Lin Ye
*Assistant Examiner* — Chriss S Yoder, III
(74) *Attorney, Agent, or Firm* — SHERIDAN ROSS P.C.

(57) ABSTRACT

An imaging element according to an embodiment of the present disclosure includes: a first substrate, a second substrate, and a third substrate that are stacked in this order. The first substrate including a sensor pixel that performs photoelectric conversion and the second substrate including a readout circuit are electrically coupled to each other by a first through wiring line provided in an interlayer insulating film. The second substrate and the third substrate including a logic circuit are electrically coupled to each other by a junction between pad electrodes or a second through wiring line penetrating through a semiconductor substrate.

18 Claims, 55 Drawing Sheets

Related U.S. Application Data continuation of application No. 16/956,141, filed as application No. PCT/JP2018/048364 on Dec. 27, 2018, now Pat. No. 11,600,651.

(60) Provisional application No. 62/610,806, filed on Dec. 27, 2017.

(51) Int. Cl.
*H04N 25/778* (2023.01)
*H04N 25/79* (2023.01)

(58) Field of Classification Search
CPC .... H04N 25/778; H04N 25/79; H01L 25/065; H01L 25/07; H01L 25/167; H01L 25/18; H01L 27/14603; H01L 27/14612; H01L 27/14638; H01L 27/1464; H01L 27/14641; H01L 27/156; H01L 27/14636; H01L 27/14634; H01L 2224/08145
See application file for complete search history.

(56) References Cited

U.S. PATENT DOCUMENTS

| | | | |
|---|---|---|---|
| 10,321,079 | B2 | 6/2019 | Miyazawa |
| 11,600,651 | B2 | 3/2023 | Nakazawa et al. |
| 2002/0027293 | A1 | 3/2002 | Hoshino |
| 2006/0146233 | A1 | 7/2006 | Park |
| 2007/0018075 | A1 | 1/2007 | Cazaux et al. |
| 2009/0230287 | A1 | 9/2009 | Anderson et al. |
| 2010/0276572 | A1 | 11/2010 | Iwabuchi et al. |
| 2011/0042552 | A1 | 2/2011 | Furuya et al. |
| 2013/0092820 | A1 | 4/2013 | Takemoto |
| 2013/0105871 | A1 | 5/2013 | Inui |
| 2013/0285180 | A1 | 10/2013 | Wang et al. |
| 2013/0313616 | A1 | 11/2013 | Matsunuma |
| 2014/0042298 | A1* | 2/2014 | Wan .............. H01L 27/1469 257/E31.127 |
| 2014/0138752 | A1 | 5/2014 | Kao et al. |
| 2015/0002713 | A1 | 1/2015 | Nomura, II |
| 2015/0179691 | A1* | 6/2015 | Yanagita .......... H01L 27/14689 257/292 |
| 2015/0270307 | A1 | 9/2015 | Umebayashi |
| 2016/0088253 | A1 | 3/2016 | Tezuka |
| 2017/0062501 | A1 | 3/2017 | Velichko |
| 2017/0092582 | A1 | 3/2017 | Kawano et al. |
| 2017/0138752 | A1 | 5/2017 | Mermelstein |
| 2017/0229509 | A1 | 8/2017 | Lee et al. |
| 2023/0154964 | A1 | 5/2023 | Nakazawa et al. |

FOREIGN PATENT DOCUMENTS

| | | | |
|---|---|---|---|
| CN | 104428897 | A | 3/2015 |
| CN | 104465681 | A | 3/2015 |
| CN | 105593995 | A | 5/2016 |
| CN | 106129075 | A | 11/2016 |
| CN | 113793858 | A | 12/2021 |
| JP | 2001-339057 | | 12/2001 |
| JP | 2003-017558 | | 1/2003 |
| JP | 2004-186407 | | 7/2004 |
| JP | 2005260076 | A | 9/2005 |
| JP | 2006-191081 | | 7/2006 |
| JP | 2007-228460 | | 9/2007 |
| JP | 2009-123865 | | 6/2009 |
| JP | 2009-246246 | | 10/2009 |
| JP | 2010-010402 | | 1/2010 |
| JP | 2010205990 | A | 9/2010 |
| JP | 2010-245506 | | 10/2010 |
| JP | 2011-044489 | | 3/2011 |
| JP | 2011-517506 | | 6/2011 |
| JP | 2012-015400 | | 1/2012 |
| JP | 2012015417 | A | 1/2012 |
| JP | 2013-008989 | | 1/2013 |
| JP | 2013033786 | A | 2/2013 |
| JP | 2013-090127 | | 5/2013 |
| JP | 2013-232647 | | 11/2013 |
| JP | 2014-022561 | | 2/2014 |
| JP | 2014-099582 | | 5/2014 |
| JP | 2014-123771 | | 7/2014 |
| JP | 2014-236183 | | 12/2014 |
| JP | 2015-032687 | | 2/2015 |
| JP | 2015-046638 | | 3/2015 |
| JP | 2015-099262 | | 5/2015 |
| JP | 2015-135938 | | 7/2015 |
| JP | 2015180077 | A | 10/2015 |
| WO | WO 2014/133696 | | 9/2014 |
| WO | WO-2017038403 | A1 | 3/2017 |
| WO | WO-2019131965 | A1 | 7/2019 |

OTHER PUBLICATIONS

Extended European Search Report for European Patent Application No. 18896152.8, dated Jan. 26, 2021, 7 pages.
Official Action (with English translation) for Indonesia Patent Application No. P00202004529 dated Nov. 9, 2022, 9 pages.
Official Action for U.S. Appl. No. 16/956,141, dated May 11, 2022, 16 pages.
Notice of Allowance for U.S. Appl. No. 16/956,141, dated Sep. 14, 2022, 8 pages.
Corrected Notice of Allowance for U.S. Appl. No. 16/956,141, dated Jan. 25, 2023, 2 pages.
Notice of Allowance for U.S. Appl. No. 18/064,794, dated Jun. 14, 2023, 12 pages.

\* cited by examiner

IMAGING ELEMENT

CROSS REFERENCE TO RELATED APPLICATIONS

This application is a continuation of U.S. patent application Ser. No. 18/064,794, filed 12 Dec. 2022, which is a continuation of U.S. patent application Ser. No. 16/956,141 filed 19 Jun. 2020, now U.S. Pat. No. 11,600,650, which is a national stage application under 35 U.S.C. 371 and claims the benefit of PCT Application No. PCT/JP2018/048364 having an international filing date of 27 Dec. 2018, which designated the United States, which PCT application claimed the benefit of U.S. Provisional Application No. 62/610,806 filed 27 Dec. 2017 and PCT Application No. PCT/JP2018/036417 filed 28 Sep. 2018, the entire disclosures of each of which are incorporated herein by reference.

TECHNICAL FIELD

The present disclosure relates to an imaging element.

BACKGROUND ART

Reduction in area per pixel of an imaging element having a two-dimensional configuration has been achieved by introduction of fine processes and an improvement in packing density. In recent years, an imaging element having a three-dimensional configuration has been developed to achieve further reduction in size of the imaging element and higher density of pixels. In the imaging element having the three-dimensional configuration, for example, a semiconductor substrate including a plurality of sensor pixels, and a semiconductor substrate including a signal processing circuit are stacked on each other. The signal processing circuit processes a signal obtained by each of the sensor pixels.

CITATION LIST

Patent Literature

PTL 1: Japanese Unexamined Patent Application Publication No. 2010-245506

SUMMARY OF THE INVENTION

Incidentally, in an imaging element having a three-dimensional configuration, in a case where three semiconductor chips are stacked, it is not possible to bond front surfaces of all semiconductor substrates to each other. In a case where three semiconductor substrates are stacked planlessly, there is a possibility of increasing a chip size or impairing reduction in area per pixel resulting from a configuration in which the semiconductor substrates are electrically coupled to each other. It is therefore desirable to provide a imaging element having a three-layer configuration that has a substantially same chip size as before without impairing reduction in area per pixel.

An imaging element according to an embodiment of the present disclosure includes: a first substrate, a second substrate, and a third substrate that are stacked in this order. The first substrate includes, in a first semiconductor substrate, a sensor pixel performing photoelectric conversion. The second substrate includes, in a second semiconductor substrate, a readout circuit outputting a pixel signal on the basis of an electric charge outputted from the sensor pixel. The third substrate includes, in a third semiconductor substrate, a logic circuit processing the pixel signal. Each of the first substrate and the second substrate includes an interlayer insulating film and a first through wiring line provided in the interlayer insulating film. The first substrate and the second substrate are electrically coupled to each other by the first through wiring line. In a case where each of the second substrate and the third substrate includes a pad electrode, the second substrate and the third substrate are electrically coupled to each other by a junction between the pad electrodes. In a case where the third substrate includes a second through wiring line penetrating through the third semiconductor substrate, the second substrate and the third substrate are electrically coupled to each other by the second through wiring line.

In the imaging element according to the embodiment of the present disclosure, the first substrate including the sensor pixel that performs photoelectric conversion and the second substrate including the readout circuit are electrically coupled to each other by the first through wiring line provided in the interlayer insulating film. This makes it possible to further reduce a chip size and reduce an area per pixel, as compared with a case where the first substrate and the second substrate are electrically coupled to each other by a junction between pad electrodes or a through wiring line penetrating through a semiconductor substrate. In addition, in the imaging element according to the embodiment of the present disclosure, the readout circuit and the logic circuit are formed in substrates different from each other (the second substrate and the third substrate). This makes it possible to expand areas of the readout circuit and the logic circuit, as compared with a case where the readout circuit and the logic circuit are formed in the same substrate. In addition, in the imaging element according to the embodiment of the present disclosure, the second substrate and the third substrate are electrically coupled to each other by the junction between the pad electrodes or the second through wiring line penetrating through the semiconductor substrate. Here, the readout circuit is formed in the second substrate and the logic circuit is formed in the third substrate, which makes it possible to form a configuration for electrical coupling between the second substrate and the third substrate with a more flexible layout such as arrangement and the number of contacts for coupling, as compared to a configuration for electrical coupling between the first substrate and the second substrate. Accordingly, it is possible to use the junction between the pad electrodes or the second through wiring line penetrating through the semiconductor substrate for electrical coupling between the second substrate and the third substrate. As described above, in the imaging element according to the embodiment of the present disclosure, the substrates are electrically coupled to each other in accordance with the degree of integration of the substrates.

MODES FOR CARRYING OUT THE INVENTION

In the following, some embodiments of the present disclosure are described in detail with reference to the drawings. It is to be noted that description is given in the following order.

Figure 17:
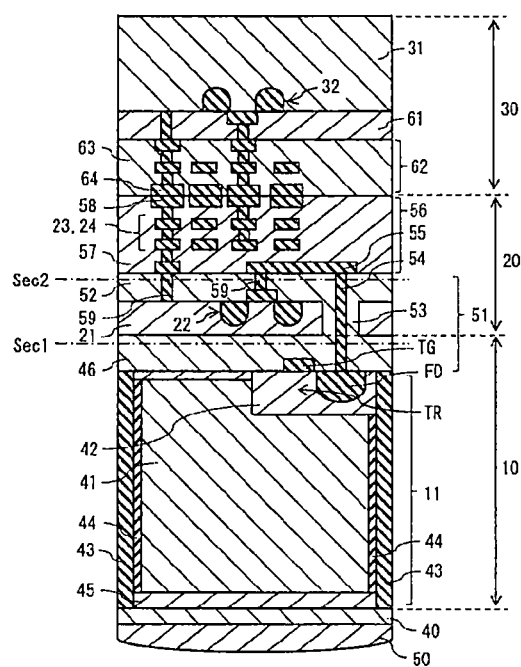
FIG. 17 is a diagram illustrating an example of a cross-sectional configuration in the vertical direction of the imaging element in FIG. 1.
Figure 18:
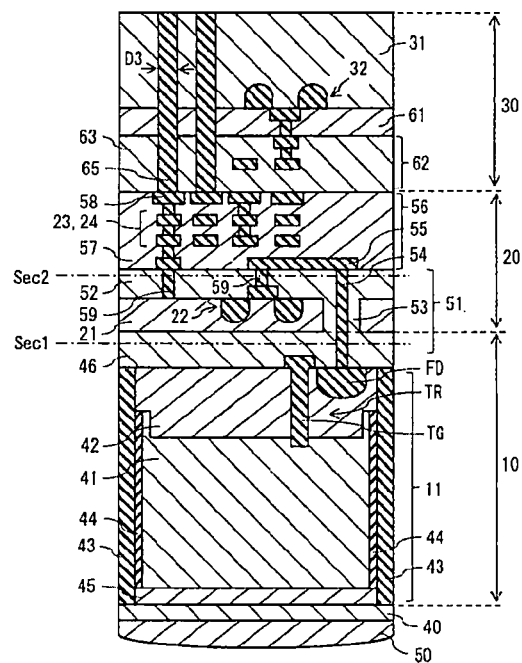
FIG. 18 is a diagram illustrating an example of across-sectional configuration in the vertical direction of the imaging element in FIG. 1.
Figure 19:
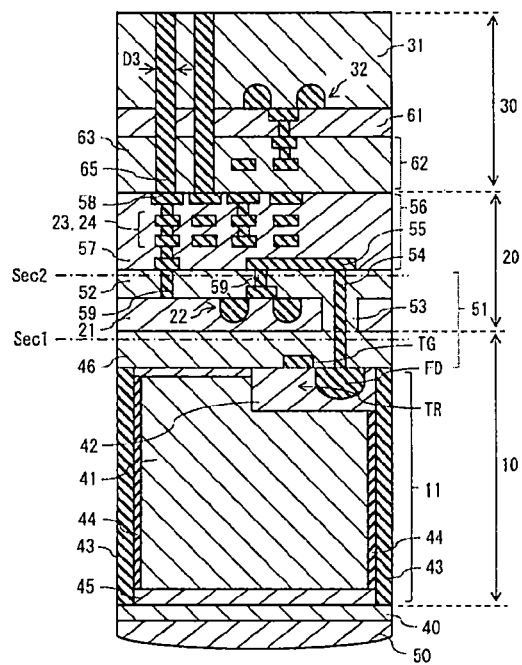
FIG. 19 is a diagram illustrating an example of a cross-sectional configuration in the vertical direction of the imaging element in FIG. 1.
Figure 20:
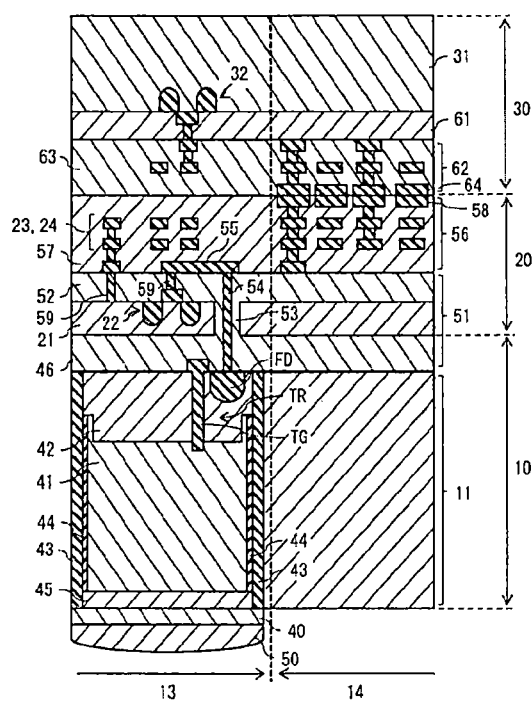
FIG. 20 is a diagram illustrating an example of a cross-sectional configuration in the vertical direction of the imaging element in FIG. 1.
Figure 21:
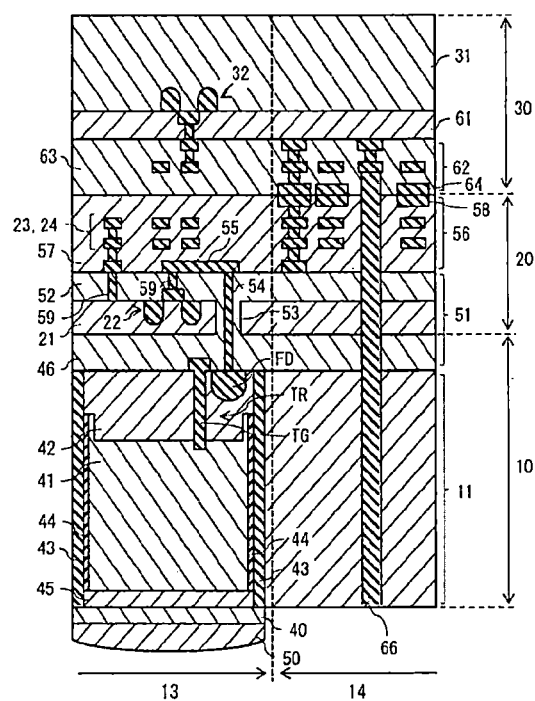
FIG. 21 is a diagram illustrating an example of a cross-sectional configuration in the vertical direction of the imaging element in FIG. 1.
Figure 22:
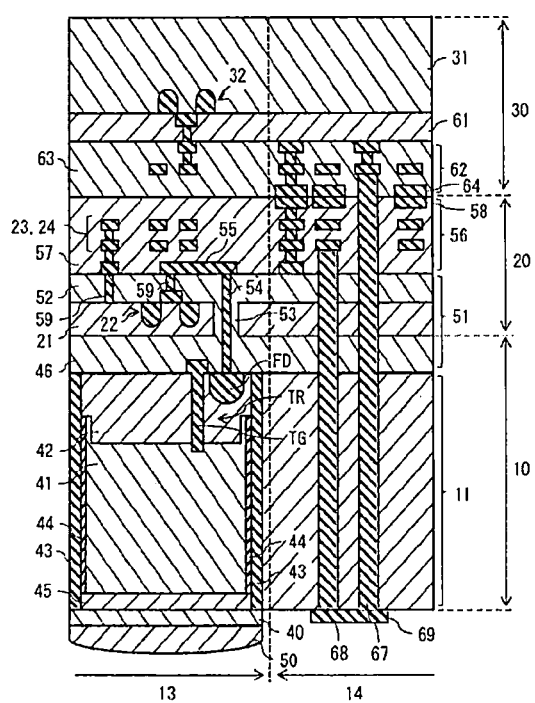
FIG. 22 is a diagram illustrating an example of across-sectional configuration in the vertical direction of the imaging element in FIG. 1.
Figure 28:
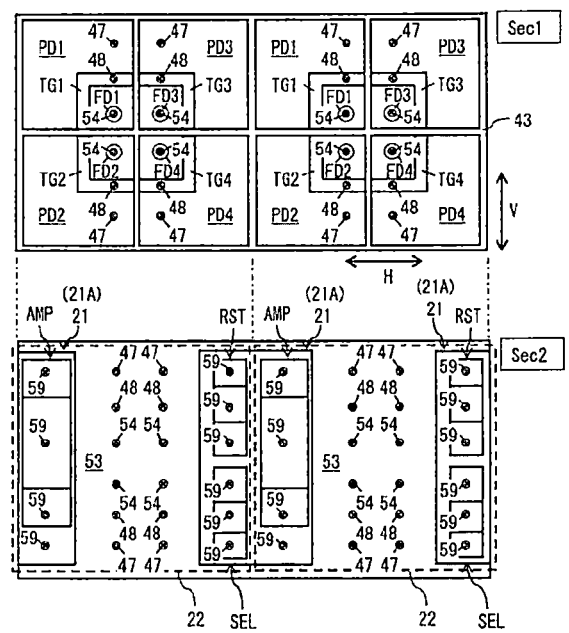
FIG. 28 is a diagram illustrating an example of across-sectional configuration in the horizontal direction of the imaging element in FIG. 1.
Figure 29:
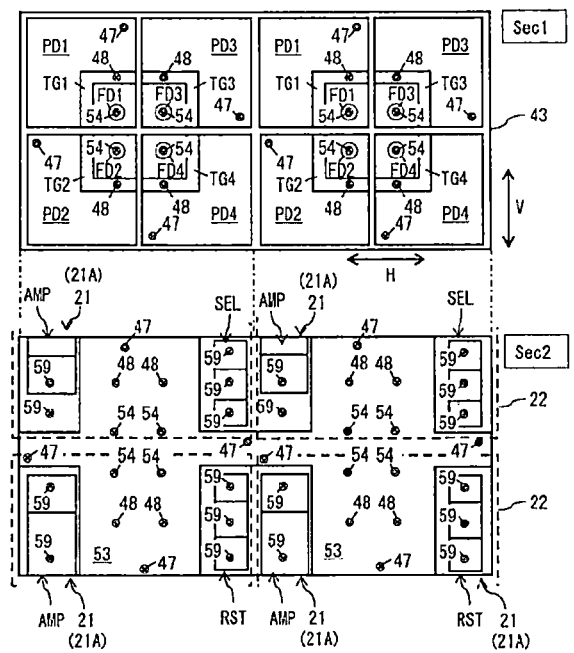
FIG. 29 is a diagram illustrating an example of across-sectional configuration in the horizontal direction of the imaging element in FIG. 1.
Figure 30:
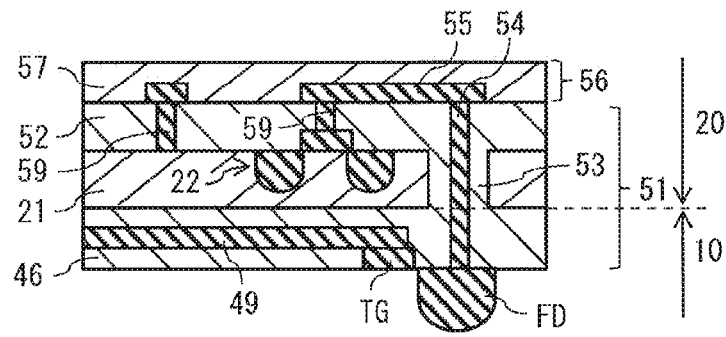
FIG. 30 is a diagram illustrating an example of across-sectional configuration in the vertical direction of the imaging element in FIG. 1.
Figure 31:
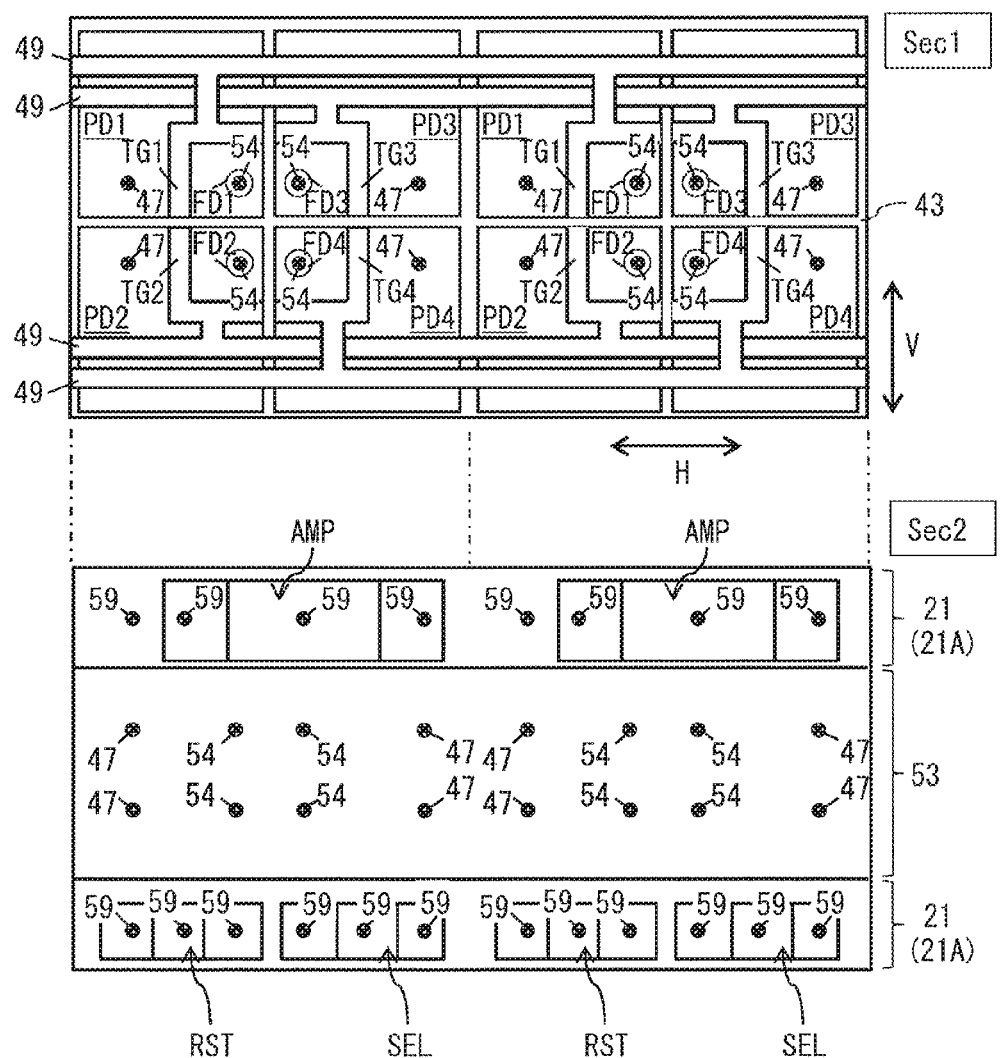
FIG. 31 is a diagram illustrating an example of a cross-sectional configuration in the horizontal direction of the imaging element in FIG. 1.
Figure 41:
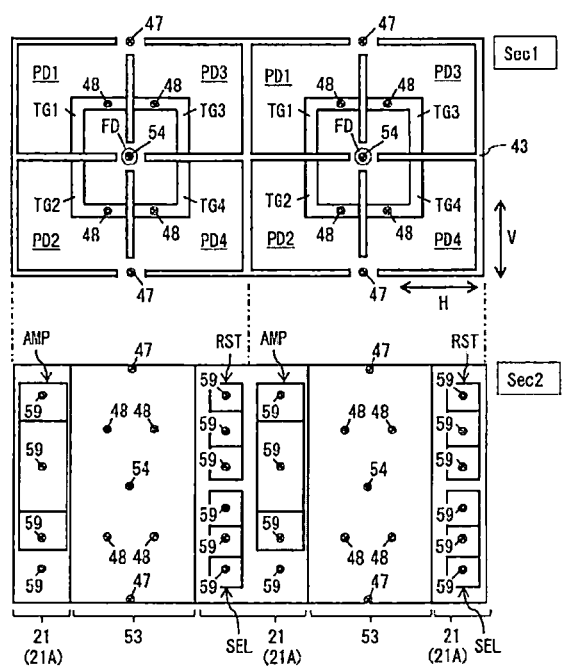
FIG. 41 is a diagram illustrating an example of across-sectional configuration in the horizontal direction of the imaging element in FIG. 1.
Figure 42:
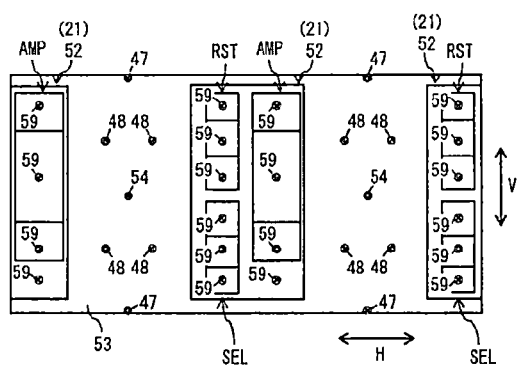
FIG. 42 is a diagram illustrating an example of a cross-sectional configuration in the horizontal direction of the imaging element in FIG. 1.
Figure 43:
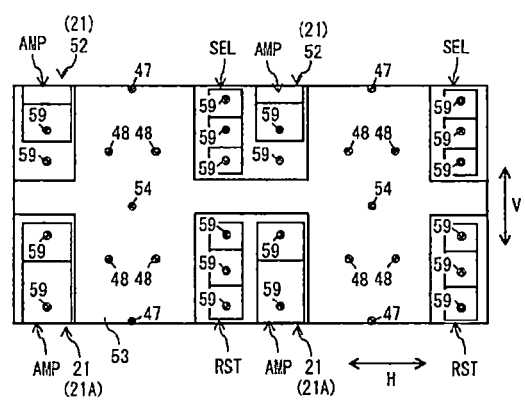
FIG. 43 is a diagram illustrating an example of across-sectional configuration in the horizontal direction of the imaging element in FIG. 1.
Figure 44:
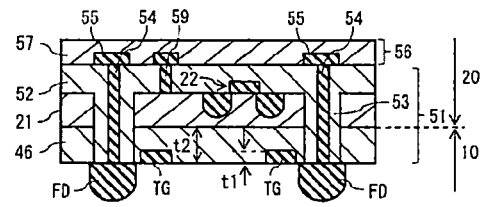
FIG. 44 is a diagram illustrating an example of cross-sectional configuration in the vertical direction of the imaging element in FIG. 1.
Figure 45:
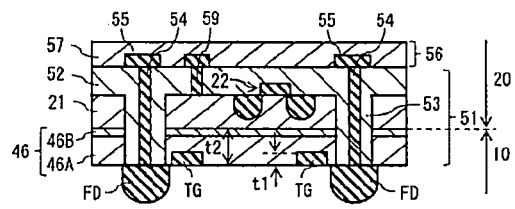
FIG. 45 is a diagram illustrating an example of cross-sectional configuration in the vertical direction of the imaging element in FIG. 1.
Figure 46:
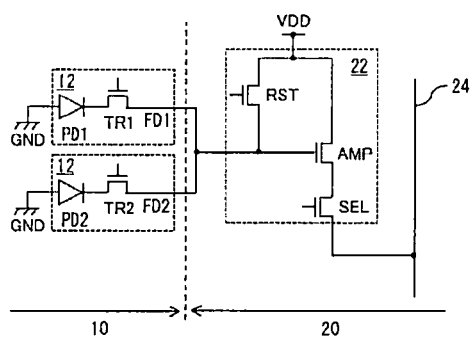
FIG. 46 is a diagram illustrating an example of the sensor pixel and the readout circuit in FIG. 1.
Figure 47:
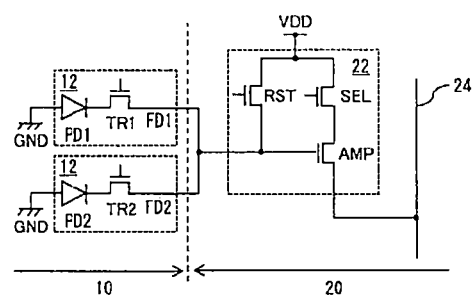
FIG. 47 is a diagram illustrating an example of the sensor pixel and the readout circuit in FIG. 1.

1. Embodiment (Imaging element) . . . FIGS. 1 to 6
   An example using a vertical TG and Cu—Cu bonding
2. Modification Examples (Imaging element)
   Modification Example A: An example using a planar TG . . . FIG. 17
   Modification Example B: An example using a TSV . . . FIGS. 18 and 19
   Modification Example C: An example using Cu—Cu bonding at an outer edge of a panel . . . FIG. 20
   Modification Example D: An example using a TSV at an outer edge of a panel . . . FIGS. 21 and 22
   Modification Example E: An example in which an offset is provided between sensor pixels and a readout circuit . . . FIGS. 23 to 27
   Modification Example F: An example in which a silicon substrate including a readout circuit has an island shape: FIG. 28
   Modification Example G: An example in which a silicon substrate including a readout circuit has an island shape: FIG. 29
   Modification Example H: An example in which a TG is coupled to a wiring line in a bottom substrate . . . FIGS. 30 and 31
   Modification Example I: An example in which an FD is coupled to a wiring line in a bottom substrate . . . FIGS. 32 to 39
   Modification Example J: An example in which a middle substrate is bonded to a bottom substrate after formation of a readout circuit: FIGS. 40A to 40F
   Modification Example K: An example in which an FD is shared by four sensor pixels: FIGS. 41 to 43
   Modification Example L: An example in which a relative dielectric constant of a portion of an insulating layer at a position where a bottom substrate and a middle substrate are bonded to each other is different from a relative dielectric constant at any other position: FIGS. 44 and 45
   Modification Example M: An example in which the number of sensor pixels sharing a readout circuit is two: FIGS. 46 and 47

Figure 48:
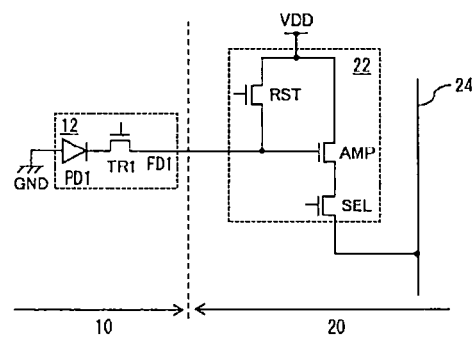
FIG. 48 is a diagram illustrating an example of the sensor pixel and the readout circuit in FIG. 1.
Figure 49:
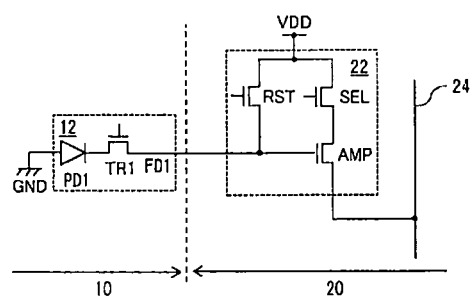
FIG. 49 is a diagram illustrating an example of the sensor pixel and the readout circuit in FIG. 1.

Modification Example N: An example in which a readout circuit is coupled to only one sensor pixel: FIGS. 48 and 49

Figure 50:
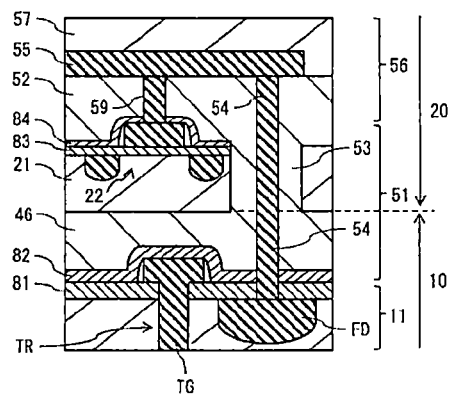
FIG. 50 is a diagram illustrating an example of a cross-sectional configuration in the vertical direction of the imaging element in FIG. 1.

Modification Example O: An example in which a transistor design condition differs between a first substrate and a second substrate: FIG. 50

Modification Example P: Variations of a wiring line that couples a first substrate and a second substrate to each other: FIGS. 51 to 63

Figure 63:
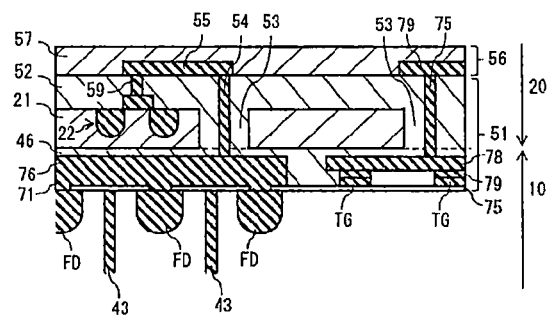
FIG. 63 is a diagram illustrating an example of a cross-sectional configuration in the vertical direction of the imaging element in FIG. 1.

Modification Example Q: An example in which a column signal processing circuit includes a typical column ADC circuit: FIG. 63

Figure 65:
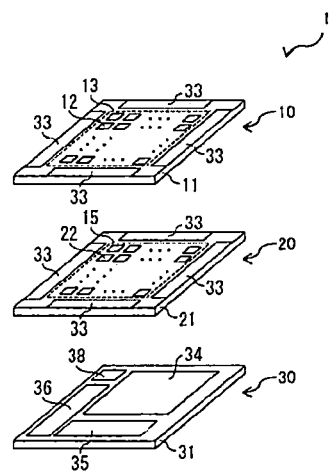
FIG. 65 is a diagram illustrating an example in which the imaging element in FIG. 64 includes three substrates that are stacked.

Modification Example R: An example in which an imaging element includes three substrates that are stacked: FIG. 65

Figure 66:
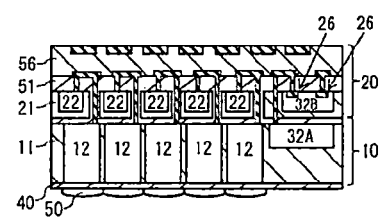
FIG. 66 is a diagram illustrating an example in which a logic circuit is separated to be formed in a substrate including a sensor pixel and a substrate including a readout circuit.

Modification Example S: An example in which a logic circuit is provided in a first substrate and a second substrate: FIG. 66

Figure 67:
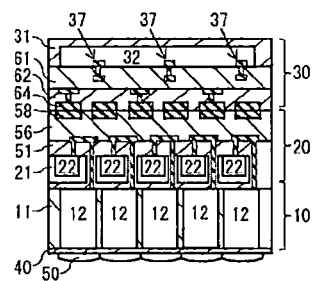
FIG. 67 is a diagram illustrating an example in which a logic circuit is formed in a third substrate.

Modification Example T: An example in which a logic circuit is provided in a third substrate: FIG. 67

3. Application Example

Figure 68:
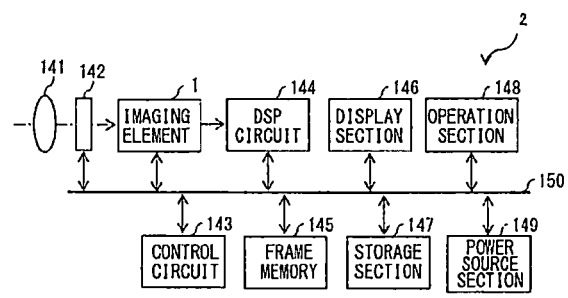
FIG. 68 is a diagram illustrating an example of a schematic configuration of an imaging device including the imaging element according to any of the embodiment and the modification examples thereof described above.
Figure 69:
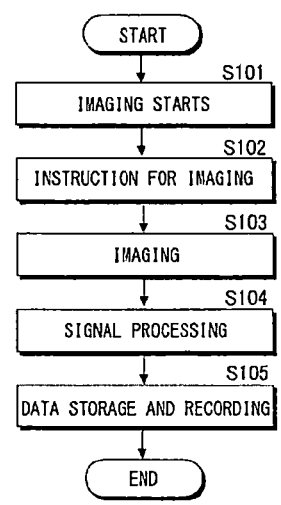
FIG. 69 is a diagram illustrating an example of an imaging procedure in the imaging device in FIG. 68.

An example in which the imaging element according to any of the embodiment and the modification examples thereof described above is applied to an imaging device . . . FIGS. 68 and 69

4. Practical Application Examples

Figure 70:
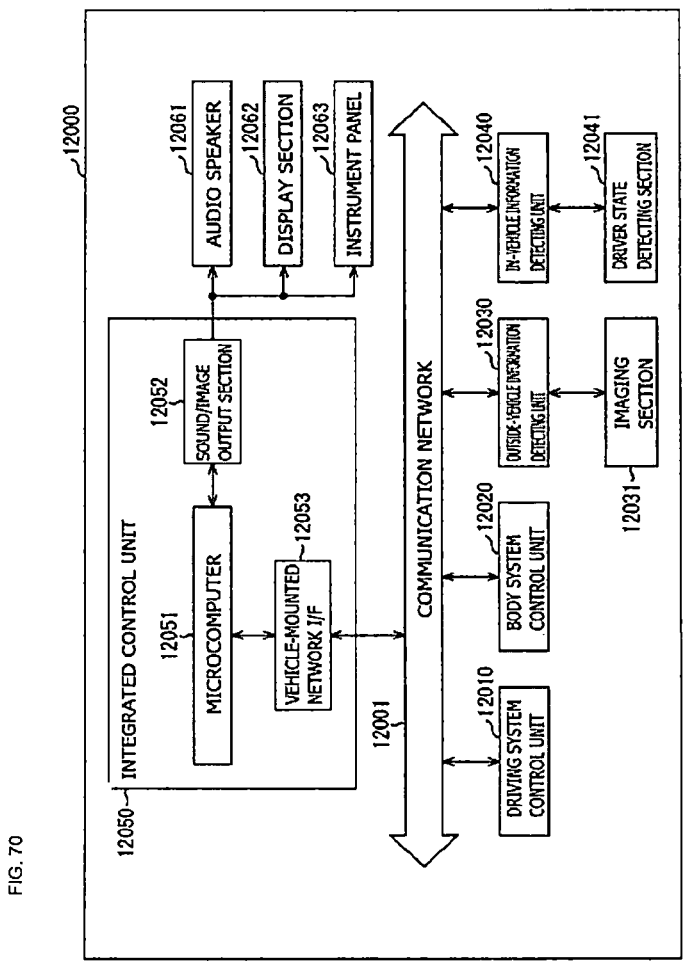
FIG. 70 is a block diagram depicting an example of schematic configuration of a vehicle control system.
Figure 71:
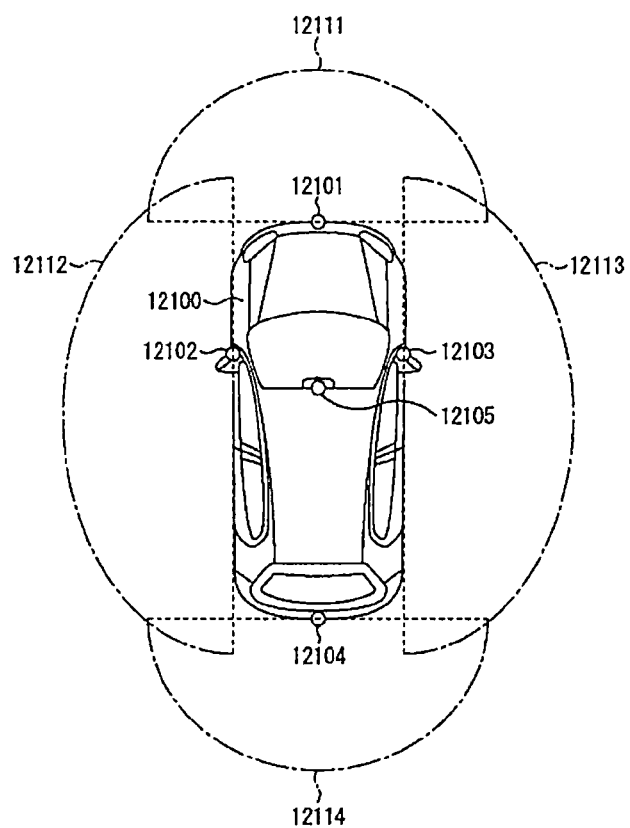
FIG. 71 is a diagram of assistance in explaining an example of installation positions of an outside-vehicle information detecting section and an imaging section.

Practical Application Example 1 . . . An example in which the imaging element according to any of the embodiment and the modification examples thereof described above is applied to a mobile body . . . FIGS. 70 and 71

Figure 72:
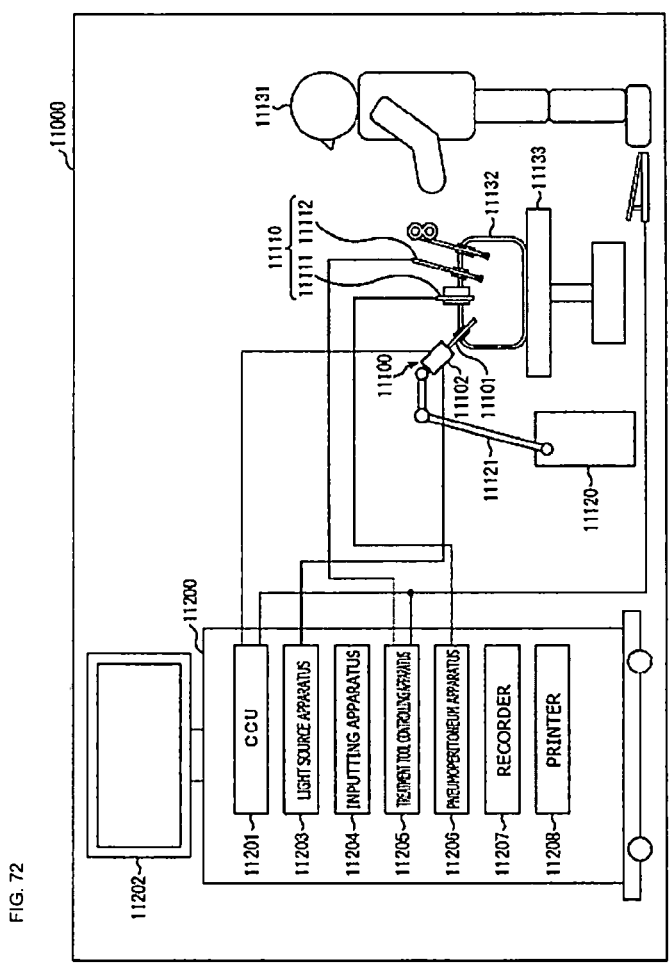
FIG. 72 is a view depicting an example of a schematic configuration of an endoscopic surgery system.
Figure 73:
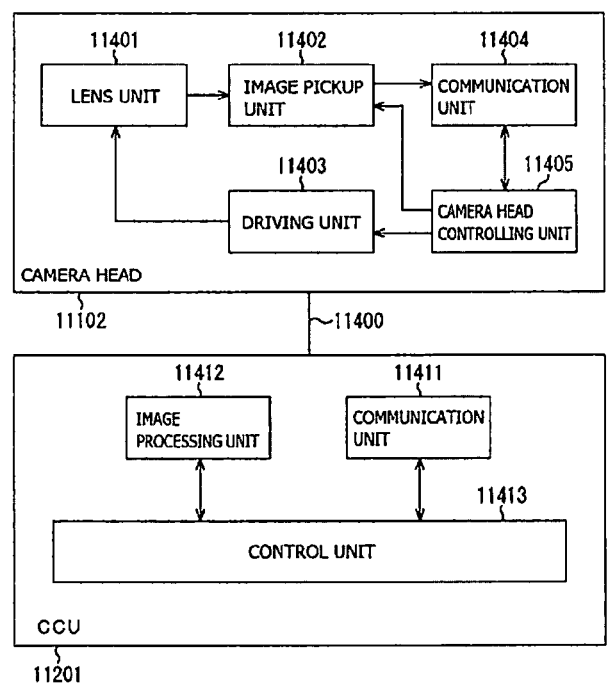
FIG. 73 is a block diagram depicting an example of a functional configuration of a camera head and a camera control unit (CCU).

Practical Application Example 2 . . . An example in which the imaging element according to any of the embodiment and the modification examples thereof described above is applied to a surgery system . . . FIGS. 72 and 73

1. Embodiment

Configuration

Figure 1:
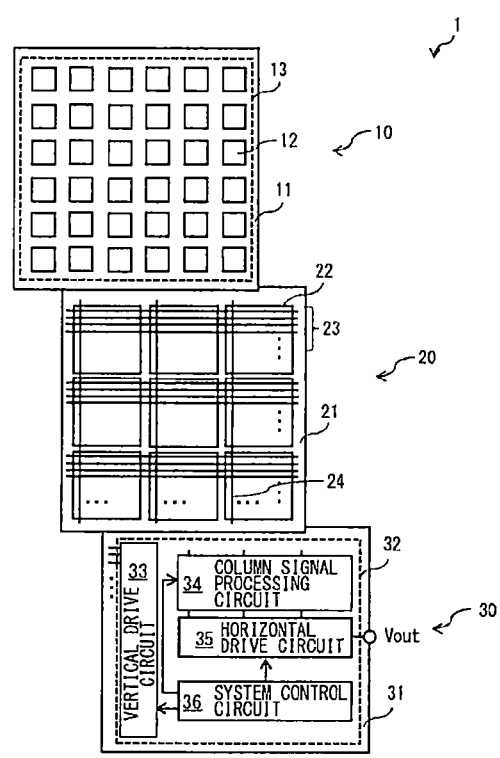
FIG. 1 is a diagram illustrating an example of a schematic configuration of a imaging element according to an embodiment of the present disclosure.

FIG. 1 illustrates an example of a schematic configuration of an imaging element 1 according to an embodiment of the present disclosure. The imaging element 1 includes three substrates (a first substrate 10, a second substrate 20, and a third substrate 30). The imaging element 1 has a three-dimensional configuration in which three substrates (the first substrate 10, the second substrate 20, and the third substrate 30) are bonded together. The first substrate 10, the second substrate 20, and the third substrate 30 are stacked in this order.

The first substrate 10 includes a plurality of sensor pixels 12 in a semiconductor substrate 11. The plurality of sensor pixels performs photoelectric conversion. The semiconductor substrate 11 corresponds to a specific example of a "first semiconductor substrate" of the present disclosure. The plurality of sensor pixels 12 is provided in rows and columns in a pixel region 13 in the first substrate 10. The second substrate 20 includes one readout circuit 22 for every four sensor pixels 12 in a semiconductor substrate 21. The readout circuit 22 outputs a pixel signal on the basis of an electric charge outputted from the sensor pixel 12. The semiconductor substrate 21 corresponds to a specific example of a "second semiconductor substrate" of the present disclosure. The second substrate 20 includes a plurality of pixel drive lines 23 extending in a row direction and a plurality of vertical signal lines 24 extending in a column direction. The third substrate 30 includes a logic circuit 32 in a semiconductor substrate 31. The logic circuit 32 performs processing on the pixel signal The semiconductor substrate 31 corresponds to a specific example of a "third semiconductor substrate" of the present disclosure. The logic circuit 32 includes, for example, a vertical drive circuit 33, a column signal processing circuit 34, a horizontal drive circuit 35, and a system control circuit 36. The logic circuit 32 (specifically, the horizontal drive circuit 35) outputs an output voltage Vout per sensor pixel 12 to outside. In the logic circuit 32, for example, a low-resistance region including a silicide such as $CoSi_2$ or NiSi may be formed in a front surface of an impurity diffusion region in contact with a source electrode and a drain electrode. The silicide is formed with use of a salicide (Self Aligned Silicide) process.

The vertical drive circuit 33 sequentially selects the plurality of sensor pixels 12 on a row-by-row basis, for example. The column signal processing circuit 34 performs correlation double sampling (CDS) processing on a pixel signal outputted from each of the sensor pixels 12 in a row selected by the vertical drive circuit 33, for example. The column signal processing circuit 34 performs the CDS processing to thereby extract a signal level of the pixel signal and hold pixel data corresponding to an amount of light received by each of the sensor pixels 12, for example. The horizontal drive circuit 35 sequentially outputs the pixel data held in the column signal processing circuit 34 to outside, for example. The system control circuit 36 controls driving of respective blocks (the vertical drive circuit 33, the column signal processing circuit 34, and the horizontal drive circuit 35) in the logic circuit 32, for example.

Figure 2:
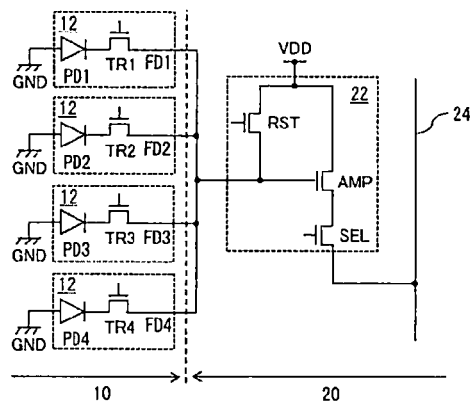
FIG. 2 is a diagram illustrating an example of a sensor pixel and a readout circuit in FIG. 1

FIG. 2 illustrates an example of the sensor pixel 12 and the readout circuit 22. Hereinafter, description is given of a case where one readout circuit 22 is shared by four sensor pixels 12 as illustrated in FIG. 2. Here, "share" indicates inputting outputs of four sensor pixels 12 to the common readout circuit 22.

The respective sensor pixels 12 include common components. In FIG. 2, identification numbers (1, 2, 3, and 4) are given to ends of reference numerals of the components of the respective sensor pixels 12 to discriminate the components of the respective sensor pixels 12. Hereinafter, in a case where it is necessary to discriminate the components of the respective sensor pixels 12, the identification numbers are given to ends of the reference numerals of the components of the respective sensor pixels 12, however, in a case where it is not necessary to discriminate the components of the respective sensor pixels 12, the identification numbers are not given to the ends of the reference numerals of the components of the respective sensor pixels 12.

Each of the sensor pixels 12 includes, for example, a photodiode PD, a transfer transistor TR, and a floating diffusion FD. The transfer transistor TR is electrically coupled to the photodiode PD, and the floating diffusion FD temporarily holds an electric charge outputted from the photodiode PD via the transfer transistor TR. The photodiode PD corresponds to a specific example of a "photoelectric converter" of the present disclosure. The photodiode PD performs photoelectric conversion to generate an electric charge corresponding to the amount of received light. A cathode of the photodiode PD is electrically coupled to a source of the transfer transistor TR, and an anode of the photodiode PD is electrically coupled to a reference potential line (for example, a ground). A drain of the transfer transistor TR is electrically coupled to the floating diffusion FD, and a gate of the transfer transistor TR is electrically coupled to the pixel drive line 23. The transfer transistor TR is, for example, a CMOS (Complementary Metal Oxide Semiconductor) transistor.

The floating diffusions FD of the respective sensor pixels 12 sharing one readout circuit 22 are electrically coupled to each other and electrically coupled to an input terminal of the common readout circuit 22. The readout circuit 22 includes, for example, a reset transistor RST, a selection transistor SEL, and an amplification transistor AMP. It should be noted that the selection transistor SEL may be omitted as necessary. A source of the reset transistor RST (an input terminal of the readout circuit 22) is electrically coupled to the floating diffusions FD, and a drain of the reset transistor RST is electrically coupled to a power source line VDD and a drain of the amplification transistor AMP. A gate of the reset transistor RST is electrically coupled to the pixel drive line 23 (see FIG. 1). A source of the amplification transistor AMP is electrically coupled to a drain of the selection transistor SEL, and a gate of the amplification transistor AMP is electrically coupled to a source of the reset transistor RST. A source of the selection transistor SEL (an output terminal of the readout circuit 22) is electrically coupled to the vertical signal line 24, and a gate of the selection transistor SEL is electrically coupled to the pixel drive line 23 (see FIG. 1).

Figure 7:
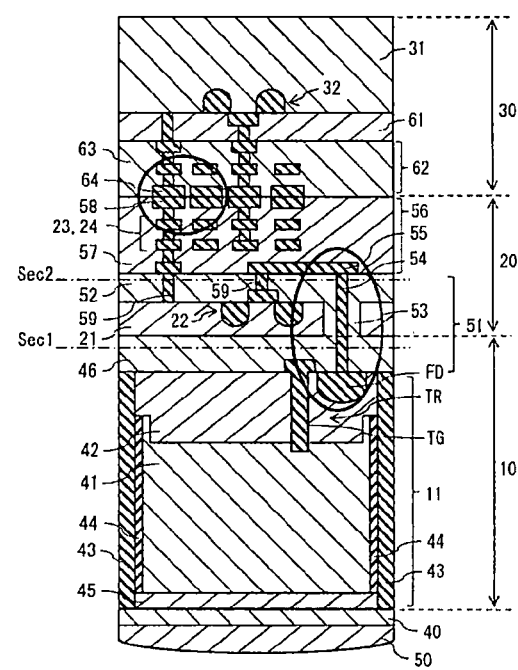
FIG. 7 is a diagram illustrating an example of a cross-sectional configuration in a vertical direction of the imaging element in FIG. 1.

In a case where the transfer transistor TR is turned on, the transfer transistor TR transfers an electric charge of the photodiode PD to the floating diffusion FD. The gate (a transfer gate TG) of the transfer transistor TR extends, for example, from a front surface of the semiconductor substrate 11 to a depth reaching a PD 41 through a well layer 42, as illustrated in FIG. 7 to be described later. The reset transistor RST resets a potential of the floating diffusion FD to a predetermined potential. In a case where the reset transistor RST is turned on, the potential of the floating diffusion FDs is reset to a potential of the power source line VDD. The selection transistor SEL controls an output timing of the pixel signal from the readout circuit 22. The amplification transistor AMP generates, as the pixel signal, a signal of a voltage corresponding to a level of an electric charge held in the floating diffusion FD. The amplification transistor AMP includes a source follower amplifier, and outputs a pixel signal of a voltage corresponding to a level of an electric charge generated by the photodiode PD. In a case where the selection transistor SEL is turned on, the amplification transistor AMP amplifies the potential of the floating diffusion FD and outputs a voltage corresponding to the thus-amplified potential to the column signal processing circuit 34 via the vertical signal line 24. The reset transistor RST, the amplification transistor AMP, and the selection transistor SEL are, for example, CMOS transistors.

Figure 3:
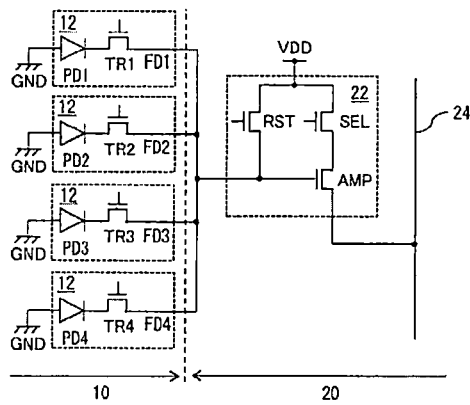
FIG. 3 is a diagram illustrating an example of the sensor pixel and the readout circuit in FIG. 1.
Figure 4:
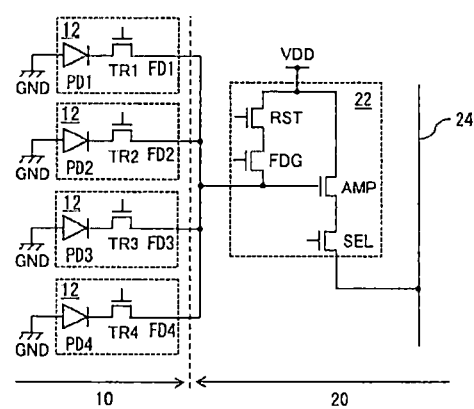
FIG. 4 is a diagram illustrating an example of the sensor pixel and the readout circuit in FIG. 1.
Figure 5:
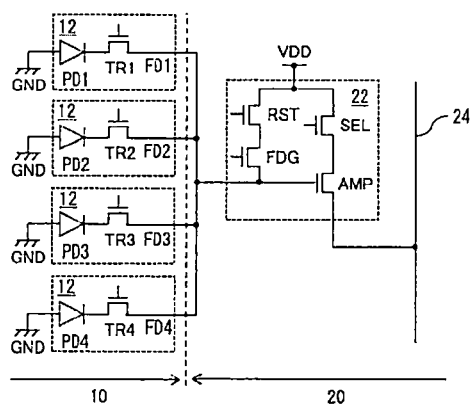
FIG. 5 is a diagram illustrating an example of the sensor pixel and the readout circuit in FIG. 1.

It should be noted that the selection transistor SEL may be provided between the power source line VDD and the amplification transistor AMP as illustrated in FIG. 3. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the pixel drive line 23 (see FIG. 1). The source of the amplification transistor AMP (the output terminal of the readout circuit 22) is electrically coupled to the vertical signal line 24, and the gate of the amplification transistor AMP is electrically coupled to the source of the reset transistor RST. In addition, as illustrated in FIGS. 4 and 5, an FD transfer transistor FDG may be provided between the source of the reset transistor RST and the gate of the amplification transistor AMP.

The FD transfer transistor FDG is used to switch conversion efficiency. In general, the pixel signal is small upon shooting in a dark place. In a case where conversion from an electric charge to a voltage conversion is performed on the basis of Q=CV, a large capacitance (FD capacitance C) of the floating diffusion FD causes a decrease in V in a case where the electric charge is converted into the voltage by the amplification transistor AMP. In contrast, the pixel signal is increased in a bright place; therefore, in a case where the FD capacitance C is not sufficiently large, it is not possible for the floating diffusion FD to receive the electric charge of the photodiode PD. Further, to prevent V from becoming excessively large (in other words, to decrease V) in a case where the electric charge is converted into the voltage by the amplification transistor AMP, it is necessary to increase the FD capacitance C. In consideration of these, in a case where the FD transfer transistor FDG is turned on, a gate capacitance of the FD transfer transistor FDG is increased to thereby increase the entire FD capacitance C. In contrast, in a case where the FD transfer transistor FDG is turned off, the entire FD capacitance C is decreased. Thus, turning on and off the FD transfer transistor FDG makes it possible to make the FD capacitance C variable and switch the conversion efficiency.

Figure 6:
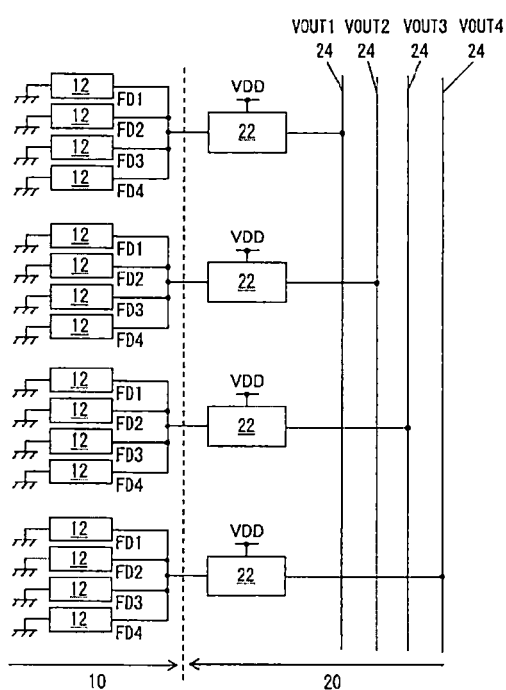
FIG. 6 is a diagram illustrating an example of a coupling mode between a plurality of readout circuits and a plurality of vertical signal lines.

FIG. 6 illustrates an example of a coupling mode between a plurality of readout circuits 22 and a plurality of vertical signal lines 24. In a case where the plurality of readout circuits 22 are disposed side by side in an extending direction (for example, the column direction) of the vertical signal lines 24, one of the plurality of vertical signal lines 24 may be assigned to each of the readout circuits 22. For example, as illustrated in FIG. 6, in a case where four readout circuits 22 are disposed side by side in the extending direction (for example, the column direction) of the vertical signal lines 24, one of four vertical signal lines 24 may be assigned to each of the readout circuits 22. It should be noted that, in FIG. 6, to discriminate the respective vertical signal lines 24, identification numbers (1, 2, 3, and 4) are given to ends of reference numerals of the respective signal lines 24.

Figure 8:
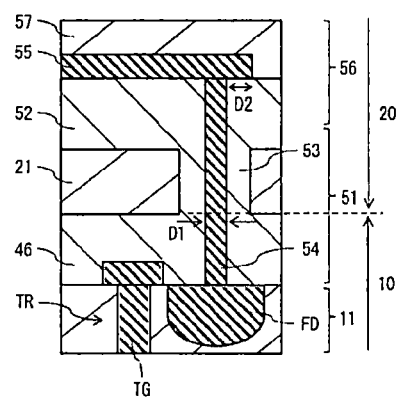
FIG. 8 is an enlarged view of a coupling portion between a first substrate and a second substrate in the imaging element in FIG. 7.
Figure 9:
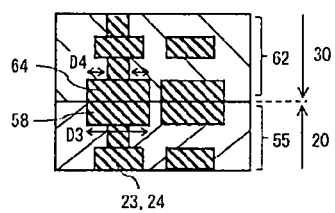
FIG. 9 is an enlarged view of a coupling portion between the second substrate and a third substrate in the imaging element in FIG. 7.

FIG. 7 illustrates an example of a cross-sectional configuration in a vertical direction of the imaging element 1. FIG. 7 exemplifies a cross-sectional configuration at a position opposed to the sensor pixel 12 in the imaging element 1. FIG. 8 is an enlarged view of a coupling portion (a circled portion in FIG. 7) between the first substrate 10 and the second substrate 20 in the imaging element 1. FIG. 9 is an enlarged view of a coupling portion (a circled portion in FIG. 7) between the second substrate 20 and the third substrate 30 in the imaging element 1. The imaging element 1 includes the first substrate 10, the second substrate 20, and the third substrate 30 that are stacked in this order, and further includes color filters 40 and light receiving lenses 50 on a back surface side (a light incident surface side) of the first substrate 10. One of the color filters 40 and one of the light receiving lenses 50 are provided for each of the sensor pixels 12, for example. That is, the imaging element 1 is of a backside illuminated type.

The first substrate 10 includes an insulating layer 46 that is stacked on the semiconductor substrate 11. The insulating layer 46 corresponds to a specific example of a "first insulating layer" of the present disclosure. The first substrate 10 includes the insulating layer 46 as a portion of an interlayer insulating film 51. The insulating layer 46 is provided in a gap between the semiconductor substrate 11 and the semiconductor substrate 21 to be described later. The semiconductor substrate 11 includes a silicon substrate. The semiconductor substrate 11 includes, for example, a p-well layer 42 in a portion of a front surface and its vicinity, and includes the PD 41 of an electrical conductivity type different from that of the p-well layer 42 in another region (a region deeper than the p-well layer 42). The p-well layer 42 includes a p-type semiconductor region. The PD 41 includes a semiconductor region of an electrical conductivity type (specifically, n-type) different from that of the p-well layer 42. The semiconductor substrate 11 includes, in the p-well layer 42, the floating diffusion FD as a semiconductor region of an electrical conductivity type (specifically, n-type) different from that of the p-well layer 42.

The first substrate 10 includes the photodiode PD, the transfer transistor TR, and the floating diffusion FD for each of the sensor pixels 12. The first substrate 10 has a configuration in which the transfer transistor TR and the floating diffusion FD are provided in a portion on a front surface side (a side opposite to the light incident surface side, i.e., the second substrate 20 side) of the semiconductor substrate 11. The first substrate 10 includes an element separator 43 that separates the respective sensor pixels 12. The element separator 43 is formed to extend in a direction of a normal to the semiconductor substrate 11 (a direction perpendicular to the front surface of the semiconductor substrate 11). The element separator 43 is provided between two mutually adjacent ones of the sensor pixels 12. The element separator 43 electrically separates the mutually adjacent sensor pixels 12 from each other. The element separator 43 includes, for example, silicon oxide. The element separator 43 penetrates through the semiconductor substrate 11, for example. The first substrate 10 further includes, for example, a p-well layer 44 in contact with a side surface on the photodiode PD side of the element separator 43. The p-well layer 44 includes a semiconductor region of an electrical conductivity type (specifically, p-type) different from that of the photodiode PD. The first substrate 10 further includes, for example, a fixed electric charge film 45 in contact with the back surface of the semiconductor substrate 11. The fixed electric charge film 45 is negatively charged to suppress generation of a dark current caused by an interface level on a light receiving surface side of the semiconductor substrate 11. The fixed electric charge film 45 includes, for example, an insulating film having a negative fixed electric charge. Examples of a material of such an insulating film include hafnium oxide, zirconium oxide, aluminum oxide, titanium oxide or tantalum oxide. A hole accumulation layer is formed at an interface on the light receiving surface side of the semiconductor substrate 11 by an electric field induced by the fixed electric charge film 45. This hole accumulation layer suppresses generation of electrons from the interface. The color filter 40 is provided on the back surface side of the semiconductor substrate 11. The color filter 40 is provided in contact with the fixed electric charge film 45, for example, and is provided at a position opposed to the sensor pixel 12 with the fixed electric charge film 45 interposed therebetween. The light receiving lens 50 is provided in contact with the color filter 40, for example, and is provided at a position opposed to the sensor pixel 12 with the color filter 40 and the fixed electric charge film 45 interposed therebetween.

The second substrate 20 includes an insulating layer 52 that is stacked on the semiconductor substrate 21. The insulating layer 52 corresponds to a specific example of a "third insulating layer" of the present disclosure. The second substrate 20 includes the insulating layer 52 as a portion of the interlayer insulating film 51. The insulating layer 52 is provided in a gap between the semiconductor substrate 21 and the semiconductor substrate 31. The semiconductor substrate 21 includes a silicon substrate. The second substrate 20 includes one readout circuit 22 for every four sensor pixels 12. The second substrate 20 has a configuration in which the readout circuit 22 is provided in a portion on the front surface side (the third substrate 30 side) of the semiconductor substrate 21. The second substrate 20 is bonded to the first substrate 10 in such a fashion that a back surface of the semiconductor substrate 21 is opposed to the front surface side of the semiconductor substrate 11. That is, the second substrate 20 is bonded to the first substrate 10 in a face-to-back fashion. The second substrate 20 further includes an insulating layer 53 in the same layer as the semiconductor substrate 21. The insulating layer 53 penetrates through the semiconductor substrate 21. The insulating layer 53 corresponds to a specific example of a "second insulating layer" of the present disclosure. The second substrate 20 includes the insulating layer 53 as a portion of the interlayer insulating film 51. The insulating layer 53 is provided to cover a side surface of a through wiring line 54 to be described later.

A stacked body of the first substrate 10 and the second substrate 20 includes the interlayer insulating film 51 and the through wiring line 54 provided in the interlayer insulating film 51. The through wiring line 54 corresponds to a specific example of a "first through wiring line" of the present disclosure. The stacked body described above includes one through wiring line 54 for each of the sensor pixels 12. The through wiring line 54 extends in a direction of a normal to the semiconductor substrate 21, and is provided to penetrate through a portion including the insulating layer 53 of the interlayer insulating film 51. The first substrate 10 and the second substrate 20 are electrically coupled to each other by the through wiring line 54. Specifically, the through wiring line 54 is electrically coupled to the floating diffusion FD and a coupling wiring line 55 to be described later.

The stacked body of the first substrate 10 and the second substrate 20 further includes through wiring lines 47 and 48 (see FIG. 10 to be described later) provided in the interlayer insulating film 51. The through wiring line 48 corresponds to a specific example of a "first through wiring line" of the present disclosure. The stacked body described above includes one through wiring line 47 and one through wiring line 48 for each of the sensor pixels 12. The respective through wiring lines 47 and 48 extend in the direction of the normal to the semiconductor substrate 21, and are provided to penetrate through a portion including the insulating layer 53 of the interlayer insulating film 51. The first substrate 10 and the second substrate 20 are electrically coupled to each other by the through wiring lines 47 and 48. Specifically, the through wiring line 47 is electrically coupled to the p-well layer 42 of the semiconductor substrate 11 and a wiring line in the second substrate 20. The through wiring line 48 is electrically coupled to the transfer gate TG and the pixel drive line 23.

The second substrate 20 includes, for example, a plurality of coupling sections 59 in the insulating layer 52. The plurality of coupling sections is electrically coupled to the readout circuit 22 and the semiconductor substrate 21. The second substrate 20 further includes, for example, a wiring layer 56 on the insulating layer 52. The wiring layer 56 includes, for example, an insulating layer 57 and, the plurality of pixel drive lines 23 and the plurality of vertical signal lines 24 that are provided in the insulating layer 57. The wiring layer 56 further includes, for example, a plurality of coupling wiring lines 55 in the insulating layer 57. One of the plurality of coupling wiring lines 55 is provided for every four sensor pixels 12. The coupling wiring line 55 electrically couples the respective through wiring lines 54 to each other. The through wiring lines 54 are electrically coupled to the respective floating diffusions FD included in the four sensor pixels 12 sharing the readout circuit 22. Here, the total number of through wiring lines 54 and 48 is greater than the total number of sensor pixels 12 included in the first substrate 10, and is twice the total number of sensor pixels 12 included in the first substrate 10. In addition, the total number of through wiring lines 54, 48, and 47 is greater than the total number of sensor pixels 12 included in the first substrate 10, and is three times the total number of sensor pixels 12 included in the first substrate 10.

The wiring layer 56 further includes a plurality of pad electrodes 58 in the insulating layer 57, for example. Each of the pad electrodes 58 is formed using, for example, a metal such as Cu (copper) and Al (aluminum). Each of the pad electrodes 58 is exposed to a front surface of the wiring layer 56. The pad electrodes 58 are used for electrical coupling between the second substrate 20 and the third substrate 30 and bonding between the second substrate 20 and the third substrate 30. One of the plurality of pad electrodes 58 is provided for each of the pixel drive lines 23 and the vertical signal lines 24, for example. Here, the total number of pad electrodes 58 (or the total number of junctions between the pad electrodes 58 and pad electrodes 64 (to be described later) is less than the total number of sensor pixels 12 included in the first substrate 10.

The third substrate 30 includes, for example, an interlayer insulating film 61 on the semiconductor substrate 31. It should be noted that, the front surfaces of the third substrate 30 and the second substrate 20 are bonded to each other as described later: therefore, in description of a configuration in the third substrate 30, a top side and a bottom side are opposite to those in the diagrams. The semiconductor substrate 31 includes a silicon substrate. The third substrate 30 has a configuration in which the logic circuit 32 is provided in a portion on the front surface side of the semiconductor substrate 31. The third substrate 30 further includes, for example, a wiring layer 62 on the interlayer insulating film 61. The wiring layer 62 includes, for example, an insulating layer 63 and a plurality of pad electrodes 64 provided in the insulating layer 63. The plurality of pad electrodes 64 is electrically coupled to the logic circuit 32. Each of the pad electrodes 64 is formed using, for example, Cu (copper). Each of the pad electrodes 64 is exposed to a front surface of the wiring layer 62. Each of the pad electrodes 64 is used for electrical coupling between the second substrate 20 and the third substrate 30 and bonding between the second substrate 20 and the third substrate 30. Further, the number of the pad electrodes 64 may not necessarily plural, only one pad electrode 64 is allowed to be electrically coupled to the logic circuit 32. The second substrate 20 and the third substrate 30 are electrically coupled to each other by a junction between the pad electrodes 58 and 64. That is, the gate (the transfer gate TG) of the transfer transistor TR is electrically coupled to the logic circuit 32 via the through wiring line 54 and the pad electrodes 58 and 64. The third substrate 30 is bonded to the second substrate 20 in such a fashion that a front surface of the semiconductor substrate 31 is opposed to the front surface side of the semiconductor substrate 21. That is, the third substrate 30 is bonded to the second substrate 20 in a face-to-face fashion.

As illustrated in FIG. 8, the first substrate 10 and the second substrate 20 are electrically coupled to each other by the through wiring line 54. Further, as illustrated in FIG. 9, the second substrate 20 and the third substrate 30 are electrically coupled to each other by the junction between the pad electrodes 58 and 64. Here, a width D1 of the through wiring line 54 is narrower than a width D3 of a junction portion between the pad electrodes 58 and 64. That is, a cross-sectional area of the through wiring line 54 is smaller than a cross-sectional area of the junction portion between the pad electrodes 58 and 64. Accordingly, the through wiring line 54 does not impair reduction in area per pixel in the first substrate 10. In addition, the readout circuit 22 is formed in the second substrate 20, and the logic circuit 32 is formed in the third substrate 30, which makes it possible to form a configuration for electrical coupling between the second substrate 20 and the third substrate 30 with a more flexible layout such as arrangement and the number of contacts for coupling, as compared to a configuration for electrical coupling between the first substrate 10 and the second substrate 20. Accordingly, it is possible to use the junction between the pad electrodes 58 and 64 as a configuration for electrical coupling between the second substrate 20 and the third substrate 30.

Figure 10:
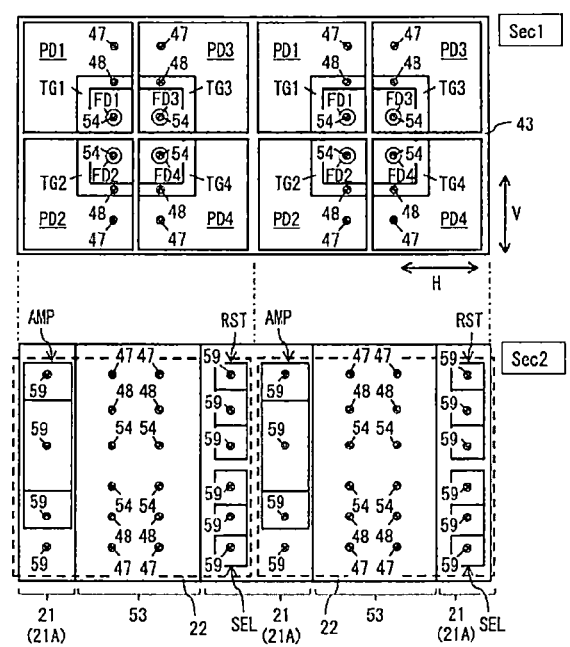
FIG. 10 is a diagram illustrating an example of a cross-sectional configuration in a horizontal direction of the imaging element in FIG. 1.
Figure 11:
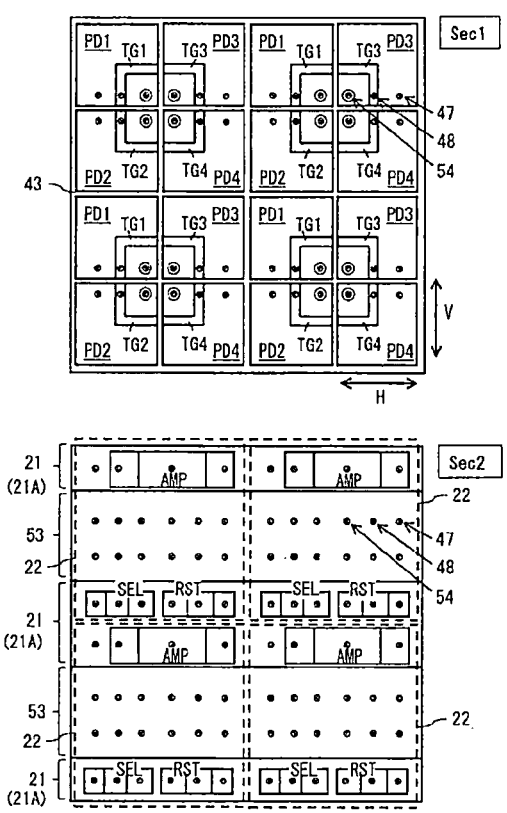
FIG. 11 is a diagram illustrating an example of a cross-sectional configuration in the horizontal direction of the imaging element in FIG. 1.

FIGS. 10 and 11 each illustrate an example of a cross-sectional configuration in the horizontal direction of the imaging element 1. An upper diagram of each of FIGS. 10 and 11 illustrates an example of a cross-sectional configuration at a cross section Sec1 of FIG. 7, and a lower diagram of each of FIGS. 10 and 11 illustrates an example of a cross-sectional configuration at a cross section Sec2 of FIG. 7. FIG. 10 exemplifies a configuration in which two groups of four sensor pixels 12 in a 2×2 arrangement are disposed side by side in a second direction H, and FIG. 11 exemplifies a configuration in which four groups of four sensor pixels 12 in a 2×2 arrangement are disposed side by side in a first direction V and the second direction H. It should be noted that, in the upper cross-sectional views of FIGS. 10 and 11, a diagram illustrating an example of a front surface configuration of the semiconductor substrate 11 is superimposed on a diagram illustrating an example of the cross-sectional configuration at the cross section Sec1 of FIG. 7, and the insulating layer 46 is not illustrated. In addition, in the lower cross-sectional views of FIGS. 10 and 11, a diagram illustrating an example of a front surface configuration of the semiconductor substrate 21 is superimposed on a diagram illustrating an example of the cross-sectional configuration at the cross section Sec2 of FIG. 7.

As illustrated in FIGS. 10 and 11, the plurality of through wiring lines 54, the plurality of through wiring lines 48, and the plurality of through wiring lines 47 are disposed side by side in a band-like fashion in the first direction V (an upward-downward direction in FIG. 10 or a rightward-leftward direction in FIG. 11) in a plane of the first substrate 10. It should be noted that FIGS. 10 and 11 exemplify a case where the plurality of through wiring lines 54, the plurality of through wiring lines 48, and the plurality of through wiring lines 47 are disposed side by side in two columns in the first direction V. The first direction V is parallel to one arrangement direction (for example, a column direction) of two arrangement directions (for example, a row direction and the column direction) of the plurality of sensor pixels 12 arranged in a matrix. In the four sensor pixels 12 sharing the readout circuit 22, the four floating diffusions FD are disposed close to each other with the element separator 43 interposed therebetween, for example. In the four sensor pixels 12 sharing the read circuit 22, the four transfer gates TG are disposed to surround the four floating diffusion FD, and the four transfer gates TG form an annular shape, for example.

The insulating layer 53 includes a plurality of blocks extending in the first direction V. The semiconductor substrate 21 includes a plurality of island-shaped blocks 21A that extends in the first direction V and is disposed side by side in the second direction H orthogonal to the first direction V with the insulating layer 53 interposed therebetween. Each of the blocks 21A includes, for example, a plurality of groups of the reset transistor RST, the amplification transistor AMP, and the selection transistor SEL. One readout circuit 22 shared by the four sensor pixels 12 includes, for example, the reset transistor RST, the amplification transistor AMP, and the selection transistor SEL in a region opposed to the four sensor pixels 12. One readout circuit 22 shared by the four sensor pixels 12 includes, for example, the amplification transistor AMP in the block 21A on the left of the insulating layer 53 and the reset transistor RST and the selection transistor SEL in the block 21A on the right of the insulating layer 53.

FIGS. 12, 13, 14, and 15 each illustrate an example of a wiring layout in a horizontal plane of the imaging element 1. FIGS. 12 to 15 each exemplify a case where one readout circuit 22 shared by the four sensor pixels 12 is provided in a region opposed to the four sensor pixels 12. Wiring lines described in FIGS. 12 to 15 are provided in layers different from each other in the wiring layer 56, for example.

Figure 12:
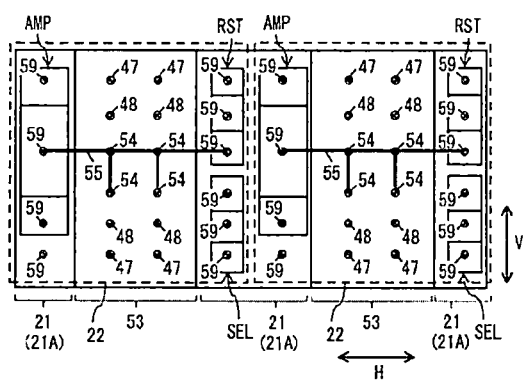
FIG. 12 is a diagram illustrating an example of a wiring layout in a horizontal plane of the imaging element in FIG. 1.

Four through wiring lines 54 adjacent to each other are electrically coupled to the coupling wiring line 55, for example, as illustrated in FIG. 12. Four through wiring lines 54 adjacent to each other are further electrically coupled to the gate of the amplification transistor AMP included in the block 21A on the left of the insulating layer 53 and the gate of the reset transistor RST included in the block 21A on the right of the insulating layer 53 via the coupling wiring line 55 and the coupling section 59, for example, as illustrated in FIG. 12.

Figure 13:
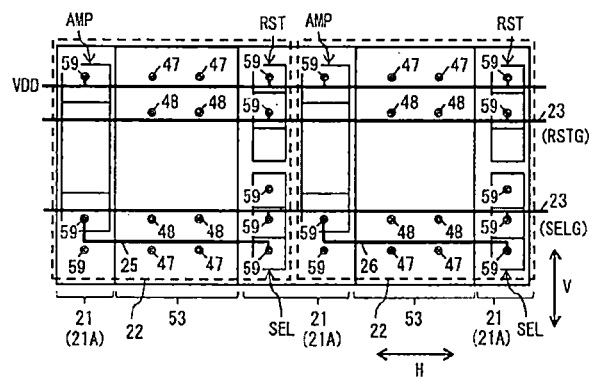
FIG. 13 is a diagram illustrating an example of a wiring layout in the horizontal plane of the imaging element in FIG. 1.

The power source line VDD is disposed at a position opposed to each of the readout circuits 22 disposed side by side in the second direction H, for example, as illustrated in FIG. 13. The power source line VDD is electrically coupled to the drain of the amplification transistor AMP and the drain of the reset transistor RST in each of the readout circuits 22 disposed side by side in the second direction H via the coupling sections 59, for example, as illustrated in FIG. 13. Two pixel drive lines 23 are disposed at a position opposed to the respective readout circuits 22 disposed side by side in the second direction H, for example, as illustrated in FIG. 13. One pixel drive line 23 (a second control line) is, for example, a wiring line RSTG electrically coupled to the gate of the reset transistor RST of each of the readout circuits 22 disposed side by side in the second direction H, as illustrated in FIG. 13. The other pixel drive line 23 (a third control line) is, for example, a wiring line SELG electrically coupled to the gate of the selection transistor SEL of each of the readout circuits 22 disposed side by side in the second direction H, as illustrated in FIG. 13. In each of the readout circuits 22, the source of the amplification transistor AMP and the drain of the selection transistor SEL are electrically coupled to each other via the wiring line 25, for example, as illustrated in FIG. 13.

Figure 14:
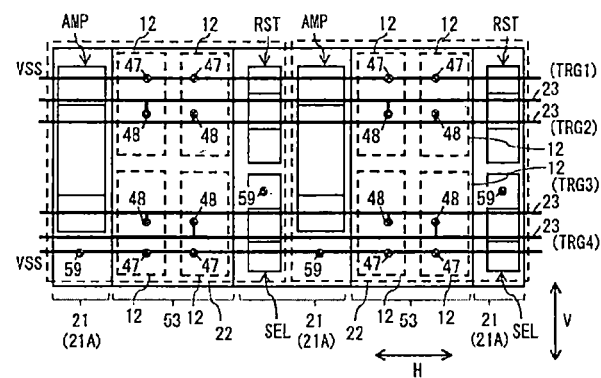
FIG. 14 is a diagram illustrating an example of a wiring layout in the horizontal plane of the imaging element in FIG. 1.

Two power source lines VSS are disposed at a position opposed to the respective readout circuits 22 disposed side by side in the second direction H, for example, as illustrated in FIG. 14. Each of the power source lines VSS is electrically coupled to a plurality of through wiring lines 47 at a position opposed to the respective sensor pixels 12 disposed side by side in the second direction H, for example, as illustrated in FIG. 14. Four pixel drive lines 23 are disposed at a position opposed to the respective readout circuits 22 disposed side by side in the second direction H, for example, as illustrated in FIG. 14. Each of the four pixel drive lines 23 is, for example, a wiring line TRG electrically coupled to the through wiring line 48 of one sensor pixel 12 of the four sensor pixels 12 corresponding to each of the readout circuits 22 disposed side by side in the second direction H, as illustrated in FIG. 14. That is, the four pixel drive lines 23 (first control lines) are electrically coupled to the gates (the transfer gates TG) of the transfer transistors TR of the respective sensor pixels 12 disposed side by side in the second direction H. In FIG. 14, identifiers (1, 2, 3, and 4) are given to ends of the respective wiring lines TRG to discriminate the respective wiring lines TRG.

Figure 15:
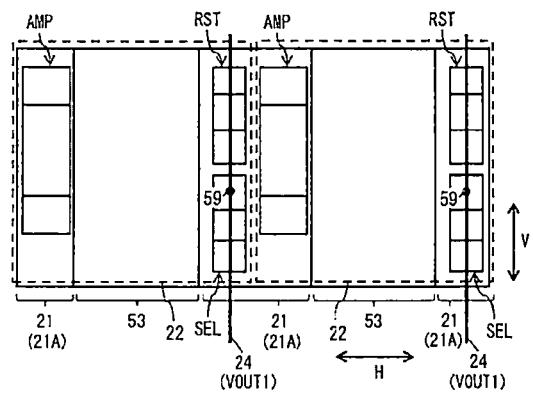
FIG. 15 is a diagram illustrating an example of a wiring layout in the horizontal plane of the imaging element in FIG. 1.

The vertical signal line 24 is disposed at a position opposed to the respective readout circuits 22 disposed side by side in the first direction V, for example, as illustrated in FIG. 15. The vertical signal line 24 (output line) is electrically coupled to the output terminal (the source of the amplification transistor AMP) of each of the readout circuits 22 disposed side by side in the first direction V, for example, as illustrated in FIG. 15.

[Manufacturing Method]

Next, description is given of manufacturing processes of the imaging element 1. FIGS. 16A to 16F each illustrate an example of a manufacturing process of the imaging element 1.

Figure 16A:
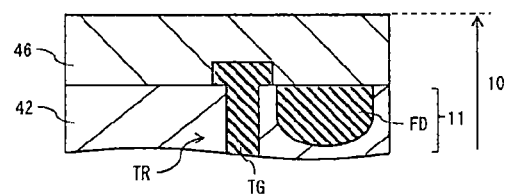
FIG. 16A is a diagram illustrating an example of a manufacturing process of the imaging element in FIG. 1.

First, the p-well layer 42, the element separator 43, and the p-well layer 44 are formed on the semiconductor substrate 11. Next, the photodiode PD, the transfer transistor TR, and the floating diffusion FD are formed in the semiconductor substrate 11 (FIG. 16A). Thus, the sensor pixel 12 is formed in the semiconductor substrate 11. At this time, it is preferable not to use, as an electrode material used for the sensor pixel 12, a material having low heat resistance such as $CoSi_2$ or NiSi by a salicide process. It is rather preferable to use a material having high heat resistance as the electrode material used for the sensor pixel 12. Examples of the material having high heat resistance include polysilicon. The insulating layer 46 is then formed on the semiconductor substrate 11 (FIG. 16A). Thus, the first substrate 10 is formed.

Figure 16B:
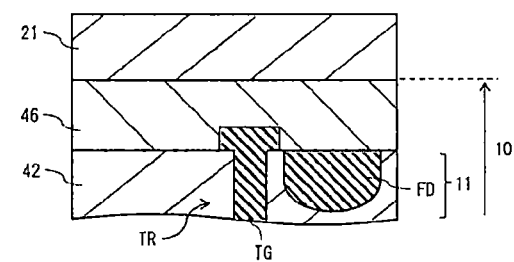
FIG. 16B is a diagram illustrating an example of a manufacturing process following FIG. 16A.

Next, the semiconductor substrate 21 is bonded onto the first substrate 10 (the insulating layer 46) (FIG. 16B). At this time, the semiconductor substrate 21 is thinned as necessary. In this case, a thickness of the semiconductor substrate 21 is set to a film thickness necessary for formation of the readout circuit 22. The thickness of the semiconductor substrate 21 is generally about several hundreds of nm. However, an FD (Fully Depletion) type is possible depending on the concept of the readout circuit 22. In such a case, the thickness of the semiconductor substrate 21 may be in a range from several nm to several μm.

Figure 16C:
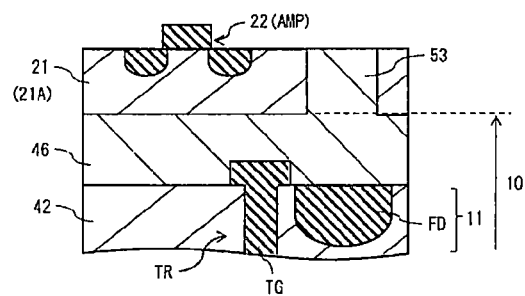
FIG. 16C is a diagram illustrating an example of a manufacturing process following FIG. 16B.

Next, the insulating layer 53 is formed in the same layer as the semiconductor substrate 21 (FIG. 16C). The insulating layer 53 is formed, for example, at a position opposed to the floating diffusion FD. For example, a slit penetrating through the semiconductor substrate 21 is formed in the semiconductor substrate 21 to separate the semiconductor substrate 21 into a plurality of blocks 21A. Thereafter, the insulating layer 53 is formed to be embedded in the slit. Thereafter, the readout circuit 22 including the amplification transistor AMP and the like is formed in each of the blocks 21A of the semiconductor substrate 21 (FIG. 16C). At this time, in a case where a metal material having high heat resistance is used as an electrode material of the sensor pixel 12, it is possible to from a gate insulating film of the readout circuit 22 by thermal oxidation.

Figure 16D:
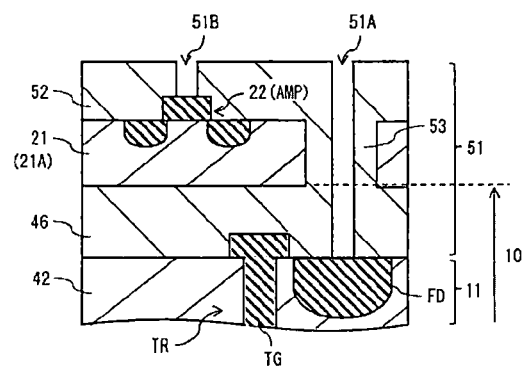
FIG. 16D is a diagram illustrating an example of a manufacturing process following FIG. 16C.

Next, the insulating layer 52 is formed on the semiconductor substrate 21. Thus, the interlayer insulating film 51 including the insulating layers 46, 52, and 53 is formed. Subsequently, through holes 51A and 51B are formed in the interlayer insulating film 51 (FIG. 16D). Specifically, the through hole 51B penetrating through the insulating layer 52 is formed at a position opposed to the readout circuit 22 in the insulating layer 52. In addition, the through hole 51A penetrating through the interlayer insulating film 51 is formed at a position opposed to the floating diffusion FD (that is, a position opposed to the insulating layer 53) in the interlayer insulating film 51.

Figure 16E:
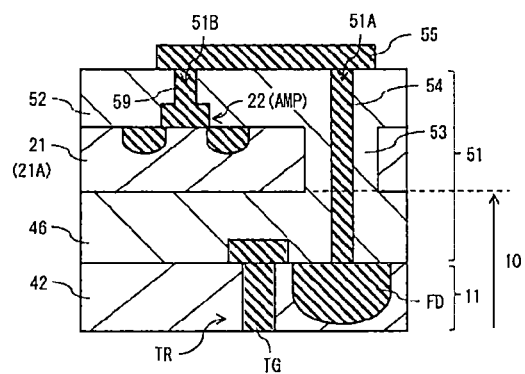
FIG. 16E is a diagram illustrating an example of a manufacturing process following FIG. 16D.

Next, an electrically conductive material is embedded in the through holes 51A and 51B to form the through wiring line 54 in the through hole 51A and form the coupling section 59 in the through hole 51B (FIG. 16E). Further, the coupling wiring line 55 that electrically couples the through wiring line 54 and the coupling section 59 to each other is formed on the insulating layer 52 (FIG. 16E). Thereafter, the wiring layer 56 including the pad electrode 58 is formed on the insulating layer 52. Thus, the second substrate 20 is formed.

Figure 16F:
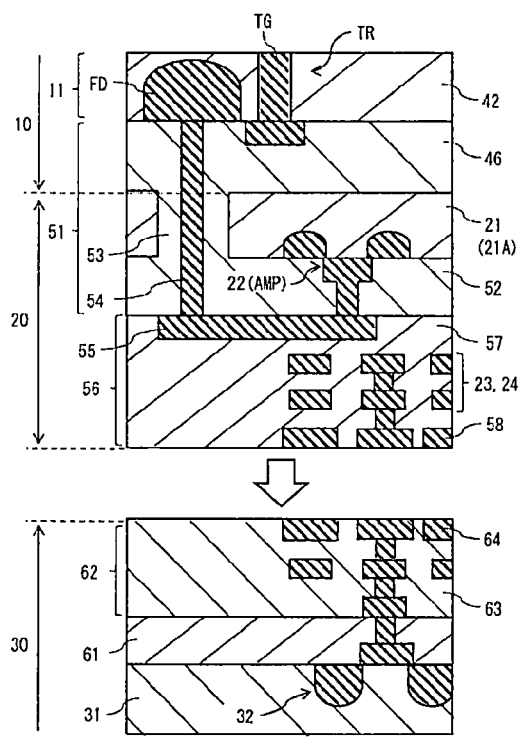
FIG. 16F is a diagram illustrating an example of a manufacturing process following FIG. 16E.

Next, the second substrate 20 is bonded to the third substrate 30, in which the logic circuit 32 and the wiring layer 62 are formed, in such a fashion that the front surface of the semiconductor substrate 21 is opposed to the front surface side of the semiconductor substrate 31 (FIG. 16F). At this time, the pad electrode 58 of the second substrate 20 and the pad electrode 64 of the third substrate 30 are joined to each other to thereby electrically couple the second substrate 20 and the third substrate 30 to each other. Thus, the imaging element 1 is manufactured.

[Effects]

Reduction in area per pixel of an imaging element having a two-dimensional configuration has been achieved by introduction of fine processes and an improvement in packing density. In recent years, an imaging element having a three-dimensional configuration has been developed to achieve further reduction in size of the imaging element and reduction in area per pixel. In the imaging element having the three-dimensional configuration, for example, a semiconductor substrate including a plurality of sensor pixels, and a semiconductor substrate including a signal processing circuit that processes a signal obtained by each of the sensor pixels are stacked on each other. This makes it possible to further increase the degree of integration of the sensor pixels and further increase a size of the signal processing circuit with a substantially same chip size as before.

Incidentally, in the imaging element having the three-dimensional configuration, in a case where three semiconductor chips are stacked, it is not possible to bond front surfaces of all semiconductor substrates to each other (in a fact-to-face fashion). In a case where three semiconductor substrates are stacked planlessly, there is a possibility of increasing a chip size or impairing reduction in area per pixel resulting from a configuration in which the semiconductor substrates are electrically coupled to each other.

In contrast, in the present embodiment, the sensor pixels 12 and the readout circuits 22 are formed in substrate different from each other (the first substrate 10 and the second substrate 20). This makes it possible to expand the areas of the sensor pixels 12 and the readout circuits 22, as compared with a case where the sensor pixels 12 and the readout circuits 22 are formed in the same substrate. As a result, it is possible to improve photoelectric conversion efficiency and reduce transistor noise. In addition, the first substrate 10 including the sensor pixels 12 and the second substrate 20 including the readout circuits 22 are electrically coupled to each other by the through wiring line 54 provided in the interlayer insulating film 51. This makes it possible to further reduce the chip size, as compared with a case where the first substrate 10 and the second substrate 20 are electrically coupled to each other by a junction between pad electrodes and a through wiring line penetrating through a semiconductor substrate (for example, a TSV (Thorough Si Via)). In addition, further reduction in area per pixel makes it possible to further increase resolution. In addition, in a case where the chip size is the same as before, it is possible to expand a formation region of the sensor pixels 12. In addition, in the present embodiment, the readout circuits 22 and the logic circuit 32 are formed in substrates different from each other (the second substrate 20 and the third substrate 30). This makes it possible to expand areas of the readout circuits 22 and the logic circuit 32, as compared with a case where the readout circuits 22 and the logic circuit 32 are formed in the same substrate. In addition, the areas of the readout circuits 22 and the logic circuit 32 are not defined by the element separator 43, which makes it possible to improve noise characteristics. In addition, in the present embodiment, the second substrate 20 and the third substrate 30 are electrically coupled to each other by the junction between the pad electrodes 58 and 64. Here, the readout circuits 22 are formed in the second substrate 20, and the logic circuit 32 is formed in the third substrate 30, which makes it possible to form a configuration for electrical coupling between the second substrate 20 and the third substrate 30 with a more flexible layout such as arrangement and the number of contacts for coupling, as compared to a configuration for electrical coupling between the first substrate 10 and the second substrate 20. Accordingly, it is possible to use the junction between the pad electrodes 58 and 64 for electrical coupling between the second substrate 20 and the third substrate 30. As described above, in the present embodiment, the substrates are electrically coupled to each other in accordance with the degrees of integration of the substrates. Thus, the configuration for electrical coupling between the substrates does not cause an increase in the chip size and impairment of reduction in area per pixel. As a result, it is possible to provide the imaging element 1 having a three-layer configuration that has a substantially same chip size as before without impairing reduction in area per pixel.

In addition, in the present embodiment, the sensor pixels 12 each including the photodiode PD, the transfer transistor TR, and the floating diffusion FD are formed in the first substrate 10, and the readout circuits 22 each including the reset transistor RST, the amplification transistor AMP, and the selection transistor SEL are formed in the second substrate 20. This makes it possible to expand the areas of the sensor pixels 12 and the readout circuits 22, as compared with a case where the sensor pixels 12 and the readout circuits 22 are formed in the same substrate. This prevents an increase in the chip size and impairment of reduction in area per pixel even in a case where the junction between the pad electrodes 58 and 64 is used for electrical coupling between the second substrate 20 and the third substrate 30. As a result, it is possible to provide the imaging element 1 having a three-layer configuration that has a substantially same chip size as before without impairing reduction in area per pixel. Specifically, the number of transistors provided in the first substrate 10 is reduced, which makes it possible to specifically expand areas of the photodiodes PD of the sensor pixels 12. This makes it possible to increase an amount of saturation signal electric charges in photoelectric conversion and increases photoelectric conversion efficiency. In the second substrate 20, it is possible to ensure flexibility of a layout of each transistor in the readout circuit 22. In addition, it is possible to expand an area of each transistor, therefore, specifically expanding an area of the amplification transistor AMP makes it possible to reduce noise that affects the pixel signal. Even in a case where the junction between the pad electrodes 58 and 64 is used for electrical coupling between the second substrate 20 and the third substrate 30, an increase in the chip size and impairment of reduction in area per pixel are prevented. As a result, it is possible to provide the imaging element 1 having a three-layer configuration that has a substantially same chip size as before without impairing reduction in area per pixel.

In addition, in the present embodiment, the second substrate 20 is bonded to the first substrate 10 in such a fashion that the back surface of the semiconductor substrate 21 is opposed to the front surface side of the semiconductor substrate 11, and the third substrate 30 is bonded to the second substrate 20 in such a fashion that the front surface of the semiconductor substrate 31 is opposed to the front surface side of the semiconductor substrate 21. Accordingly, using the through wiring line 54 for electrical coupling between the first substrate 10 and the second substrate 20 and using the junction between the pad electrodes 58 and 64 for electrical coupling between the second substrate 20 and the third substrate 30 makes it possible to provide the imaging element 1 having a three-layer configuration that has a substantially same chip size as before without impairing reduction in area per pixel.

In addition, in the present embodiment, the cross-sectional area of the through wiring line 54 is smaller than the cross-sectional area of the junction portion between the pad electrodes 58 and 64. This makes it possible to provide the imaging element 1 having a three-layer configuration that has a substantially same chip size as before without impairing reduction in area per pixel.

In addition, in the logic circuit 32 of the present embodiment, the low-resistance region including a silicide, such as $CoSi_2$ or NiSi, formed with use of a salicide (Self Aligned Silicide) process is formed in the front surface of the impurity diffusion region in contact with the source electrode and the drain electrode. The low-resistance region including the silicide is formed using a compound of a material of a semiconductor substrate and a metal. Here, the logic circuit 32 is provided in the third substrate 30. This makes it possible to form the logic circuit 32 in a process other than a process of forming the sensor pixels 12 and the readout circuits 22. As a result, it is possible to use a high-temperature process such as thermal oxidation to form the sensor pixels 12 and the readout circuits 22. In addition, it is possible to use, for the logic circuit 32, the silicide that is a material having low heat resistance. Accordingly, in a case where the low-resistance region including the silicide is provided in a front surface of an impurity diffusion region in contact with a source electrode and a drain electrode of the logic circuit 32, it is possible to reduce contact resistance, and as a result, it is possible to increase operation speed in the logic circuit 32.

In addition, in the present embodiment, the first substrate 10 includes the element separator 43 that separates the respective sensor pixels 12. However, in the present embodiment, the sensor pixels 12 each including the photodiode PD, the transfer transistor TR, and the floating diffusion FD are formed in the first substrate 10, and the readout circuits 22 each including the reset transistor RST, the amplification transistor AMP, and the selection transistor SEL are formed in the second substrate 20. This makes it possible to expand the areas of the sensor pixels 12 and the readout circuits 22 even in a case where an area surrounded by the element separator 43 is reduced by reduction in area per pixel. This prevents an increase in the chip size and impairment of reduction in area per pixel even in a case where the element separator 43 is used. This makes it possible to provide the imaging element 1 having a three-layer configuration that has a substantially same chip size as before without impairing reduction in area per pixel.

In addition, in the present embodiment, the element separator 43 penetrates through the semiconductor substrate 11. This makes it possible to suppress signal crosstalk between adjacent sensor pixels 12, and to suppress reduction in resolution on a regenerated image and deterioration in image quality caused by color mixture even in a case where a distance between the sensor pixels 12 is reduced by reduction in area per pixel.

In addition, in the present embodiment, the stacked body of the first substrate 10 and the second substrate 20 includes three through wiring line 54, 47, and 48 for each of the sensor pixels 12. The through wiring line 48 is electrically coupled to the gate (the transfer gate TG) of the transfer transistor TR, the through wiring line 47 is electrically coupled to the p-well layer 42 of the semiconductor substrate 11, and the through wiring line 54 is electrically coupled to the floating diffusion FD. That is, the number of through wiring lines 54, 47, and 48 is greater than the number of sensor pixels 12 included in the first substrate 10. However, in the present embodiment, the through wiring line 54 having a small cross-sectional area is used for electrical coupling between the first substrate 10 and the second substrate 20. This makes it possible to further reduce the chip size and further reduce the area per pixel in the first substrate 10. As a result, it is possible to provide imaging element 1 having a three-layer configuration that has a substantially same chip size as before without impairing reduction in area per pixel.

2. Modification Examples

Hereinafter, description is given of modification examples of the imaging element 1 according to the embodiment described above. In the following modification examples, common components to those in the embodiment described above are denoted by same reference numerals.

Modification Example A

FIG. 17 illustrates a modification example of the cross-sectional configuration in the vertical direction of the imaging element 1 according to the embodiment described above. FIG. 17 illustrates an modification example of the cross-sectional configuration illustrated in FIG. 7. In the present modification example, the transfer transistor TR has a planar transfer gate TG. Accordingly, the transfer gate TG does not penetrate through the well layer 42 and is formed only on the front surface of the semiconductor substrate 11. Even in a case where the planar transfer gate TG is used for the transfer transistor TR, the imaging element 1 has effects similar to those in the embodiment described above.

Modification Example B

FIGS. 18 and 19 each illustrate a modification example of the cross-sectional configuration in the vertical direction of the imaging element 1 according to the embodiment and the modification example thereof described above. FIG. 18 illustrates a modification example of the cross-sectional configuration illustrated in FIG. 7. FIG. 19 illustrates a modification example of the cross-sectional configuration illustrated in FIG. 17. In the present modification example, as a configuration for electrical coupling between the second substrate 20 and the third substrate 30, a through wiring line 65 penetrating through the semiconductor substrate 31 is used instead of the junction between the pad electrodes 58 and 64. That is, the third substrate 30 includes the through wiring line 65 used for electrical coupling between the second substrate 20 and the third substrate 30, and the second substrate 20 and the third substrate 30 are electrically coupled to each other by the through wiring line 65. That is, the gate (the transfer gate TG) of the transfer transistor TR is electrically coupled to the logic circuit 32 via the through wiring line 48, the pad electrode 58, and the through wiring line 65. Here, the total number of through wiring lines 65 is smaller than the total number of sensor pixels 12 included in the first substrate 10. The through wiring line 65 corresponds to a specific example of a "second through wiring line" of the present disclosure.

The through wiring line 65 includes, for example, a so-called TSV (Thorough Silicon Via). The width D1 of the through wiring line 54 is narrower than the width D3 of the through wiring line 65. That is, the cross-sectional area of the through wiring line 54 is smaller than the cross-sectional area of the through wiring line 65. Accordingly, the through wiring line 54 does not cause impairment of reduction in area per pixel in the first substrate 10. In addition, the readout circuits 22 are formed in the second substrate 20, and the logic circuit 32 is formed in the third substrate 30, which makes it possible to form a configuration for electrical coupling between the second substrate 20 and the third substrate 30 with a more flexible layout such as arrangement and the number of contacts for coupling, as compared to a configuration for electrical coupling between the first substrate 10 and the second substrate 20. Thus, This prevents an increase in the chip size and impairment of reduction in area per pixel even in a case where the through wiring line 65 is used as the configuration for electrical coupling between the second substrate 20 and the third substrate 30. As a result, it is possible to provide the imaging element 1 having a three-layer configuration that has a substantially same chip size as before without impairing reduction in area per pixel.

Modification Example C

FIG. 20 illustrates a modification example of the cross-sectional configuration in the vertical direction of the imaging element 1 according to the embodiment described above. In the present modification example, electrical coupling between the second substrate 20 and the third substrate 30 is made in a region opposed to a peripheral region 14 of the first substrate 10. The peripheral region 14 corresponds to a frame region of the first substrate 10 and is provided on the periphery of the pixel region 13. In the present modification example, the second substrate 20 includes a plurality of pad electrodes 58 in a region opposed to the peripheral region 14, and the third substrate 30 includes a plurality of pad electrodes 64 in a region opposed to the peripheral region 14. The second substrate 20 and the third substrate 30 are electrically coupled to each other by junctions between the pad electrodes 58 and 64 provided in the regions opposed to the peripheral region 14.

As described above, in the present modification example, the second substrate 20 and the third substrate 30 are electrically coupled to each other by the junctions between the pad electrodes 58 and 64 provided in the regions opposed to the peripheral region 14. This makes it possible to reduce a possibility of impairing reduction in area per pixel, as compared with a case where the pad electrodes 58 and 64 are joined to each other in regions opposed to the pixel region 13. Accordingly, it is possible to provide the imaging element 1 having a three-layer configuration that has a substantially same chip size as before without impairing reduction in area per pixel.

Modification Example D

FIGS. 21 and 22 each illustrate a modification example of the cross-sectional configuration in the vertical direction of the imaging element 1 according to the modification example C described above. In the present modification example, electrical coupling between the second substrate 20 and the third substrate 30 is made in a region opposed to the peripheral region 14.

In the present modification example, the imaging element 1 includes a through wiring line 66 in a region opposed to the peripheral region 14, for example, as illustrated in FIG. 21. The through wiring line 66 electrically couples the second substrate 20 and the third substrate 30 to each other. The through wiring line 66 extends in a direction of a normal to the semiconductor substrates 11 and 21, and penetrates through the first substrate 10 and the second substrate 20 and reaches the inside of the wiring layer 62 of the third substrate 30. The through wiring line 66 electrically couples a wiring line in the wiring layer 56 of the second substrate 20 and a wiring line in the wiring layer 62 of the third substrate 30 to each other.

In the present modification example, the imaging element 1 may include through wiring lines 67 and 68, and a coupling wiring line 69 in a region opposed to the peripheral region 14, for example, as illustrated in FIG. 22. A wiring line including the through wiring lines 67 and 68 and the coupling wiring line 69 electrically couples the second substrate 20 and the third substrate 30 to each other. The through wiring line 67 extends in the direction of the normal to the semiconductor substrates 11 and 21, and penetrates through the first substrate 10 and the second substrate 20 and reaches the inside of the wiring layer 62 of the third substrate 30. The through wiring line 68 extends in the direction of the normal to the semiconductor substrates 11 and 21, and penetrates through the first substrate 10 and reaches inside of the wiring layer 56 of the second substrate 20. The coupling wiring line 69 is provided in contact with the back surface of the semiconductor substrate 11, and is provided in contact with the through wiring line 67 and the through wiring line 68. The through wiring lines 67 and 68 electrically couple a wiring line in the wiring layer 56 of the second substrate 20 and a wiring line in the wiring layer 62 of the third substrate 30 to each other via the coupling wiring line 69.

As described above, in the present modification example, the second substrate 20 and the third substrate 30 are electrically coupled to each other by the through wiring line 66 or the wiring line including the through wiring lines 67 and 68 and the coupling wiring line 69 provided in the region opposed to the peripheral region 14. This makes it possible to reduce a possibility of impairing reduction in area per pixel, as compared with a case where the second substrate 20 and the third substrate 30 are electrically coupled to each other in a region opposed to the pixel region 13. Accordingly, it is possible to provide the imaging element 1 having a three-layer configuration that has a substantially same chip size as before without impairing reduction in area per pixel.

Modification Example E

Figure 23:
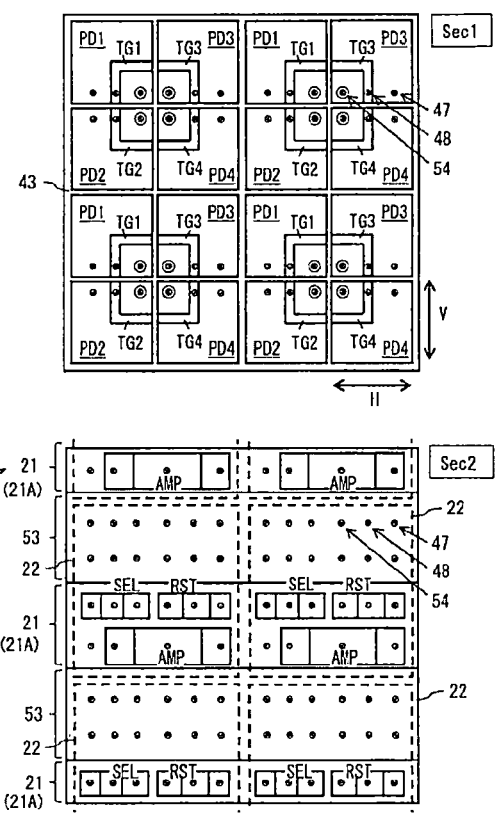
FIG. 23 is a diagram illustrating an example of across-sectional configuration in the horizontal direction of the imaging element in FIG. 1.
Figure 24:
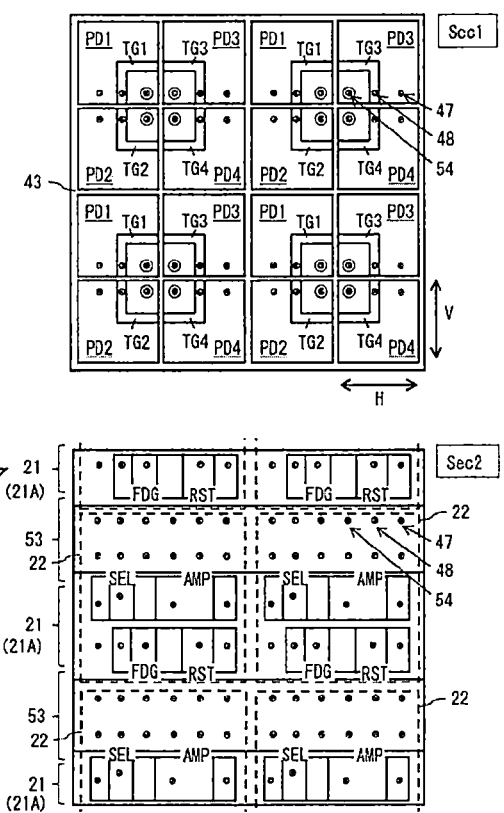
FIG. 24 is a diagram illustrating an example of a cross-sectional configuration in the horizontal direction of the imaging element in FIG. 1.

FIGS. 23 and 24 each illustrate a modification example of the cross-sectional configuration in the horizontal direction of the imaging element 1 according to the embodiment described above. An upper diagram of each of FIGS. 23 and 24 illustrates a modification example of the cross-sectional configuration at the cross section Sec1 of FIG. 7, and a lower diagram of each of FIGS. 23 and 24 illustrates a modification example of the cross-sectional configuration at the cross section Sec2 of FIG. 7. It should be noted that, in the upper cross-sectional views of FIGS. 23 and 24, a diagram illustrating a modification example of the front surface configuration of the semiconductor substrate 11 in FIG. 7 is superimposed on a diagram illustrating a modification example of the cross-sectional configuration at the cross section Sec1 of FIG. 7, and the insulating layer 46 is not illustrated. In addition, in the lower cross-sectional views of FIGS. 23 and 24, a diagram illustrating a modification example of the front surface configuration of the semiconductor substrate 21 is superimposed on a diagram illustrating a modification example of the cross-sectional configuration at the cross section Sec2 of FIG. 7.

As illustrated in FIGS. 23 and 24, the plurality of through wiring lines 54, the plurality of through wiring lines 48, and the plurality of through wiring lines 47 (a plurality of dots disposed in rows and columns in the diagrams) are disposed side by side in a band-like fashion in the first direction V (a rightward-leftward direction in FIGS. 23 and 24) in a plane of first substrate 10. It should be noted that FIGS. 23 and 24 exemplify a case where the plurality of through wiring lines 54, the plurality of through wiring lines 48, and the plurality of through wiring lines 47 are disposed side by side in two columns in the first direction V. In four sensor pixels 12 sharing the readout circuit 22, four floating diffusions FD are disposed close to each other with the element separator 43 interposed therebetween, for example. In the four sensor pixels 12 sharing the readout circuit 22, four transfer gates TG (TG1, TG2, TG3, and TG4) are disposed to surround the four floating diffusions FD, and the four transfer gates TG form an annular shape, for example.

The insulating layer 53 includes a plurality of blocks extending in the first direction V. The semiconductor substrate 21 includes a plurality of island-shaped blocks 21A that extends in the first direction V and is disposed side by side in the second direction H orthogonal to the first direction V with the insulating layer 53 interposed therebetween. Each of the blocks 21A includes, for example, the reset transistor RST, the amplification transistor AMP, and the selection transistor SEL. One readout circuit 22 shared by four sensor pixels 12 is not disposed directly opposed to the four sensor pixels 12, and is disposed to be shifted in the second direction H, for example.

In FIG. 23, one readout circuit 22 shared by four sensor pixels 12 includes the reset transistor RST, the amplification transistor AMP, and the selection transistor SEL in a region shifted to the second direction H from a region opposed to the four sensor pixels 12 in the second substrate 20. The one readout circuit 22 shared by the four sensor pixels 12 includes, for example, the amplification transistor AMP, the reset transistor RST, and the selection transistor SEL in one block 21A.

In FIG. 24, one readout circuit 22 shared by four sensor pixels 12 includes the reset transistor RST, the amplification transistor AMP, the selection transistor SEL, and the FD transfer transistor FDG in a region shifted in the second direction H from a region opposed to the four sensor pixels 12 in the second substrate 20. The one readout circuit 22 shared by the four sensor pixels 12 includes, for example, the amplification transistor AMP, the reset transistor RST, the selection transistor SEL, and the FD transfer transistor FDG in one block 21A.

In the present modification example, one readout circuit 22 shared by four sensor pixels 12 is not disposed directly opposed to the four sensor pixels 12, and is disposed to be shifted in the second direction H from a position directly opposed to the four sensor pixels 12, for example. In such a case, it is possible to shorten the wiring line 25, or it is possible to omit the wiring line 25 and form the source of the amplification transistor AMP and the drain of the selection transistor SEL in a common impurity region. As a result, it is possible to reduce the size of the readout circuit 22 or increase a size of any other portion in the readout circuit 22.

Figure 25:
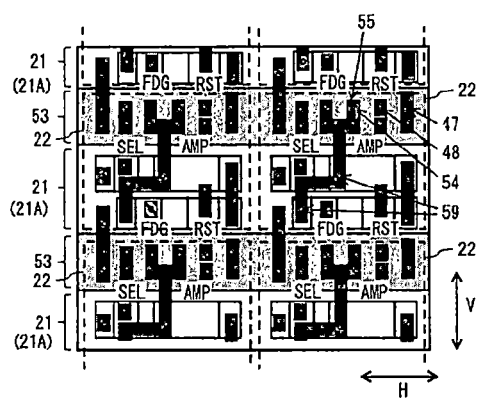
FIG. 25 is a diagram illustrating an example of a wiring layout in a horizontal plane of the imaging element having the cross-sectional configuration in FIG. 24.
Figure 26:
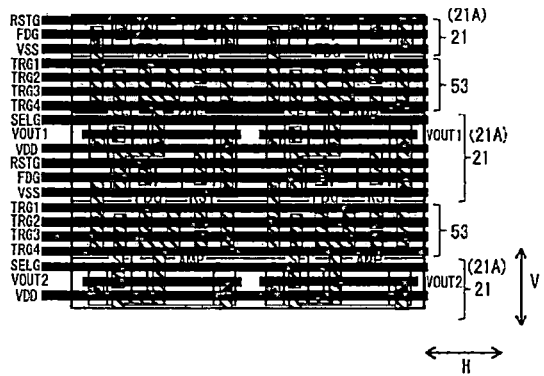
FIG. 26 is a diagram illustrating an example of a wiring layout in the horizontal plane of the imaging element having the cross-sectional configuration in FIG. 24.
Figure 27:
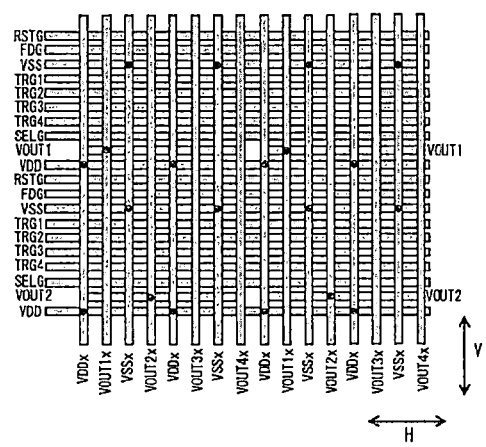
FIG. 27 is a diagram illustrating an example of a wiring layout in the horizontal plane of the imaging element having the cross-sectional configuration in FIG. 24.

FIGS. 25, 26, and 27 each illustrate an example of a wiring layout in a horizontal plane of the imaging element 1 described in FIG. 24. FIGS. 25 to 27 exemplify a case where one readout circuit 22 shared by four sensor pixels 12 is provided in a region shifted in the second direction H from a region opposed to the four sensor pixels 12. Wiring lines illustrated in FIGS. 25 to 27 are provided in layers different from each other in the wiring layer 56, for example.

Four through wiring lines 54 adjacent to each other are electrically coupled to the coupling wiring line 55, for example, as illustrated in FIG. 25. The four through wiring lines 54 adjacent to each other are further electrically coupled to the gate of the amplification transistor AMP included in a lower adjacent block 21A of the insulating layer 53 and the source of the FD transfer transistor FDG included in the lower adjacent block 21A of the insulating layer 53 via the coupling wiring line 55 and the coupling section 59, for example, as illustrated in FIG. 25.

For example, as illustrated in FIG. 26, the wiring line SELG, a wiring line Vout, a wiring line RSTG, a wiring line FDG, and the power source line VSS are disposed in a region opposed to each of the blocks 21A. In addition, for example, as illustrated in FIG. 26, wiring lines TRG1, TRG2, TRG3, and TRG4 are disposed a region opposed to each of the insulating layers 53.

Further, for example, as illustrated in FIG. 27, a power source line VDDx electrically coupled to the power source line VDD is provided. The power source line VDDx extends in the second direction H orthogonal to the power source line VDD extending in the first direction V. In addition, for example, as illustrated in FIG. 27, a power source line VSSx electrically coupled to the power source line VSS is provided. The power source line VSSx extends in the second direction H orthogonal to the power source line VSS extending in the first direction V.

In addition, for example, as illustrated in FIG. 27, a wiring line VOUT1x electrically coupled to a wiring line VOUT1 is provided. The wiring line VOUT1x extends in the second direction H orthogonal to the wiring line VOUT1 extending in the first direction V. In addition, for example, as illustrated in FIG. 27, a wiring line VOUT2x electrically coupled to a wiring line VOUT2 is provided. The wiring line VOUT2x extends in the second direction H orthogonal to the wiring line VOUT2 extending in the first direction V. In addition, for example, as illustrated in FIG. 27, a wiring line VOUT3x electrically coupled to a wiring line VOUT3 is provided. The wiring line VOUT3x extends in the second direction H orthogonal to the wiring line VOUT3 extending in the first direction V. In addition, for example, as illustrated in FIG. 27, a wiring line VOUT4x electrically coupled to a wiring line VOUT4 is provided. The wiring line VOUT4x extends in the second direction H orthogonal to the wiring line VOUT4 extending in the first direction V.

In the present modification example, the power source lines VDDx and VSSx, and the wiring lines VOUT1x to VOUT4x are provided in the wiring layer 56. This makes it possible to flexibly set a wiring line drawing direction.

Modification Example F

FIG. 28 illustrates a modification example of the cross-sectional configuration in the horizontal direction of the imaging element 1 according to the embodiment described above. FIG. 28 illustrates a modification example of the cross-sectional configuration in FIG. 10.

In the present modification example, the semiconductor substrate 21 includes a plurality of island-shaped blocks 21A disposed side by side in the first direction V and the second direction H with the insulating layer 53 interposed therebetween. Each of the blocks 21A includes, for example, one group of the reset transistor RST, the amplification transistor AMP, and the selection transistor SEL. In such a case, it is possible to suppress crosstalk between the readout circuits 22 adjacent to each other by the insulating layer 53, and it is possible to suppress reduction in resolution on a regenerated image and deterioration in image quality caused by color mixture.

Modification Example G

FIG. 29 illustrates a modification example of the ross-sectional configuration in the horizontal direction of the imaging element 1 according to the embodiment described above. FIG. 29 illustrates a modification example of the cross-sectional configuration in FIG. 28.

In the present modification example, one readout circuit 22 shared by four sensor pixels 12 is not disposed directly opposed to the four sensor pixels 12, and is disposed to be shifted in the first direction V. Further, in the present modification example, as in the modification example F, the semiconductor substrate 21 includes a plurality of island-shaped blocks 21A disposed side by side in the first direction V and the second direction H with the insulating layer 53 interposed therebetween. Each of the blocks 21A includes, for example, one group of the reset transistor RST, the amplification transistor AMP, and the selection transistor SEL. Further, in the present modification example, the plurality of through wiring lines 47 and the plurality of through wiring lines 54 are also arranged in the second direction H. Specifically, the plurality of through wiring lines 47 is disposed between four through wiring lines 54 sharing a certain readout circuit 22 and four through wiring lines 54 sharing another readout circuit 22 adjacent in the second direction H to the certain readout circuit 22. In such a case, it is possible to suppress crosstalk between the readout circuits 22 adjacent to each other by the insulating layer 53, and it is possible to suppress reduction in resolution on a regenerated image and deterioration in image quality caused by color mixture.

Modification Example H

FIG. 30 illustrates a modification example of the cross-sectional configuration in the vertical direction of the imaging element 1 according to the embodiment and the modification examples thereof described above. FIG. 30 is an enlarged view of a modification example of a cross-sectional configuration of the coupling portion between the first substrate 10 and the second substrate 20 in FIG. 7, FIGS. 17 to 24, FIG. 28, and FIG. 29.

In the present modification example, the transfer gate TG is not coupled to the through wiring line 48, and is electrically coupled to the gate wiring line 49 that is provided in the interlayer insulating film 51 (specifically, the insulating layer 46) and extends in a direction parallel to the front surface of the first substrate 10. That is, in the present modification example, the first substrate 10 includes the gate wiring line 49 provided in the interlayer insulating film 51 (specifically, the insulating layer 46). The gate wiring line 49 is electrically coupled to the logic circuit 32 via a through wiring line provided in a region (a frame region) not opposed to the pixel region 13 in the stacked body of the first substrate 10 and the second substrate 20, for example. That is, the gate (the transfer gate TG) of the transfer transistor TR is electrically coupled to the logic circuit 32 via the gate wiring line 49. Accordingly, it is not necessary to provide the through wiring line 48, which makes it possible to further increase the area of the readout circuit 22, as compared with a case where the through wiring line 48 is provided.

The gate wiring line 49 may be formed using a metal material having high heat resistance. Examples of the metal material having high heat resistance include W (tungsten), Ru (ruthenium), or the like. Ina case where the gate wiring line 49 is formed using the metal material having high heat resistance, it is possible to use a thermal oxide film as a gate insulating film in a case where the readout circuit 22 is formed after bonding the semiconductor substrate 21 to the first substrate 10, for example.

FIG. 31 illustrates a modification example of the cross-sectional configuration in the horizontal direction of the imaging element 1 according to the present modification example. FIG. 31 illustrates an example of the cross-sectional configuration of the imaging element 1 having the cross-sectional configuration in FIG. 30. Each of the gate wiring lines 49 extends in a direction parallel to the first direction V, for example. At this time, each of the gate wiring lines 49 is disposed at a position opposed to each of the blocks 21A of the semiconductor substrate 21, for example.

In the present modification example, the through wiring line 48 is omitted, and the transfer gate TG is electrically coupled to the gate wiring line 49 that is provided in the interlayer insulating film 51 (specifically, the insulating layer 46) and extends in a direction parallel to the front surface of the first substrate 10. Accordingly, a plurality of gate wiring lines 49 is disposed between two through wiring lines 54 that are coupled to the readout circuits 22 different from each other and are adjacent to each other in the second direction H. As a result, it is possible to reduce, by the plurality of gate wiring lines 49, density of electric lines of force generated between two through wiring lines 54 that are coupled to the readout circuits 22 different from each other and are adjacent to each other in the second direction H. As a result, it is possible to suppress signal crosstalk between the sensor pixels 12 adjacent to each other, and it is possible to suppress reduction in resolution on a regenerated image and deterioration in image quality caused by color mixture.

Modification Example I

Figure 32:
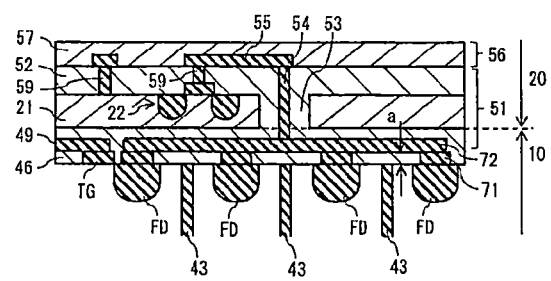
FIG. 32 is a diagram illustrating an example of a cross-sectional configuration in the vertical direction of the imaging element in FIG. 1.

FIG. 32 illustrates a modification example of the cross-sectional configuration in the vertical direction of the imaging element 1 according to the modification example H. FIG. 32 illustrates a modification example of the cross-sectional configuration in FIG. 30.

In the present modification example, the transfer gate TG is electrically coupled to the gate wiring line 49 provided in the interlayer insulating film 51 (specifically, the insulating layer 46). Further, in the present modification example, four floating diffusions FD sharing the readout circuit 22 are electrically coupled to a coupling section 71 and a coupling wiring line 72 that are provided in the interlayer insulating film 51 (specifically, the insulating layer 46). The coupling wiring line 72 is electrically coupled to the through wiring line 54. That is, in the present modification example, the through wiring line 54 is not provided for each of the sensor pixels 12, and one through wiring line 54 is provided for every four sensor pixels 12 sharing the readout circuit 22 (the coupling wiring line 72). It should be noted that, in FIG. 32, the coupling section 71 and the coupling wiring line 72 may be integrally formed.

Figure 33:
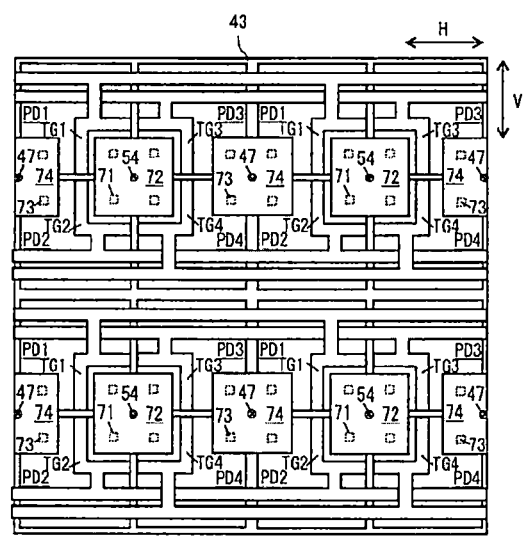
FIG. 33 is a diagram illustrating an example of across-sectional configuration in the horizontal direction of the imaging element in FIG. 1.
Figure 34:
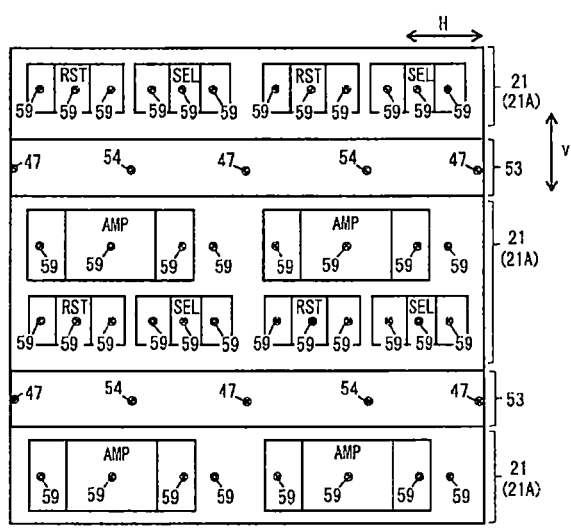
FIG. 34 is a diagram illustrating an example of across-sectional configuration in the horizontal direction of the imaging element in FIG. 1.

FIGS. 33 and 34 each illustrate an example of the cross-sectional configuration in the horizontal direction of the imaging element 1 according to the present modification example. FIGS. 33 and 34 each illustrate an example of the cross-sectional configuration of the imaging element 1 having the cross-sectional configuration in FIG. 32.

Figure 35:
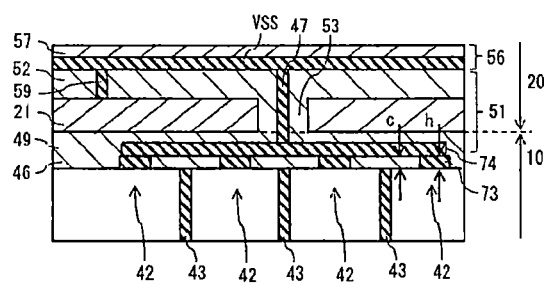
FIG. 35 is a diagram illustrating an example of a cross-sectional configuration in the vertical direction of the imaging element in FIG. 1.

In the present modification example, as described above, one through wiring line 54 is provided for every four floating diffusions FD sharing the readout circuit 22. Further, in the present modification example, the through wiring line 47 is also omitted similarly to the through wiring line 54. Specifically, instead of the four through wiring lines 47 adjacent to each other, for example, as illustrated in FIG. 35, four coupling sections 73 provided in the interlayer insulating film 51 (specifically, the insulating layer 46) are electrically coupled to the respective p-well layers 42 of the semiconductor substrate 11 of the respective sensor pixels 12. These four coupling sections 73 are electrically coupled to a coupling wiring line 74 provided in the interlayer insulating film 51 (specifically, the insulating layer 46). The coupling wiring line 74 is electrically coupled to the through wiring line 47 and the power source line VSS. That is, in the present modification example, the through wiring line 47 is not provided for each of the sensor pixels 12, and one through wiring line 47 is provided for every four sensor pixels 12 sharing the coupling wiring line 74.

The four sensor pixels 12 sharing the coupling wiring line 74 do not exactly coincide with the four sensor pixels 12 sharing the readout circuit 22 (the coupling wiring line 72). Here, in the plurality of sensor pixels 12 arranged in a matrix, four sensor pixels 12 corresponding to a region obtained by shifting a unit region corresponding to four sensor pixels 12 sharing one floating diffusion FD in the first direction V by one sensor pixel 12 are referred to as four sensor pixels 12A for the sake of convenience. At this time, in the present modification example, the first substrate 10 includes the through wiring line 47 shared by every four sensor pixels 12A. Accordingly, in the present modification example, one through wiring line 47 is provided for every four sensor pixels 12A.

In addition, two readout circuits 22 adjacent to each other in the first direction V are referred to as a first readout circuit 22A and a second readout circuit 22B for the sake of convenience. Two sensor pixels 12 adjacent to the second readout circuit 22B of four sensor pixels 12 sharing the first readout circuit 22A, and two sensor pixels 12 adjacent to the first readout circuit 22A of four sensor pixels 12 sharing the second readout circuit 22B shares one coupling wiring line 74. That is, four sensor pixels 12 sharing the coupling wiring line 74 and four sensor pixels 12 sharing the readout circuit 22 (the coupling wiring line 72) are shifted from each other by one sensor pixel 12 in the first direction V.

Accordingly, for example, as illustrated in FIG. 34, it is possible to dispose the through wiring lines 54 and 47 in one column in the insulating layer 53 extending in the first direction V. At this time, it is possible to decrease a width in the second direction H of the insulating layer 53, as compared with a case where the through wiring lines 54, 47, and 48 are disposed side by side in two columns. Further, it is possible to increase a width in the second direction H of each of the blocks 21A of the semiconductor substrate 21 extending in the first direction V by an amount corresponding to a decrease in width in the second direction H of the insulating layer 53. In a case where each of the blocks 21A of the semiconductor substrate 21 is increased, it is also possible to increase the size of the readout circuit 22 in each of the blocks 21A. This prevents an increase in the chip size and impairment of reduction in area per pixel even in a case where the junction between the pad electrodes 58 and 64 is used for electrical coupling between the second substrate 20 and the third substrate 30. As a result, it is possible to provide the imaging element 1 having a three-layer configuration that has a substantially same chip size as before without impairing reduction in area per pixel.

Figure 36:
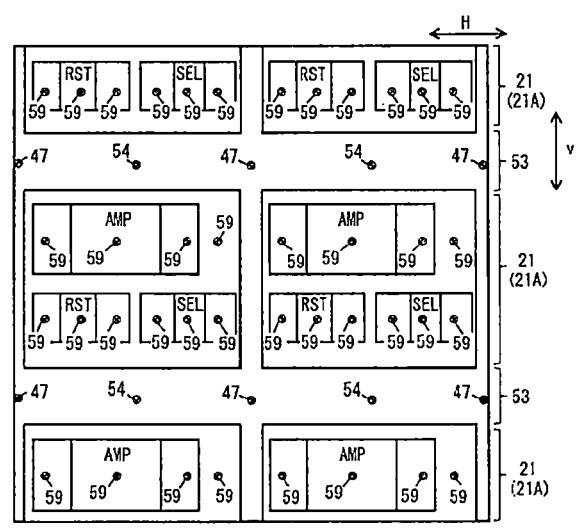
FIG. 36 is a diagram illustrating an example of across-sectional configuration in the horizontal direction of the imaging element in FIG. 1.

FIG. 36 illustrates an example of the cross-sectional configuration in the horizontal direction of the imaging element 1 according to the present modification example. FIG. 36 illustrates a modification example of the cross-sectional configuration in FIG. 34. Even in the imaging element 1 illustrated in FIG. 36, one through wiring line 54 is provided for every four sensor pixels 12 sharing the readout circuit 22 (the coupling wiring line 72), and one through wiring line 47 is provided for every four sensor pixels 12 sharing the coupling wiring line 74.

This makes it possible to dispose the through wiring lines 54 and 47 in one column in a portion extending in the first direction V of the insulating layer 53, for example, as illustrated in FIG. 36. At this time, it is possible to decrease a width in the second direction H of a portion extending in the first direction V of the insulating layer 53, as compared with a case where the through wiring lines 54, 47, and 48 are disposed side by side in two columns. Further, it is possible to increase the width in the second direction H of each of the blocks 21A of the semiconductor substrate 21 by an amount corresponding to a decrease in the width in the second direction H of the portion extending in the first direction V of the insulating layer 53. In a case where each of the blocks 21A of the semiconductor substrate 21 is increased, it is possible to increase the size of the readout circuit 22 in each of the blocks 21A. This prevents an increase in the chip size and impairment of reduction in area per pixel even in a case where the junction between the pad electrodes 58 and 64 is used for electrical coupling between the second substrate 20 and the third substrate 30. As a result, it is possible to provide the imaging element 1 having a three-layer configuration that has a substantially same chip size as before without impairing reduction in area per pixel.

Figure 37:
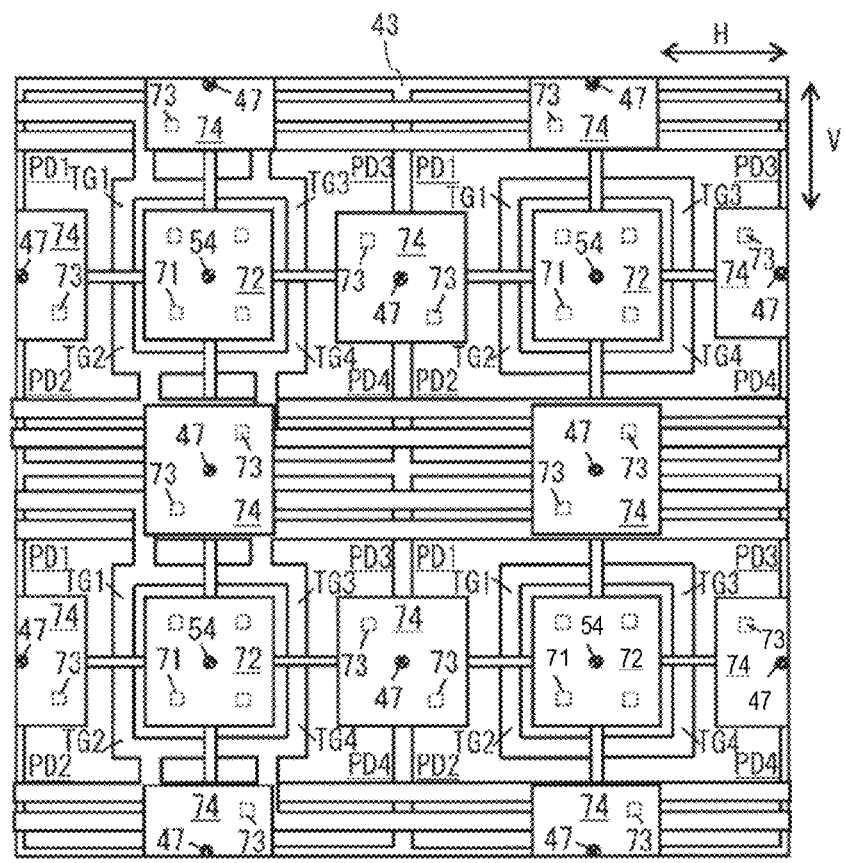
FIG. 37 is a diagram illustrating an example of across-sectional configuration in the horizontal direction of the imaging element in FIG. 1.
Figure 38:
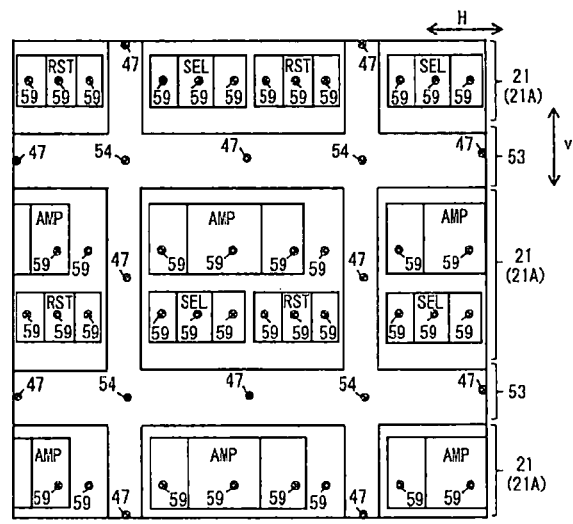
FIG. 38 is a diagram illustrating an example of across-sectional configuration in the horizontal direction of the imaging element in FIG. 1.

FIGS. 37 and 38 each illustrate an example of the cross-sectional configuration in the horizontal direction of the imaging element 1 according to the present modification example. FIGS. 37 and 38 illustrate examples of the cross-sectional configuration in the horizontal direction of the imaging element 1 having the cross-sectional configuration in FIG. 32, and illustrate modification examples of the cross-sectional configuration in FIGS. 33 and 34.

Figure 39:
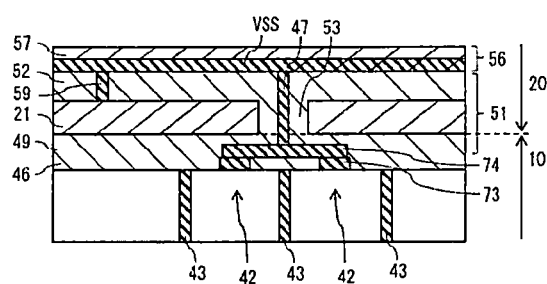
FIG. 39 is a diagram illustrating an example of a cross-sectional configuration in the vertical direction of the imaging element in FIG. 1.

In the present modification example, as described above, one through wiring line 54 is provided for every four floating diffusions FD sharing the readout circuit 22. Further, in the present modification example, the through wiring line 47 is also omitted similarly to the through wiring line 54. Specifically, instead of two through wiring lines 47 adjacent to each other, for example, as illustrated in FIG. 39, two coupling sections 73 provided in the interlayer insulating film 51 (specifically, the insulating layer 46) are electrically coupled to the respective p-well layers 42 of the semiconductor substrate 11 of the respective sensor pixels 12. These two coupling sections 73 are electrically coupled to the coupling wiring line 74 provided in the interlayer insulating film 51 (specifically, the insulating layer 46). The coupling wiring line 74 is electrically coupled to the through wiring line 47 and the power source line VSS. That is, in the present modification example, the through wiring line 47 is not provided for each of the sensor pixels 12, and one through wiring line 47 is provided for every two sensor pixels 12 sharing the coupling wiring line 74.

This makes it possible to dispose the through wiring lines 54 and 47 in one column in the portion extending in the first direction V of the insulating layer 53, for example, as illustrated in FIG. 38. Further, for example, as illustrated in FIG. 38, it is also possible to dispose the through wiring lines 54 and 47 in one column in the portion extending in the second direction H of the insulating layer 53. At this time, it is possible to decrease the width in the second direction H of the portion extending in the first direction V of the insulating layer 53, and it is possible to decrease the width in the first direction V of the portion extending in the second direction H of the insulating layer 53, as compared with a case where the through wiring lines 54, 47, and 48 are disposed in two columns. Further, it is possible to increase the width in the first direction V of each of the blocks 21A of the semiconductor substrate 21 by an amount corresponding to a decrease in the width in the second direction H of the portion extending in the first direction of the insulating layer 53, and it is possible to increase the width in the first direction V of each of the blocks 21A of the semiconductor substrate 21 by an amount corresponding to a decrease in the width in the first direction V of the portion extending in the second direction H of the insulating layer 53. In a case where each of the blocks 21A of the semiconductor substrate 21 is increased, it is also possible to increase the size of the readout circuit 22 in each of the blocks 21A. This prevents an increase in the chip size and impairment of reduction in area per pixel even in a case where the junction between the pad electrodes 58 and 64 is used for electrical coupling between the second substrate 20 and the third substrate 30. As a result, it is possible to provide the imaging element 1 having a three-layer configuration that has a substantially same chip size as before without impairing reduction in area per pixel.

Modification Example J

FIGS. 40A to 40F each illustrate a modification example of a manufacturing process of the imaging element 1 according to the embodiment and the modification examples thereof described above.

Figure 40A:
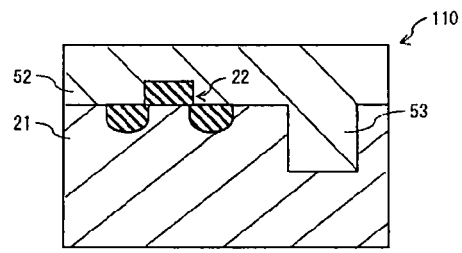
FIG. 40A is a diagram illustrating a modification example of a manufacturing process of the imaging element in FIG. 1.
Figure 40B:
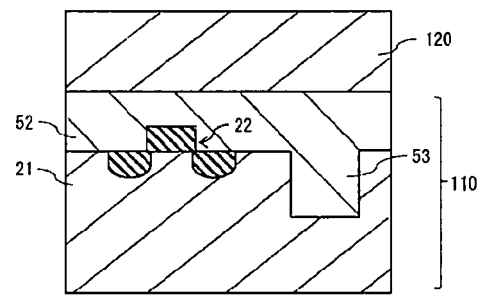
FIG. 40B is a diagram illustrating an example of a manufacturing process following FIG. 40A.
Figure 40C:
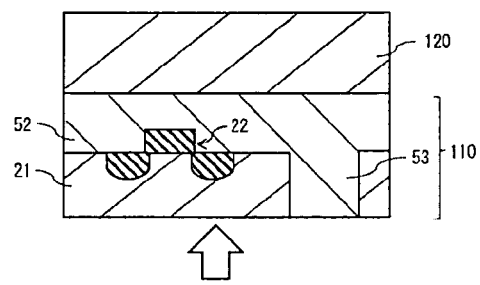
FIG. 40C is a diagram illustrating an example of a manufacturing process following FIG. 40B.
Figure 40D:
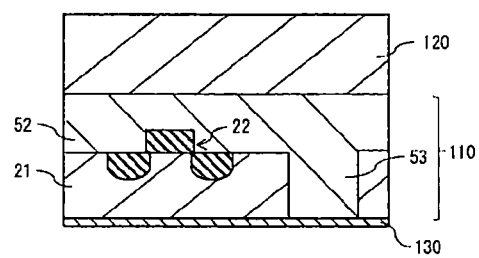
FIG. 40D is a diagram illustrating an example of a manufacturing process following FIG. 40C.

First, the readout circuit 22 including the amplification transistor AMP and the like is formed in the semiconductor substrate 21 (FIG. 40A). Next, a recess is formed at a predetermined position of the front surface of the semiconductor substrate 21, and the insulating layer 53 is formed to be embedded in the recess (FIG. 40A). Next, the insulating layer 52 is formed on the semiconductor substrate 21 (FIG. 40A). Thus, a substrate 110 is formed. Next, a support substrate 120 is bonded to the substrate 110 to make in contact with the insulating layer 52 (FIG. 40B). Subsequently, the back surface of the semiconductor substrate 21 is polished to reduce the thickness of the semiconductor substrate 21 (FIG. 40C). At this time, the back surface of the semiconductor substrate 21 is polished until reaching the recess of the semiconductor substrate 21. Thereafter, a joining layer 130 is formed on the polished surface (FIG. 40D).

Figure 40E:
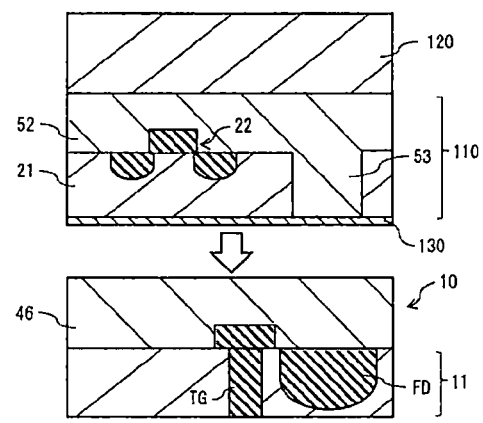
FIG. 40E is a diagram illustrating an example of a manufacturing process following FIG. 40D.
Figure 40F:
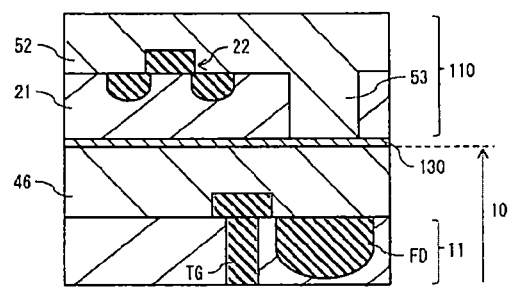
FIG. 40F is a diagram illustrating an example of a manufacturing process following FIG. 40E.

Next, the substrate 110 is bonded to the first substrate 10 in such a fashion that the joining layer 130 is opposed to the front surface side of the semiconductor substrate 11 of the first substrate 10 (FIG. 40E). Subsequently, the support substrate 120 is peeled from the substrate 110 in a state in which the substrate 110 is bonded to the first substrate 10 (FIG. 40F). Thereafter, the procedure described above in FIGS. 16D to 16F is performed. Even in such a manner, it is also possible to manufacture the imaging element 1.

As described above, in the present modification example, after the readout circuit 22 including the amplification transistor AMP and the like is formed in the semiconductor substrate 21, the semiconductor substrate 21 is bonded to the first substrate 10. Even in such a case, it is possible to achieve the configuration of the imaging element 1 according to the embodiment and the modification examples thereof described above.

Modification Example K

FIG. 41 illustrates an example of the cross-sectional configuration in the horizontal direction of the imaging element 1 according to the embodiment and the modification examples thereof described above. FIG. 41 illustrates a modification example of the cross-sectional configuration in FIG. 10.

In the present modification example, the first substrate 10 includes the photodiode PD and the transfer transistor TR for each of the sensor pixels 12, and the floating diffusion FD is shared by every four sensor pixels 12. Accordingly, in the present modification example, one through wiring line 5 is provided for every four sensor pixels 12.

In the plurality of sensor pixels 12 arranged in a matrix, four sensor pixels 12 corresponding to a region obtained by shifting a unit region corresponding to four sensor pixels 12 sharing one floating diffusion FD in the first direction V by one sensor pixel 12 are referred to as four sensor pixels 12A for the sake of convenience. At this time, in the present modification example, the first substrate 10 includes the through wiring line 47 shared by every four sensor pixels 12A. Accordingly, in the present modification example, one through wiring line 47 is provided for every four sensor pixels 12A.

In the present modification example, the first substrate 10 includes the element separator 43 that separates the photodiodes PD and the transfer transistors TR for each of the sensor pixels 12. As viewed from the direction of the normal to the semiconductor substrate 11, the element separator 43 does not completely surround the sensor pixel 12, and has gaps (unformed regions) in the vicinity of the floating diffusion FD (the through wiring line 54) and in the vicinity of the through wiring line 47. Then, the gaps allow for sharing of one through wiring line 54 by the four sensor pixels 12, and sharing of one through wiring line 47 by the four sensor pixels 12A. In the present modification example, the second substrate 20 includes the readout circuit 22 for every four sensor pixels 12 sharing the floating diffusion FD.

FIG. 42 illustrates an example of the cross-sectional configuration in the horizontal direction of the imaging element 1 according to the present modification example. FIG. 42 illustrates a modification example of the cross-sectional configuration in FIG. 28. In the present modification example, the first substrate 10 includes the photodiode PD and the transfer transistors TRs for each of the sensor pixels 12, and the floating diffusion FD is shared by every four sensor pixels 12. Further, the first substrate 10 includes the element separator 43 that separates the photodiodes PD and the transfer transistors TR for each of the sensor pixels 12.

FIG. 43 illustrates an example of the cross-sectional configuration in the horizontal direction of the imaging element 1 according to the present modification example. FIG. 43 illustrates a modification example of the cross-sectional configuration in FIG. 29. In the present modification example, the first substrate 10 includes the photodiode PD and the transfer transistor TR for each of the sensor pixels 12, and the floating diffusion FD is shared by every four sensor pixels 12. Further, the first substrate 10 includes the element separator 43 that separates the photodiodes PD and the transfer transistors TR for each of the sensor pixels 12.

Modification Example L

FIG. 44 illustrates an example of the cross-sectional configuration in the vertical direction of the imaging element 1 according to the embodiment and the modification examples thereof described above. FIG. 44 illustrates an enlarged view of the coupling portion between the first substrate 10 and the second substrate 20 in the imaging element 1 according to the embodiment and the modification examples thereof described above.

In two sensor pixels 12 that are coupled to the readout circuits 22 different from each other and are adjacent to each other, two transfer gates TG are provided in a gap between the floating diffusion FD of one of the two sensor pixels 12 and the floating diffusion FD of the other sensor pixel 12. At this time, a relationship between t1 and t2 preferably satisfies t2>t1>t2/3.5, where t1 is a thickness of each of the transfer gates TG and t2 is a thickness of the insulating layer 46 in the gap between the floating diffusion FD of the one sensor pixel 12 and the floating diffusion FD of the other sensor pixel 12.

Doing so makes it possible to reduce density of electric lines of force generated between two through wiring lines 54 that are coupled to the readout circuits 22 different from each other and are adjacent to each other. As a result, it is possible to suppress signal crosstalk between the sensor pixels 12 adjacent to each other, and it is possible to suppress reduction in resolution on a regenerated image and deterioration in image quality caused by color mixture.

In the interlayer insulating film 51 illustrated in FIG. 44, the insulating layer 53 may be formed using a material having a lower relative dielectric constant than relative dielectric constants of the insulating layers 46 and 52. At this time, the insulating layer 53 may be formed using, for example, SiOC (a relative dielectric constant of about 2.9), and the insulating layers 46 and 52 may be formed using $SiO_2$ (a relative dielectric constant of about 4.1). Alternatively, in the interlayer insulating film 51 illustrated in FIG. 44, the insulating layers 53 and 52 may be formed using a material having a lower relative dielectric constant than the relative dielectric constant of insulating layer 46. At this time, the insulating layers 53 and 52 may be formed using, for example, SiOC (a relative dielectric constant of about 2.9), and the insulating layer 46 may be formed using $SiO_2$ (a relative dielectric constant of about 4.1). Alternatively, in the interlayer insulating film 51 illustrated in FIG. 44, the insulating layers 46 and 53 may be formed using a material having a lower relative dielectric constant than the relative dielectric constant of the insulating layer 52. At this time, the insulating layers 46 and 53 may be formed using, for example, SiOC (a relative dielectric constant of about 2.9), and the insulating layer 52 may be formed using $SiO_2$ (a relative dielectric constant of about 4.1). Alternatively, in the interlayer insulating film 51 illustrated in FIG. 44, the insulating layer 46 may be formed using a material having a lower relative dielectric constant than the relative dielectric constants of the insulating layers 52 and 53. At this time, the insulating layer 46 may be formed using, for example, SiOC (a relative dielectric constant of about 2.9), and the insulating layers 52 and 53 may be formed using $SiO_2$ (a relative dielectric constant of about 4.1). Alternatively, in the interlayer insulating film 51 illustrated in FIG. 44, the insulating layers 46, 52, and 53 may be formed using a material having a low relative dielectric constant. At this time, the insulating layers 46, 52, and 53 may be formed using, for example, SiOC (a relative dielectric constant of about 2.9). Alternatively, in the interlayer insulating film 51 illustrated in FIG. 44, the insulating layer 52 may be formed using a material having a lower relative dielectric constant than relative dielectric constants of the insulating layers 46 and 52. At this time, the insulating layer 52 may be formed using, for example, SiOC (a relative dielectric constant of about 2.9), and the insulating layers 46 and 52 may be formed using $SiO_2$ (a relative dielectric constant of about 4.1).

In such a case, it is possible to reduce a capacitance generated between the two through wiring lines 54 that are coupled to the readout circuits 22 different from each other and are adjacent to each other. As a result, it is possible to suppress signal crosstalk between sensor pixels 12 adjacent to each other, and it is possible to suppress reduction in resolution on a regenerated image and deterioration in image quality caused by color mixture.

In the present modification example, the insulating layer 53 provided to cover the side surface of the through wiring line 54 may include a material having a lower relative dielectric constant than the relative dielectric constants of the insulating layer 46 and the insulating layer 52, for example. The insulating layer 46 and the insulating layer 52 are formed using, for example, $SiO_2$ (a relative dielectric constant of about 4.1). The insulating layer 46 and the insulating layer 52 may be formed using a silicon oxide film including, for example, TEOS (Tetraethylorthosilicate), NSG, HDP (High Density Plasma), BSG (Boro Silicate Glass), PSG (Phospho Silicate Glass), BPSG (Boro Phospho Silicate Glass), or the like. The insulating layer 53 is formed using, for example, SiOC (a relative dielectric constant of about 2.9). In such a case, it is possible to reduce a capacitance generated between two through wiring lines 54 that are coupled to the readout circuits 22 different from each other and are adjacent to each other. As a result, it is possible to improve conversion efficiency.

In the present modification example, the insulating layer 46 may include a stacked body of at least two insulating layers. The insulating layer 46 may include an insulating layer 46A in contact with the semiconductor substrate 11 and an insulating layer 46B in contact with the insulating layer 46A and the semiconductor substrate 21, for example, as illustrated in FIG. 45. Here, the insulating layer 46A is an uppermost layer of the insulating layer 46, and includes, for example, a material having a higher relative dielectric constant than a relative dielectric constant at any other position of the interlayer insulating film 51. At this time, the insulating layer 46A may be formed using, for example, SiN (a relative dielectric constant of about 7.0). The insulating layer 46B and the insulating layer 52 may be formed using, for example, SiO$_2$ (a relative dielectric constant of about 4.1). The insulating layer 46B and the insulating layer 52 may be formed using a silicon oxide film including, for example, TEOS, NSG, HDP, BSG, PSG, BPSG, or the like. The insulating layer 53 may be formed using, for example. SiOC (a relative dielectric constant of about 2.9).

Alternatively, in the interlayer insulating film 51 illustrated in FIG. 45, the insulating layer 53 may be formed using, for example, SiOC (a relative dielectric constant of about 2.9), and the insulating layers 46B and 52 may be formed using SiO$_2$ (a relative dielectric constant of about 4.1). Alternatively, in the interlayer insulating film 51 illustrated in FIG. 45, the insulating layers 53 and 52 may be formed using, for example, SiOC (a relative dielectric constant of about 2.9), and the insulating layer 46B may be formed using SiO$_2$ (a relative dielectric constant of about 4.1). Alternatively, in the interlayer insulating film 51 illustrated in FIG. 45, the insulating layers 46B and 53 may be formed using a material having a lower relative dielectric constant than the relative dielectric constant of the insulating layer 52. At this time, the insulating layers 46B and 53 may be formed using, for example, SiOC (a relative dielectric constant of about 2.9), and the insulating layer 52 may be formed using SiO$_2$ (a relative dielectric constant of about 4.1). Alternatively, in the interlayer insulating film 51 illustrated in FIG. 45, the insulating layer 46B may be formed using a material having a lower relative dielectric constant than the relative dielectric constants of the insulating layers 52 and 53. At this time, the insulating layer 46B may be formed using, for example, SiOC (a relative dielectric constant of about 2.9), and the insulating layers 52 and 53 may be formed using SiO$_2$ (a relative dielectric constant of about 4.1). Alternatively, in the interlayer insulating film 51 illustrated in FIG. 45, the insulating layers 46B, 52, and 53 may be formed using a material having a low relative dielectric constant. At this time, the insulating layers 46B, 52, and 53 may be formed using, for example, SiOC (a relative dielectric constant of about 2.9).

In such a case, it is possible to reduce a capacitance generated between two through wiring lines 54 that are coupled to the readout circuits 22 different from each other and are adjacent to each other. As a result, it is possible to suppress signal crosstalk between the sensor pixels 12 adjacent to each other, and it is possible to suppress reduction in resolution on a regenerated image and deterioration in image quality caused by color mixture.

It should be noted that, in some cases, the insulating layers 46B, 52, and 53 may be formed using a common material. At this time, the insulating layers 46B, 52, and 53 may be formed using, for example, SiO$_2$ (a relative dielectric constant of about 4.1).

Modification Example M

FIGS. 46 and 47 each illustrate a modification example of the sensor pixel 12 and the readout circuit 22 in the imaging element 1 according to the embodiment and the modification examples thereof described above. FIG. 46 illustrates a modification example of the sensor pixel 12 and the readout circuit 22 that are illustrated in FIG. 2. FIG. 47 illustrates a modification example of the sensor pixel 12 and the readout circuit 22 that are illustrated in FIG. 3. In the present modification example, the second substrate 20 includes the readout circuit 22 for every two sensor pixels 12. Even with such a configuration, the imaging element 1 has the effects described in the embodiment and the modification examples thereof described above.

Modification Example N

FIGS. 48 and 49 each illustrate a modification example of the sensor pixel 12 and the readout circuit 22 in the imaging element 1 according to the embodiment and the modification examples thereof described above. FIG. 48 illustrates a modification example of the sensor pixel 12 and the readout circuit 22 that are illustrated in FIG. 2. FIG. 49 illustrates a modification example of the sensor pixel 12 and the readout circuit 22 that are illustrated in FIG. 3. In the present modification example, the second substrate 20 includes the readout circuit 22 for each of the sensor pixels 12. Even with such a configuration, the imaging element 1 has the effects described in the embodiment and the modification examples thereof described above.

It should be noted that, in the imaging element 1 according to the embodiment and the modification examples thereof described above, the second substrate 20 may include the readout circuit 22 for every three sensor pixels 12. Alternatively, in the imaging element 1 according to the embodiment and the modification examples thereof described above, the second substrate 20 may include the readout circuit 22 for every eight sensor pixels 12. Alternatively, in the imaging element 1 according to the embodiment and the modification examples thereof described above, the second substrate 20 may include the readout circuit 22 for every five or more sensor pixels 12. Even with such a configuration, the imaging element 1 has the effects described in the embodiment and the modification examples thereof described above.

Modification Example O

FIG. 50 illustrates a cross-sectional configuration example of a portion of the imaging element 1 according to the embodiment and the modification examples thereof described above. In the present modification example, a transistor (for example, the transfer transistor TR) in the first substrate 10 and a transistor (for example, the amplification transistor AMP) in the second substrate 20 are formed under design conditions different from each other. Specifically, a film thickness of a gate insulating film 81 of the transistor in the first substrate 10 is different from a film thickness of a gate insulating film 83 of the transistor in the second substrate 20. In addition, a sidewall width of the transistor in the first substrate 10 is different from a sidewall width of the transistor in the second substrate 20. In addition, a source/drain concentration (for example, a concentration of the floating diffusion FD) of the transistor in the first substrate 10 is different from a source/drain concentration of the transistor in the second substrate 20. In addition, a film thickness of a layer 82 covering the transistor in the first substrate 10 is different from a film thickness of a layer 84 covering the transistor in the second substrate 20.

That is, in the present modification example, the design condition is allowed to differ between the transistor in the sensor pixel 12 and the transistor in the readout circuit 22.

This makes it possible to set a suitable design condition for the transistor in the sensor pixel 12, and further set a suitable design condition for the transistor in the readout circuit 22.

Modification Example P

Figure 51:
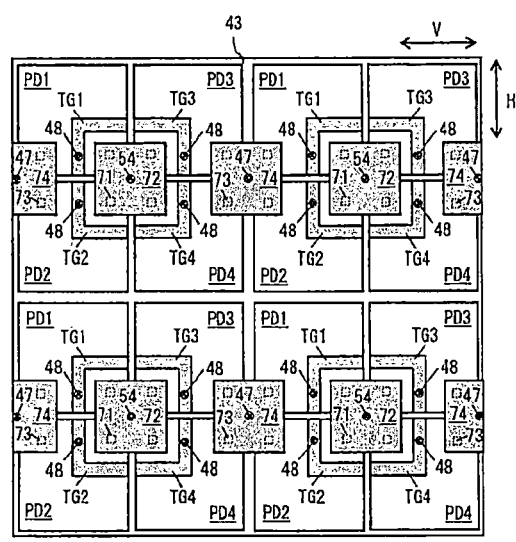
FIG. 51 is a diagram illustrating an example of a cross-sectional configuration in the horizontal direction of the imaging element in FIG. 1.
Figure 52:
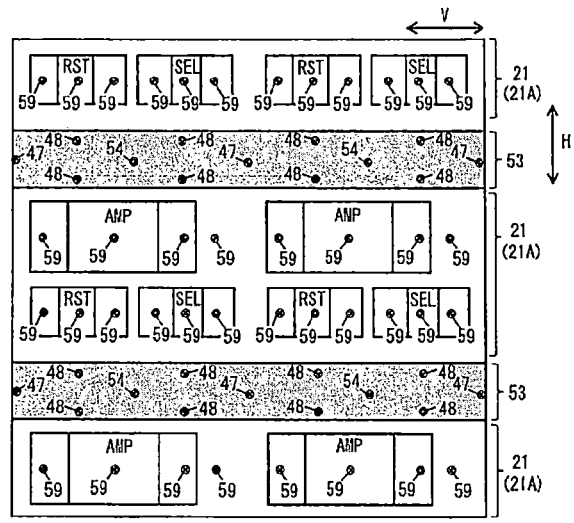
FIG. 52 is a diagram illustrating an example of cross-sectional configuration in the horizontal direction of the imaging element in FIG. 1.

FIGS. 51 and 52 each illustrate a modification example of the cross-sectional configuration in the horizontal direction of the imaging element 1 according to the modification example I described above. FIG. 51 illustrates a modification example of the cross-sectional configuration in FIG. 33. FIG. 52 illustrates a modification example of the cross-sectional configuration in FIG. 34.

In the present modification example, the gate wiring line 49 is omitted, and one of the plurality of through wiring lines 48 is provided for each of the transfer gates TG. Each of the through wiring lines 48 is electrically coupled to a corresponding transfer gate TG and is electrically coupled to the pixel drive line 23. As illustrated in FIGS. 51 and 52, the plurality of through wiring lines 54, the plurality of through wiring lines 48, and the plurality of through wiring lines 47 are disposed side by side in a band-like fashion in the first direction V (a rightward-leftward direction in FIGS. 51 and 52). The plurality of through wiring lines 54 and the plurality of through wiring lines 47 are disposed side by side in a column in the first direction V (the rightward-leftward direction in FIGS. 51 and 52), and the plurality of through wiring lines 48 is disposed side by side in two columns in the first direction V (the rightward-leftward direction in FIG. 51 and FIG. 52).

Figure 53:
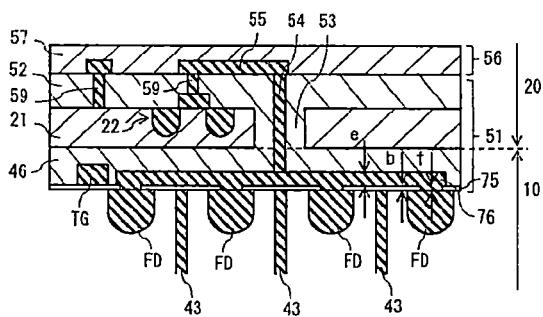
FIG. 53 is a diagram illustrating an example of cross-sectional configuration in the vertical direction of the imaging element in FIG. 1.

FIG. 53 illustrates an example of the cross-sectional configuration in the vertical direction of the imaging element 1 according to the present modification example. In the present modification example, one coupling wiring line 76 is provided for every four floating diffusions FD sharing the readout circuit 22. In the modification example I illustrated in FIG. 32, as an example of the embodiment, a portion extending in a direction horizontal to a substrate of the coupling wiring line 72 is formed above the transfer gate TG (at a position close to the second substrate 20). An example of a manufacturing method adopted to form this configuration may be forming the coupling wiring line 72 after forming the transfer gate TG and then forming an insulating film that reaches a height of the transfer gate TG. In contrast, in the modification example P illustrated in FIG. 53, as an example of the embodiment, a bottom surface (a surface on the first substrate 10 side) of a portion extending in a direction horizontal to the substrate of the coupling wiring line 76 is formed below a top surface (a surface on the second substrate 20 side) of the transfer gate TG (at a position close to the first substrate 10). As an example, the portion extending in the direction horizontal to the substrate of the coupling wiring line 76 may be formed above a gate insulating film of a transistor of the readout circuit 22. Alternatively, an insulating film having a smaller film thickness than the height of the transfer gate TG may be formed on the top surface and a side surface of the transfer gate TG and the top surface of the first substrate 10 in which the transfer gate TG is not disposed, and the portion extending in the direction horizontal to the substrate of the coupling wiring line 76 may be disposed on the insulating film.

The coupling wiring line 76 is coupled to four floating diffusions FD via the gate insulating film (for example, a gate insulating film 75 of the transfer transistor TR) of the transistor of the readout circuit 22 or an opening provided in the insulating film having a smaller film thickness than the height of the transfer gate TG. The coupling wiring line 76 is formed in contact with a front surface of the gate insulating film (for example, the gate insulating film 75 of the transfer transistor TR) of the transistor of the readout circuit 22. As an electrode material used for the coupling wiring line 76, a material having high heat resistance is preferably used. Examples of the material having high heat resistance include polysilicon. The coupling wiring line 76 may include, for example, a metal such as tungsten or copper.

In the present modification example, providing the coupling wiring line 76 makes it possible to decrease an occupied area of the insulating layer 53 through which the through wiring line 54 penetrates. Accordingly, it is possible to increase an area of the semiconductor substrate 21 (the block 21A) by an amount corresponding to a decrease in the occupied area of the insulating layer 53, which makes it possible to increase an area of the readout circuit 22 (specifically, the amplification transistor AMP). As a result, it is possible to reduce random noise.

In a case where a length a in a direction perpendicular to the substrate of a coupling wiring line 71 illustrated in FIG. 32 is compared with a length b in the direction perpendicular to the substrate up to a common wiring line of the coupling wiring line 76 illustrated in FIG. 53, the length b is shorter than the length a. Similarly, in a case where a length c in the direction perpendicular to the substrate of a coupling wiring line 73 illustrated in FIG. 35 in the modification example I is compared with a length d in the direction perpendicular to the substrate up to a common wiring line of a coupling wiring line 77 to be described later in FIG. 54 in a modification example P, the length d is shorter than the length c. In addition, in a case where a thickness e of a portion that is included in the coupling wiring lines 76 and 77 and extends in a direction horizontal to the substrate (a height in the direction perpendicular to the substrate of the common wiring line) is compared with a thickness f (=b) of a portion extending in the direction perpendicular to the substrate, the thickness f is smaller than the thickness e.

Here, for example, a case of using ion implantation is considered for a manufacturing method for N-type-doping the coupling wiring line 76 coupled to the floating diffusion FD that is an N-type impurity region, and a manufacturing method for P-type-doping the coupling wiring line 77 coupled to the p-well layer 42. In a case where a length of a portion that penetrates through the insulating film and extends in the direction perpendicular to the substrate of the portions included in the coupling wiring lines 76 and 77 is long, to dope the entire coupling wiring lines 76 and 77 with a sufficiently high impurity concentration, there is a possibility that it is necessary to separately perform ion implantation into a portion that is included in the coupling wiring lines 76 and 77 and extends in the direction horizontal to the substrate and ion implantation into a portion that is included in the coupling wiring lines 76 and 77 and extends in the substrate. In contrast, in a case where the portion that penetrates through the insulating film and extends in the direction perpendicular to the substrate is short, there is a possibility that performing ion implantation into the portion extending in the direction horizontal to the substrate makes it possible to also dope the portion extending in the direction perpendicular to the substrate with a sufficiently high concentration. Accordingly, there is a possibility that it is possible to simplify the manufacturing method. In addition, there is a possibility that it is possible to uniformly perform doping in the portion extending in the direction perpendicular to the substrate without causing a difference in impurity doping concentration in the direction perpendicular to the substrate. Further, there is a possibility that it is possible to perform doping in the portion extending in the direction perpendicular to the substrate and the portion extending in the direction horizontal to the substrate with the same concentration.

Figure 54:
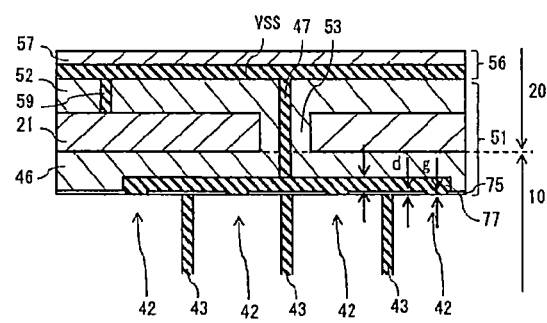
FIG. 54 is a diagram illustrating an example of a cross-sectional configuration in the vertical direction of the imaging element in FIG. 1.

FIG. 54 illustrates an example of the cross-sectional configuration in the vertical direction of the imaging element 1 according to the present modification example. In the present modification example, one coupling wiring line 77 is provided for the well layers of every four sensor pixels 12 adjacent to each other. In the modification example P illustrated in FIG. 54, as an example of the embodiment, a bottom surface (a surface on the first substrate 10 side) of the coupling wiring line 77 is formed below the top surface (a surface on the second substrate 20 side) of the transfer gate TG illustrated in FIG. 53 (at a position close to the first substrate 10). As an example, a portion extending in the direction horizontal to the substrate of the coupling wiring line 77 may be formed above the gate insulating film of the transistor of the readout circuit 22. Alternatively, an insulating film having a smaller film thickness than the height of the transfer gate TG may be formed on the top surface and the side surface of the transfer gate TG and the top surface of the first substrate 10 in which the transfer gate TG is not disposed, and the portion extending in the direction horizontal to the substrate of the coupling wiring line 77 may be disposed on the insulating film.

The coupling wiring line 77 is coupled to four well layers 42 via the gate insulating film 75 of the transistor (for example, transfer transistor TR) of the readout circuit 22 or an opening provided in the insulating film having a smaller film thickness than the height of the transfer gate TG. The coupling wiring line 76 is formed in contact with the front surface of the gate insulating film (for example, the gate insulating film 75 of the transfer transistor TR) of the transistor of the readout circuit 22. As an electrode material used for the coupling wiring line 77, a material having high heat resistance is preferably used. Examples of the material having high heat resistance include polysilicon. The coupling wiring line 77 includes, for example, polysilicon doped with a P-type impurity. The coupling wiring line 77 may include, for example, a metal such as tungsten or copper.

In a case where a coupling section 73 and the coupling wiring line 74 illustrated in FIG. 35 of the modification example I are compared with the coupling wiring line 77 illustrated in FIG. 54 of the modification example P, a length g of a portion that penetrates through the insulating film and extends in the direction orthogonal to the substrates 10 and 20 in the coupling wiring line 77 is shorter than a length h of a portion that penetrates through the insulating film and extends in the direction orthogonal to the substrates 10 and 20 in the coupling section 73 and the coupling wiring line 74. In addition, in a case where a thickness i (a height in the direction perpendicular to the substrate) of a portion that is included in the coupling wiring line 77 and extends in the direction horizontal to the substrate is compared with a thickness g (a height in the direction perpendicular to the substrate) of a portion extending in the direction perpendicular to the substrate, the thickness g is smaller than the thickness i.

In the present modification example, providing the coupling wiring line 77 makes it possible to decrease the occupied area of the insulating layer 53 through which the through wiring line 47 penetrates. Accordingly, it is possible to increase the area of the semiconductor substrate 21 (the block 21A) by an amount corresponding to a decrease in the occupied area of the insulating layer 53, which makes it possible to increase the area of the readout circuit 22 (specifically, the amplification transistor AMP). As a result, it is possible to reduce random noise.

Figure 55:
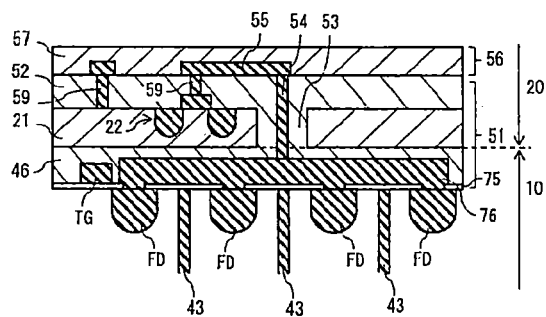
FIG. 55 is a diagram illustrating an example of cross-sectional configuration in the vertical direction of the imaging element in FIG. 1.
Figure 56:
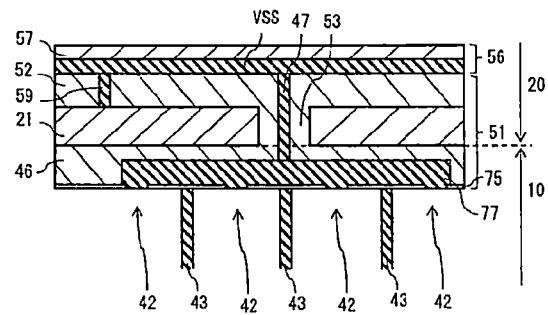
FIG. 56 is a diagram illustrating an example of cross-sectional configuration in the vertical direction of the imaging element in FIG. 1.

The thicknesses of the coupling wiring lines 76 and 77 may not necessarily be the same as the thickness of the gate electrode (for example, the transfer gate TG of the transfer transistor TR) of the transistor of the readout circuit 22. The thicknesses of the coupling wiring lines 76 and 77 are smaller than the thickness of the gate electrode (for example, the transfer gate TG of the transfer transistor TR) of the transistor of the readout circuit 22, for example. It should be noted that the thicknesses of the coupling wiring lines 76 and 77 may be substantially equal to or larger than the thickness of the gate electrode (for example, the transfer gate TG of the transfer transistor TR) of the transistor of the readout circuit 22, for example, as illustrated in FIGS. 55 and 56.

For example, there is a possibility that it is possible to decrease a coupling capacitance between the coupling wiring line 76 coupled to the floating diffusion FD and the transfer gate TG as the thicknesses of the coupling wiring lines 76 and 77 becomes smaller than the thickness of the transfer gate TG. Accordingly, in a case where a certain amount of electric charges is subjected to electric charge-to-voltage conversion in the floating diffusion FD, there is a possibility that a generated signal voltage is further increased.

In contrast, in a case where the coupling wiring lines 76 and 77 are doped with an impurity by ion implantation, a range of ion implantation is not a certain single range, but is rather a range distribution called a projection range, which spreads in a range direction. In consideration of spreading of an impurity in this range direction, in a case where the coupling wiring lines 76 and 77 are doped with an impurity by ion implantation, there is a possibility that the coupling wiring lines 76 and 77 are doped with an impurity with sufficient controllability as the thicknesses of the coupling wiring lines 76 and 77 are increased.

Figure 57:
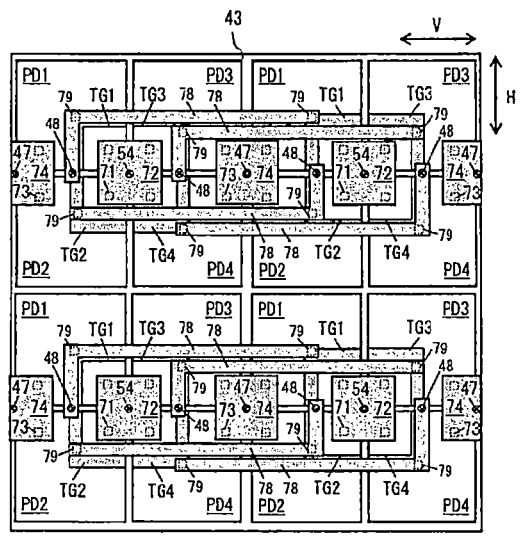
FIG. 57 is a diagram illustrating an example of cross-sectional configuration in the horizontal direction of the imaging element in FIG. 1.
Figure 58:
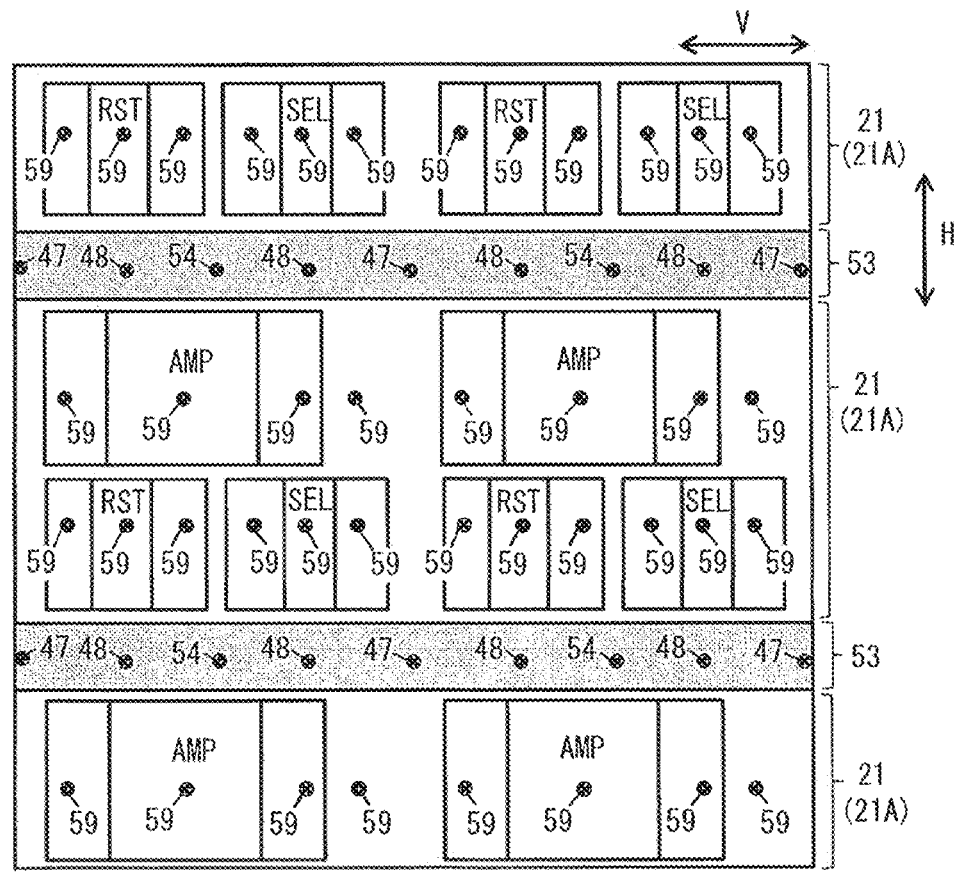
FIG. 58 is a diagram illustrating an example of a cross-sectional configuration in the horizontal direction of the imaging element in FIG. 1.
Figure 59:
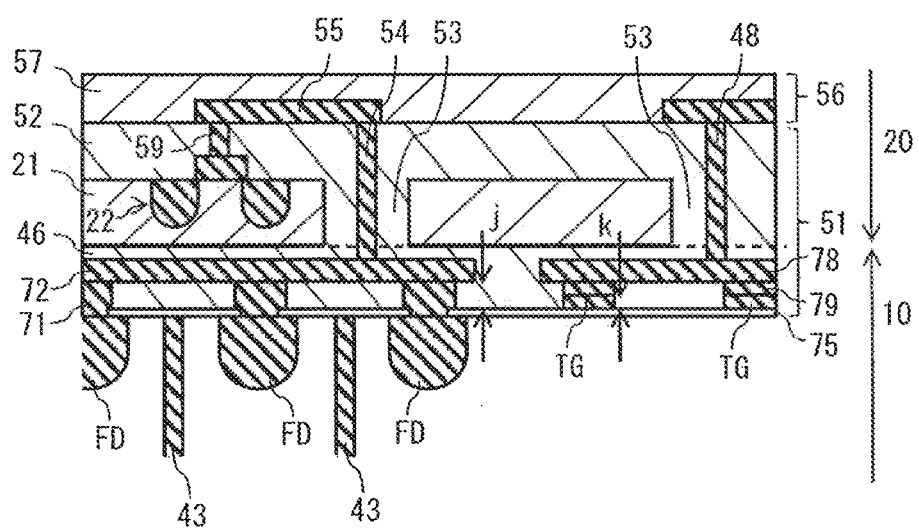
FIG. 59 is a diagram illustrating an example of cross-sectional configuration in the horizontal direction of the imaging element in FIG. 1.

It should be noted that, in the present modification example, for example, as illustrated in FIGS. 57, 58, and FIG. 59, one through wiring line 48 may be provided not for each of the transfer gates TG but for every plurality of transfer gates TG. In this case, a coupling section 79 and a coupling wiring line 78 that couple a plurality of transfer gates TG sharing the through wiring line 48 to each other may be provided. One of a plurality of coupling sections 79 is provided for each of the transfer gates TG, and each of the coupling sections 79 is coupled to the transfer gate TG and the coupling wiring line 78. One of a plurality of coupling wiring lines 78 is provided for every plurality of transfer gates TGs sharing the through wiring line 48. The coupling section 79 and the coupling wiring line 78 include, for example, polysilicon doped with an N-type impurity, and are coupled to the transfer gate TG. The coupling section 73 and the coupling wiring line 74 include, for example, polysilicon doped with an N-type impurity, and are coupled to the floating diffusion FD that is an N-type impurity region.

As described above, in a case where one through wiring line 48 is provided for every plurality of transfer gates TG, for example, as illustrated in FIG. 58, it is possible to decrease the occupied area of the insulating layer 53 through which the through wiring line 48 penetrates. As a result, it is possible to increase the area of the semiconductor substrate 21 (the block 21A) by an amount corresponding to a decrease in the occupied area of the insulating layer 53, which makes it possible to increase the area of the readout circuit 22 (specifically, the amplification transistor AMP). It should be noted that, in FIG. 59, the coupling section 71 and the coupling wiring line 72 may be integrally formed. In addition, the through wiring line 48 may be formed in the first substrate 10 and coupled to a wiring line formed in the insulating layer 46 to receive a drive signal of the transfer gate.

In addition, in the present modification example, a height j of the coupling section 71 is higher than a height k of the transfer gate TG. That is, an insulating film is formed up to above the top surface of the transfer gate TG, and the coupling wiring line 72 is formed in a state in which the front surface of the substrate is planarized by the insulating film. This makes it easier to process the coupling wiring line 72.

Figure 60:
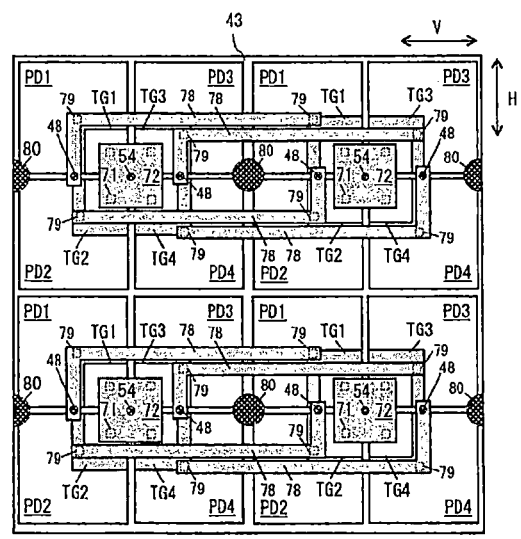
FIG. 60 is a diagram illustrating an example of cross-sectional configuration in the horizontal direction of the imaging element in FIG. 1.
Figure 61:
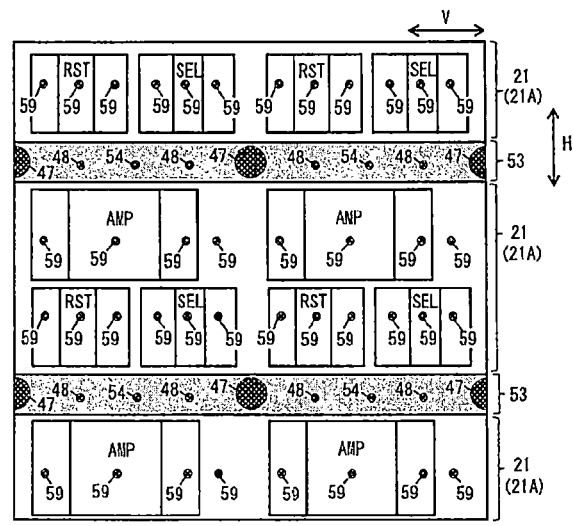
FIG. 61 is a diagram illustrating an example of cross-sectional configuration in the horizontal direction of the imaging element in FIG. 1.
Figure 62:
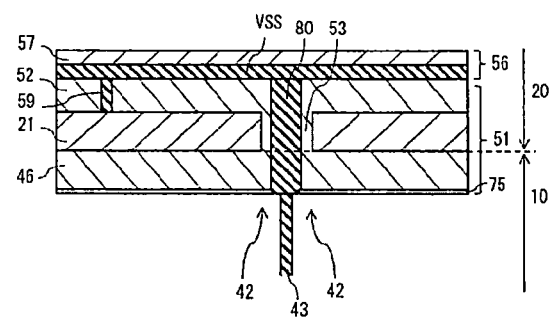
FIG. 62 is a diagram illustrating an example of a cross-sectional configuration in the vertical direction of the imaging element in FIG. 1.

In addition, in the present modification example, for example, as illustrated in FIGS. 60, 61, and 62, a through wiring line 80 extending over four sensor pixels 12 adjacent to each other may be provided instead of a group of the coupling section 73, the coupling wiring line 74, and the through wiring line 47. The through wiring line 80 is formed to penetrate through the through insulating layer 53, and is electrically coupled to the well layers 42 of the four sensor pixels 12 adjacent to each other and the power source line VSS. It should be noted that, although contact to p-well is not illustrated, as in the configurations in FIGS. 54 and 56, it is possible to use a configuration in which poly silicon is p-type doped.

In the present modification example, in a case where the through wiring line 80 is provided, it is possible to decrease the occupied area of the insulating layer 53 through which the through wiring line 80 penetrates. Accordingly, it is possible to increase the area of the semiconductor substrate 21 (the block 21A by an amount corresponding to a decrease in the occupied area of the insulating layer 53, which makes it possible to increase the area of the readout circuit 22 (specifically, the amplification transistor AMP). As a result, it is possible to reduce random noise.

In addition, in the present modification example, for example, as illustrated in FIG. 63, the coupling wiring line 76 may be provided in addition to providing the through wiring line 80. In such a case, it is possible to decrease the occupied area of the insulating layer 53 through which the through wiring lines 54 and 80 penetrate. Accordingly, it is possible to increase the area of the semiconductor substrate 21 (the block 21A) by an amount corresponding to a decrease in the occupied area of the insulating layer 53, which makes it possible to increase the area of the readout circuit 22 (specifically, the amplification transistor AMP). As a result, it is possible to reduce random noise.

Modification Example Q

Figure 64:
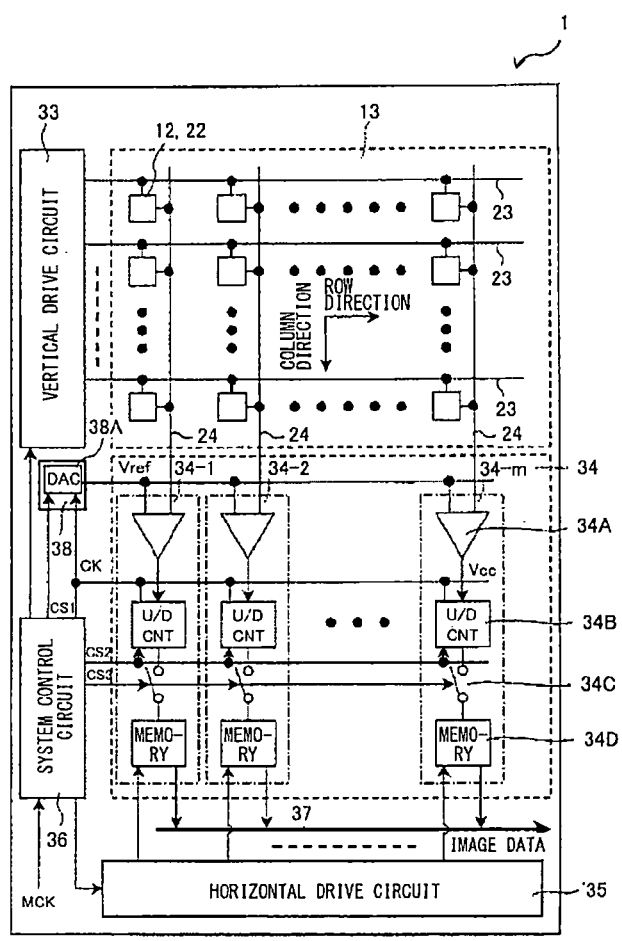
FIG. 64 is a diagram illustrating an example of a circuit configuration of a imaging element according to any of the embodiment and modification examples thereof described above.

FIG. 64 illustrates an example of a circuit configuration of the imaging element 1 according to the embodiment and the modification examples thereof described above. The imaging element 1 according to the present modification example is a CMOS image sensor including a column parallel ADC.

As illustrated in FIG. 64, the imaging element 1 according to the present modification example includes the vertical drive circuit 33, the column signal processing circuit 34, a reference voltage supply section 38, the horizontal drive circuit 35, a horizontal output line 37, and the system control circuit 36, in addition to the pixel region 13 configured by two-dimensionally arranging, in rows and columns (a matrix), the plurality of sensor pixels 12 each including a photoelectric converter.

In this system configuration, the system control circuit 36 generates a clock signal, a control signal, and the like serving as references of operations of the vertical drive circuit 33, the column signal processing circuit 34, the reference voltage supply section 38, the horizontal drive circuit 35, and the like on the basis of a master clock MCK, and supplies the clock signal, the control signal, and the like to the vertical drive circuit 33, the column signal processing circuit 34, the reference voltage supply section 38, the horizontal drive circuit 35, and the like.

In addition, the vertical drive circuit 33 is formed, together with the respective sensor pixels 12 in the pixel region 13, in the first substrate 10, and is also formed in the second substrate 20 in which the readout circuits 22 are formed. The column signal processing circuit 34, the reference voltage supply section 38, the horizontal drive circuit 35, the horizontal output line 37, and the system control circuit 36 are formed in the third substrate 30.

Although not illustrated here, as the sensor pixels 12, for example, it is possible to use sensor pixels having a configuration including the transfer transistor TR in addition to the photodiode PD. The transfer transistor TR transfers, to the floating diffusion FD, electric charges obtained by photoelectric conversion in the photodiode PD. In addition, although not illustrated here, as the readout circuits 22, for example, it is possible to use a readout circuit having a three-transistor configuration including the reset transistor RST that controls the potential of the floating diffusion FD, the amplification transistor AMP that outputs a signal corresponding to the potential of the floating diffusion FD, and the selection transistor SEL for pixel selection.

In the pixel region 13, the sensor pixels 12 are two-dimensionally arranged, and one of the pixel drive lines 23 is wired with each of rows of an m-row by n-column pixel arrangement, and one of the vertical signal lines 24 is wired with each of columns. The plurality of pixel drive lines 23 each have one end coupled to a corresponding one of output terminals, corresponding to the respective rows, of the vertical drive circuit 33. The vertical drive circuit 33 includes a shift register and the like, and performs control of a row address and row scanning of the pixel region 13 via the plurality of pixel drive lines 23.

The column signal processing circuit 34 includes, for example, ADCs (analog-digital conversion circuits) 34-1 to 34-m, one of which is provided for each of pixel columns of the pixel region 13, that is, for each of the vertical signal lines 24, and converts an analog signal outputted from each of columns of the sensor pixels 12 in the pixel region 13 into a digital signal, and outputs the digital signal.

The reference voltage supply section 38 includes, for example, a DAC (digital-to-analog conversion circuit) 38A as a means of generating a reference voltage Vref of a so-called ramp (RAMP) waveform, of which a level is varied gradiently with time. It should be noted that, as the means of generating the reference voltage Vref of the ramp waveform is not limited to the DAC 38A.

The DAC 38A generates the reference voltage Vref of the ramp waveform on the basis of a clock CK supplied from the system control circuit 36 under control by a control signal CS1 supplied from the system control circuit 36, and supplies the reference voltage Vref to the ADCs 34-1 to 34-m of a column processor 15.

It should be noted that each of the ADCs 34-1 to 34-m is configured to selectively perform an AD conversion operation corresponding to each of operation modes. The operation modes include a normal frame rate mode in a progressive scanning system in which information of all the sensor pixels 12 is read, and a high frame rate mode in which an exposure time of the sensor pixels 12 is set to I/N to increase a frame rate by N times, for example, twice the frame rate in the normal frame rate mode. Such switching of the operation modes is executed by control by control signals CS2 and CS3 supplied from the system control circuit 36. In addition, instruction information for switching between the respective operation modes, that is, the normal frame rate mode and the high speed frame rate mode is provided from an external system controller (not illustrated) to the system control circuit 36.

The ADCs 34-1 to 34-m all have the same configuration, and the ADC 34-m is described here as an example. The ADC 34-m includes a comparator 34A, for example, an up-down counter (which is referred to as "U/DCNT" in the diagram) 34B serving as a counting means, a transfer switch 34C, and a memory device 34D.

The comparator 34A compares a signal voltage Vx of the vertical signal line 24 corresponding to a signal outputted from each of the sensor pixels 12 in an n-th column of the pixel region 13 with the reference voltage Vref of the ramp waveform supplied from the reference voltage supply section 38, and, turns an output Vco to an "H" level in a case where the reference voltage Vref is larger than the signal voltage Vx, for example, and turns the output Vco to an "L" level in a case where the reference voltage Vref is equal to or smaller than the signal voltage Vx, for example.

The up-down counter 34B includes an asynchronous counter, and measures a comparison period from the start to the end of the comparison operation in the comparator 34A by receiving the clock CK from the system control circuit 36 simultaneously with the DAC 38A and performing down (DOWN)-counting or up (UP)-counting in synchronization with the clock CK under control by the control signal CS2 supplied from the system control circuit 36.

Specifically, in the normal frame rate mode, in an operation of reading a signal from one sensor pixel 12, a comparison time in the first readout is measured by performing down-counting in a first readout operation, and a comparison time in second readout is measured by performing up-counting in a second readout operation.

In contrast, in the high frame rate mode, a counting result of the sensor pixels 12 in a certain row is kept as it is. Subsequently, for the sensor pixels 12 in a row subsequent to the certain row, the comparison time in the first readout is measured by performing down-counting in the first readout operation from the previous counting result, and the comparison time in the second readout is measured by performing up-counting in the second readout operation.

In the normal frame rate mode, under control by the control signal CS3 supplied from the system control circuit 36, the transfer switch 34C is turned to an ON (closed) state when the counting operation for the sensor pixels 12 in the certain row by the up-down counter 34B is completed, and transfers a counting result by the up-down counter 34B to the memory device 34D.

In contrast, at a high frame rate of N=2, the transfer switch 34C remains in an OFF (open) state when the counting operation for the sensor pixels 12 in the certain row by the up-down counter 34B is completed. Subsequently the transfer switch 34C is turned to the ON state when the counting operation for the sensor pixels 12 in the row subsequent to the certain row by the up-down counter 34B is completed, and transfers counting results of two vertical pixels by the up-down counter 34B to the memory device 34D.

As described above, analog signals supplied from the sensor pixels 12 in the pixel region 13 on a column-by-column basis via the vertical signal lines 24 are converted into N-bit digital signals by the respective operations by the comparator 34A and the up-down counter 34B in the ADCs 34-1 to 34-m, and the digital signals are stored in the memory device 34D.

The horizontal drive circuit 35 includes a shift register and the like, and performs control of column addresses and column scanning of the ADCs 34-1 to 34-m in the column signal processing circuit 34. Under control by the horizontal drive circuit 35, the N-bit digital signals obtained by A/D conversion in the respective ADCs 34-1 to 34-m are sequentially read to the horizontal output line 37, and are outputted as imaging data via the horizontal output line 37.

It should be noted that a circuit and the like that perform various kinds of signal processing on imaging data outputted via the horizontal output line 37 may be provided in addition to the components described above: however, the circuit and the like are not illustrated, because the circuit and the like are not directly related to the present disclosure.

In the imaging element 1 including the column parallel ADC that has the above-described configuration according to the present modification example, it is possible to selectively transfer the counting result of the up-down counter 34B to the memory device 34D via the transfer switch 34C, which makes it possible to independently control the counting operation by the up-down counter 34B and the readout operation of the counting result from the up-down counter 34B to the horizontal output line 37.

Modification Example R

FIG. 65 illustrates an example in which the imaging element 1 in FIG. 64 is configured by stacking three substrates (the first substrate 10, the second substrate 20, and the third substrate 30). In the present modification example, the first substrate 10 includes the pixel region 13 including the plurality of sensor pixels 12 that is formed in a central portion, and the vertical drive circuit 33 that is formed around the pixel region 13. In addition, in the second substrate 20, a readout circuit region 15 including the plurality of readout circuits 22 is formed in a central portion, and the vertical drive circuit 33 is formed around the readout circuit region 15. In the third substrate 30, the column signal processing circuit 34, the horizontal drive circuit 35, the system control circuit 36, the horizontal output line 37, and the reference voltage supply section 38 are formed. As with the embodiment and the modification examples thereof described above, this prevents an increase in chip size and impairment of reduction in area per pixel resulting from a configuration in which substrates are electrically coupled to each other. As a result, it is possible to provide the imaging element 1 having a three-layer configuration that has a substantially same chip size as before without impairing reduction in area per pixel. It should be noted that the vertical drive circuit 33 may be formed only in the first substrate 10, or may be formed only in the second substrate 20.

Modification Example S

FIG. 66 illustrates an modification example of the cross-sectional configuration of the imaging element 1 according to the embodiment and the modification examples thereof described above. In the embodiment and the modification examples thereof described above, the imaging element 1 is configured by stacking three substrates (the first substrate 10, the second substrate 20, and the third substrate 30). However, in the embodiment and the modification examples thereof described above, the imaging element 1 may be configured by stacking two substrates (the first substrate 10 and the second substrate 20). At this time, the logic circuit 32 is separated to be provided for the first substrate 10 and the second substrate 20, for example, as illustrated in FIG. 66. Here, a circuit 32A provided in the first substrate 10 of the logic circuit 32 includes a transistor having a gate configuration in which a high-dielectric constant (for example, high-k) film including a material resistant to a high-temperature process and a metal gate electrode are stacked. In contrast, in a circuit 32B provided in the second substrate 20, a low-resistance region 26 including a silicide such as $CoSi_2$ and NiSi is provided on a front surface of an impurity diffusion region in contact with a source electrode and a drain electrode. The silicide is prepared with use of a salicide (Self Aligned Silicide) process. The low-resistance region including the silicide includes a compound containing a material of the semiconductor substrate and a metal. This makes it possible to use a high-temperature process such as thermal oxidation for formation of the sensor pixels 12. Moreover, it is possible to reduce contact resistance in a case where the low-resistance region 26 including the silicide is provided on the front surface of the impurity diffusion region in contact with the source electrode and the drain electrode in the circuit 32B provided in the second electrode 20 of the logic circuit 32. As a result, it is possible to increase operation speed of the logic circuit 32.

FIG. 67 illustrates an modification example of the cross-sectional configuration of the imaging element 1 according to the embodiment and the modification examples thereof described above. In the logic circuit 32 of the third substrate 30 according to the embodiment and the modification examples thereof described above, a low-resistance region 37 including a silicide such as $CoSi_2$ and NiSi may be provided on the front surface of the impurity diffusion region in contact with the source electrode and the drain electrode. The silicide is prepared with use of a salicide (Self Aligned Silicide) process. This makes it possible to use a high-temperature process such as thermal oxidation for formation of the sensor pixels 12. Moreover, it is possible to reduce contact resistance in a case where the low-resistance region 37 including the silicide is provided on the front surface of the impurity diffusion region in contact with the source electrode and the drain electrode in the logic circuit 32. As a result, it is possible to increase operation speed of the logic circuit 32.

Modification Example T

In the embodiment and the modification examples thereof described above, electrical conductivity type may be reversed. For example, in the description of the embodiment and the modification examples thereof described above, the p-type may be replaced with the n-type, and the n-type may be replaced with the p-type. Even in such a case, effects similar to those in the embodiment and the modification examples thereof described above are achievable.

It should be noted that the present disclosure is applicable not only to a light receiving element for visible light but also to an element that is configured to detect various kinds of radiation such as infrared rays, ultraviolet rays, X-rays, and electromagnetic waves. The present disclosure is applicable to various applications such as distance measurement, change in light amount, and detection of physical property in addition to an output of an image.

3. Application Example

FIG. 68 illustrates an example of a schematic configuration of an imaging device 2 including the imaging element 1 according to the embodiment and the modification examples thereof described above (hereinafter, simply referred to as "imaging element 1").

The imaging device 2 includes, for example, an electronic apparatus including an imaging device such as a digital still camera or a video camera, or a mobile terminal device such as a smartphone or a tablet terminal. The imaging device 2 includes, for example, the imaging element 1, an optical system 141, a shutter device 142, a control circuit 143, a DSP circuit 144, a frame memory 145, a display section 146, a storage section 147, an operation section 148, and a power source section 149. In the imaging device 2, the imaging element 1, the shutter device 142, the control circuit 143, the DSP circuit 144, the frame memory 145, the display section 146, the storage section 147, the operation section 148, and the power source section 149 are coupled to one another via a bus line 150.

The imaging element 1 outputs image data corresponding to incoming light. The optical system 141 includes one or more lenses, and guides light (incoming light) from an object to the imaging element 1 to form an image on a light receiving surface of the imaging element 1. The shutter device 142 is provided between the optical system 141 and the imaging element 1, and controls a period in which the imaging element 1 is irradiated with light and a period in which the light is blocked in accordance with control by the control circuit 143. The imaging element 1 accumulates a signal electric charge for a predetermined period in accordance with the light of which an image is formed on the light receiving surface via the optical system 141 and the shutter device 142. The signal electric charge accumulated in the imaging element 1 is transferred as image data in accordance with a drive signal (timing signal) supplied from the control circuit 143. The control circuit 143 outputs the drive signal for controlling a transfer operation of the imaging element 1 and a shutter operation of the shutter device 142 to drive the imaging element 1 and the shutter device 142.

The DSP circuit 144 is a signal processing circuit that processes a signal (image data) outputted from the imaging element 1. The frame memory 145 temporarily holds the image data processed by the DSP circuit 144 in a frame unit. The display section 146 includes, for example, a panel display device such as a liquid crystal panel or an organic EL (Electro Luminescence) panel, and displays a moving image or a still image captured by the imaging element 1. The storage section 147 records the image data of the moving image or the still image captured by the imaging element 1 in a recording medium such as a semiconductor memory or a hard disk. The operation section 148 outputs an operation instruction about various kinds of functions of the imaging device 2 in accordance with an operation by a user. The power source section 149 supplies various kinds of power serving as operation power for the imaging element 1, the shutter device 142, the control circuit 143, the DSP circuit 144, the frame memory 145, the display section 146, the storage section 147, and the operation section 148, to these supply targets as necessary.

The imaging element of the present disclosure is also applicable to an imaging element of an imaging module including a lens, an IRCF (Infrared Cut Filter), and the like described as an existing example in Japanese Unexamined Patent Application Publication No. 2015-99262, or as the present disclosure. Even in the imaging device 2, an imaging module using this imaging element is also applicable.

Next, description is given of an imaging procedure in the imaging device 2.

FIG. 69 illustrates ab example of a flowchart of an imaging operation in the imaging device 2. A user operates the operation section 148 to provide an instruction for start of imaging (step S101). Thereafter, the operation section 148 transmits an instruction for imaging to the control circuit 143 (step S102). The control circuit 143 starts control of the shutter device 142 and the imaging element 1 upon reception of the instruction for imaging. The imaging element 1 (specifically, the system control circuit 32d) executes imaging in a predetermined imaging system by control by the control circuit 143 (step S103). The shutter device 142 controls the period in which the imaging element 1 is irradiated with light and the period in which the light is blocked by control by control circuit 143.

The imaging element 1 outputs image data captured by imaging to the DSP circuit 144. Here, the image data is data of pixel signals of all pixels generated on the basis of electric charges temporarily held in the floating diffusions FD. The DSP circuit 144 performs predetermined signal processing (for example, noise reduction processing, or the like) on the basis of the image data received from the imaging element 1 (step S104). The DSP circuit 144 causes the frame memory 145 to hold the image data having been subjected to the predetermined signal processing, and the frame memory 145 stores the image data in the storage section 147 (step S105). Thus, imaging is performed by the imaging device 2.

In the present application example, the imaging element 1 according to the embodiment and the modification examples thereof described above is applied to the imaging device 2. This makes it possible to downsize the imaging element 1 or increase definition of the imaging element 1, which makes it possible to provide the imaging device 2 having a small size or high definition.

4. Practical Application Examples

Practical Application Example 1

The technology (the present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 70 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 70, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 70, an audio speaker 12061, a display section 12062, and an instrument panel 12063 are illustrated as the output device. The display section 12062 may, for example, include at least one of an on-board display and a head-up display.

FIG. 71 is a diagram depicting an example of the installation position of the imaging section 12031.

In FIG. 71, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally. FIG. 71 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of an example of the mobile body control system to which the technology according to the present disclosure is applicable.

The technology according to the present disclosure is applicable to the imaging section 12031 in the configuration described above. Specifically, the imaging element 1 according to any of the embodiment and the modification examples thereof described above is applicable to the imaging section 12031. The application of the technology according to the present disclosure to the imaging section 12031 makes it possible to obtain a high-definition captured image with less noise and, consequently, achieve highly accurate control using the captured image by the mobile body control system.

Practical Application Example 2

FIG. 72 is a view depicting an example of a schematic configuration of an endoscopic surgery system to which the technology according to an embodiment of the present disclosure (present technology) can be applied.

In FIG. 72, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 73 is a block diagram depicting an example of a functional configuration of the camera head 11102 and the CCU 11201 depicted in FIG. 72.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R. G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of an example of the endoscopic surgery system to which the technology according to the present disclosure is applicable. The technology according to the present disclosure is suitably applicable to the image pickup unit 11402 provided in the camera head 11102 of the endoscope 11100 in the configuration described above. The application of the technology according to the present disclosure to the image pickup unit 11402 makes it possible to achieve downsizing or higher definition of the image pickup unit 11402 and, consequently, provide the small or high-definition endoscope 11100.

Although the present disclosure has been described above with reference to the embodiment, the modification examples thereof, the application examples thereof, and the practical application examples thereof, the present disclosure is not limited to the embodiment and the like described above, and may be modified in a variety of ways. It should be noted that the effects described herein are merely illustrative. Effects of the present disclosure are not limited to the effects described herein. Effects of the present disclosure may further include effects other than the effects described herein.

Moreover, the present disclosure may have the following configurations.

(1)

An imaging element including:

a first substrate including a sensor pixel in a first semiconductor substrate, the sensor pixel performing photoelectric conversion;

a second substrate including a readout circuit in a second semiconductor substrate, the readout circuit outputting a pixel signal on the basis of an electric charge outputted from the sensor pixel; and a third substrate including a logic circuit in a third semiconductor substrate, the logic circuit processing the pixel signal, the first substrate, the second substrate, and the third substrate being stacked in this order, a stacked body of the first substrate and the second substrate including an interlayer insulating film and a first through wiring line provided in the interlayer insulating film, the first substrate and the second substrate being electrically coupled to each other by the first through wiring line, and in a case where each of the second substrate and the third substrate includes a pad electrode, the second substrate and the third substrate being electrically coupled to each other by a junction between the pad electrodes, and in a case where the third substrate includes a second through wiring line penetrating through the third semiconductor substrate, the second substrate and the third substrate being electrically coupled to each other by the second through wiring line.

(2)

The imaging element according to (1), in which the sensor pixel includes a photoelectric converter, a transfer transistor, and a floating diffusion, the transfer transistor being electrically coupled to the photoelectric converter, and the floating diffusion temporarily holding an electric charge outputted from the photoelectric converter via the transfer transistor, and the readout circuit includes a reset transistor, an amplification transistor, and a selection transistor, the reset transistor resetting a potential of the floating diffusion to a predetermined potential, the amplification transistor generating, as the pixel signal, a signal of a voltage corresponding to a level of the electric charge held in the floating diffusion, and the selection transistor controlling an output timing of the pixel signal from the amplification transistor.

(3)

The imaging element according to (1) or (2), in which the first substrate has a configuration in which the photoelectric converter, the transfer transistor, and the floating diffusion are provided in a portion on a front surface side of the first semiconductor substrate, the second substrate has a configuration in which the readout circuit is provided in a portion on a front surface side of the second semiconductor substrate, and is bonded to the first substrate in such a fashion that a back surface of the second semiconductor substrate is opposed to the front surface side of the first semiconductor substrate, and the third substrate has a configuration in which the logic circuit is provided in a portion on a front surface side of the third semiconductor substrate, and is bonded to the second substrate in such a fashion that a front surface of the third semiconductor substrate is opposed to the front surface side of the second semiconductor substrate.

(4)

The imaging element according to any one of (1) to (3), in which each of the second substrate and the third substrate includes a pad electrode, and a cross-sectional area of the first through wiring line is smaller than a cross-sectional area of a coupling portion between the pad electrodes.

(5)

The imaging element according to any one of (1) to (3), in which the third substrate includes the first through wiring line, and a cross-sectional area of the first through wiring line is smaller than a cross-sectional area of the second through wiring line.

(6)

The imaging element according to any one of (1) to (5), in which the logic circuit includes a silicide in a front surface of an impurity diffusion region in contact with a source electrode or a drain electrode.

(7)

The imaging element according to any one of (2) to (6), in which the first substrate includes the photoelectric converter, the transfer transistor, and the floating diffusion for each of the sensor pixels, and further includes an element separator that separates the respective sensor pixels, and the second substrate includes the readout circuit for each of the sensor pixels.

(8)

The imaging element according to any one of (2) to (6), in which
the first substrate includes the photoelectric converter, the transfer transistor, and the floating diffusion for each of the sensor pixels, and further includes an element separator that separates the respective sensor pixels, and
the second substrate includes the readout circuit for every plurality of the sensor pixels.

(9)

The imaging element according to any one of (2) to (6), in which
the first substrate includes the photoelectric converter and the transfer transistor for each of the sensor pixels, and the floating diffusion shared by every plurality of the sensor pixels, and further includes an element separator that separates the photoelectric converters and the transfer transistors for each of the sensor pixels, and
the second substrate includes the readout circuit for every plurality of the sensor pixels sharing the floating diffusion.

(10)

The imaging element according to any one of (7) to (9), in which the element separator penetrates through the first semiconductor substrate.

(11)

The imaging element according to (8) or (9), in which
the stacked body includes at least two of the first through wiring lines for each of the sensor pixels,
a first one of the first through wiring lines is electrically coupled to a gate of the transfer transistor, and
a second one of the first through wiring lines is electrically coupled to the floating diffusion.

(12)

The imaging element according to (11), in which the second substrate further includes a coupling wiring line electrically coupling the respective first through wiring lines to each other, the first through wiring lines being electrically coupled to each of the floating diffusions sharing the readout circuit.

(13)

The imaging element according to (12), in which
the number of the first through wiring lines is greater than the number of the sensor pixels included in the first substrate, and
the number of junctions between the pad electrodes or the number of the second through wiring lines is smaller than the number of the sensor pixels included in the first substrate.

(14)

The imaging element according to any one of (11) to (13), in which a gate of the transfer transistor is electrically coupled to the logic circuit via the first through wiring line and the pad electrodes or the second through wiring line.

(15)

The imaging element according to (8) or (9), in which
the first substrate further includes, in the interlayer insulating film, a gate wiring line extending in a direction parallel to the first substrate, and
a gate of the transfer transistor is electrically coupled to the logic circuit via the gate wiring line.

(16)

The imaging element according to any one of (1) to (15), in which
the interlayer insulating film includes
a first insulating layer provided in a gap between the first semiconductor substrate and the second semiconductor substrate,
a second insulating layer provided to cover a side surface of the first through wiring line, and
a third insulating layer provided in a gap between the second semiconductor substrate and the third semiconductor substrate, and
the second insulating layer includes a material having a lower relative dielectric constant than relative dielectric constants of the first insulating layer and the third insulating layer.

(17)

The imaging element according to (16), in which
the first insulating layer includes a stacked body of at least two insulating layers, and
the insulating layer that is an uppermost layer of the stacked body includes a material having a higher relative dielectric constant than a dielectric constant at any other position of the interlayer insulating film.

(18)

The imaging element according to any one of (11) to (13), in which
the second substrate includes the readout circuit for every four of the sensor pixels, and
a plurality of the first through wiring lines is disposed side by side in a band-like fashion in a first direction in a plane of the first substrate.

(19)

The imaging element according to (18), in which the readout circuit is not disposed directly opposed to the four sensor pixels sharing the readout circuit, and is disposed to be shifted in a second direction orthogonal to the first direction.

(20)

The imaging element according to (18) or (19), in which
the sensor pixels are arranged in a matrix in the first direction and a second direction orthogonal to the first direction, and
the second substrate further includes
a first control line electrically coupled to a gate of the transfer transistor of each of the sensor pixels disposed side by side in the second direction,
a second control line electrically coupled to a gate of each of the reset transistors disposed side by side in the second direction,
a third control line electrically coupled to a gate of each of the selection transistors disposed side by side in the second direction, and
an output line electrically coupled to an output terminal of each of the readout circuits disposed side by side in the first direction.

According to the imaging element according to an embodiment of the present disclosure, substrates are electrically coupled to each other in accordance with the degrees of integration of the substrates, which prevents an increase in the chip size and impairment of reduction in area per pixel. As a result, it is possible to provide an imaging element having a three-layer configuration that has a substantially same chip size as before without impairing reduction in area per pixel. It should be noted that the effects of the present disclosure are not necessarily limited to the effects described herein, and may be any of the effects described in this specification.

This application claims the benefit of U.S. Patent Application No. 62/610,806 filed on Dec. 27, 2017 and PCT Patent Application No. PCT/JP2018/036417 filed on Sep. 28, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging element, comprising:
a first section including a first semiconductor substrate, the first semiconductor substrate including a photoelectric converter and a floating diffusion;
a second section including an insulating layer and a second semiconductor substrate, the second semiconductor substrate including a readout circuit for reading out a pixel signal from the floating diffusion, wherein the readout circuit comprises:
a first transistor at least partially disposed in the second semiconductor substrate; and
a second transistor at least partially disposed in the second semiconductor substrate; and
a third section including a third semiconductor substrate, the third semiconductor substrate including a logic circuit for processing the pixel signal, wherein the second section is sandwiched between the first section and the third section; and
a through electrode that penetrates through the insulating layer and electrically connects the floating diffusion to the readout circuit, wherein the through electrode is between the first transistor and the second transistor, and wherein the second semiconductor substrate comprises a first semiconductor region and a second semiconductor region electrically isolated from the first semiconductor region by the insulating layer.

2. The imaging element of claim 1, wherein the second transistor is electrically isolated from the first transistor by the insulating layer.

3. The imaging element of claim 1, wherein the first transistor is at least partially disposed in the first semiconductor region, and wherein the second transistor is at least partially disposed in the second semiconductor region.

4. The imaging element of claim 3, wherein the first transistor is an amplification transistor, and wherein the second transistor is a reset transistor.

5. The imaging element of claim 3, wherein the readout circuit comprises a third transistor at least partially disposed in the second semiconductor region.

6. The imaging element of claim 5, wherein the first transistor is an amplification transistor, and wherein the second transistor is a reset transistor, and wherein the third transistor is a selection transistor.

7. The imaging element of claim 1, wherein the photoelectric converter is one of a plurality of photoelectric converters and the floating diffusion is one of a plurality of floating diffusions, and wherein the plurality of photoelectric converters and the plurality of floating diffusions share the readout circuit.

8. The imaging element of claim 1, wherein the first semiconductor substrate comprises a transfer transistor that transfers electric charge from the photoelectric converter to the floating diffusion.

9. The imaging element of claim 1, wherein the logic circuit comprises a drive circuit.

10. An electronic apparatus, comprising:
a signal processing circuit; and
an imaging element, comprising:
a first section including a first semiconductor substrate, the first semiconductor substrate including a photoelectric converter and a floating diffusion;
a second section including an insulating layer and a second semiconductor substrate, the second semiconductor substrate including a readout circuit for reading out a pixel signal from the floating diffusion, wherein the readout circuit comprises:
a first transistor at least partially disposed in the second semiconductor substrate; and
a second transistor at least partially disposed in the second semiconductor substrate; and
a third section including a third semiconductor substrate, the third semiconductor substrate including a logic circuit for processing the pixel signal, wherein the second section is sandwiched between the first section and the third section; and
a through electrode that penetrates through the insulating layer and electrically connects the floating diffusion to the readout circuit, wherein the through electrode is between the first transistor and the second transistor, and wherein the second semiconductor substrate comprises a first semiconductor region and a second semiconductor region electrically isolated from the first semiconductor region by the insulating layer.

11. The electronic apparatus of claim 10, wherein the second transistor is electrically isolated from the first transistor by the insulating layer.

12. The electronic apparatus of claim 10, wherein the first transistor is at least partially disposed in the first semiconductor region, and wherein the second transistor is at least partially disposed in the second semiconductor region.

13. The electronic apparatus of claim 12, wherein the first transistor is an amplification transistor, and wherein the second transistor is a reset transistor.

14. The electronic apparatus of claim 12, wherein the readout circuit comprises a third transistor at least partially disposed in the second semiconductor region.

15. The electronic apparatus of claim 14, wherein the first transistor is an amplification transistor, and wherein the second transistor is a reset transistor, and wherein the third transistor is a selection transistor.

16. The electronic apparatus of claim 10, wherein the photoelectric converter is one of a plurality of photoelectric converters and the floating diffusion is one of a plurality of floating diffusions, and wherein the plurality of photoelectric converters and the plurality of floating diffusions share the readout circuit.

17. The electronic apparatus of claim 10, wherein the first semiconductor substrate comprises a transfer transistor that transfers electric charge from the photoelectric converter to the floating diffusion.

18. The electronic apparatus of claim 10, wherein the logic circuit comprises a drive circuit.

* * * * *